(12) United States Patent
Yamazaki et al.

(10) Patent No.: US 8,994,024 B2
(45) Date of Patent: Mar. 31, 2015

(54) SEMICONDUCTOR DEVICE AND METHOD FOR MANUFACTURING THE SAME

(75) Inventors: Shunpei Yamazaki, Setagaya (JP); Junichiro Sakata, Atsugi (JP); Hiroyuki Miyake, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 326 days.

(21) Appl. No.: 12/835,905

(22) Filed: Jul. 14, 2010

(65) Prior Publication Data

US 2011/0012116 A1    Jan. 20, 2011

(30) Foreign Application Priority Data

Jul. 18, 2009    (JP) ................... 2009-169600

(51) Int. Cl.
*H01L 29/04* (2006.01)
*H01L 27/12* (2006.01)
*H01L 29/45* (2006.01)

(52) U.S. Cl.
CPC .......... *H01L 27/124* (2013.01); *H01L 27/1225* (2013.01); *H01L 29/45* (2013.01)
USPC .......... 257/59; 257/71; 257/43; 257/E29.296; 257/E27.111; 438/158; 438/104

(58) Field of Classification Search
USPC ................ 257/59, 71, 43, E21.704, E29.296, 257/E27.111; 438/158, 104
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

(Continued)

*Primary Examiner* — Elias M Ullah
(74) *Attorney, Agent, or Firm* — Eric J. Robinson; Robinson Intellectual Property Law Office, P.C.

(57) ABSTRACT

A highly reliable display device which has high aperture ratio and includes a transistor with stable electrical characteristics is manufactured. The display device includes a driver circuit portion and a display portion over the same substrate. The driver circuit portion includes a driver circuit transistor and a driver circuit wiring. A source electrode and a drain electrode of the driver circuit transistor are formed using a metal. A channel layer of the driver circuit transistor is formed using an oxide semiconductor. The driver circuit wiring is formed using a metal. The display portion includes a pixel transistor and a display portion wiring. A source electrode and a drain electrode of the pixel transistor are formed using a transparent oxide conductor. A semiconductor layer of the pixel transistor is formed using the oxide semiconductor. The display portion wiring is formed using a transparent oxide conductor.

36 Claims, 37 Drawing Sheets

(56) References Cited

U.S. PATENT DOCUMENTS

| | | |
|---|---|---|
| 6,252,248 B1 | 6/2001 | Sano et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,734,505 B2 | 5/2004 | Suzuki et al. |
| 7,002,181 B2 | 2/2006 | Suzuki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,251 B2 | 6/2010 | Hoffman et al. |
| 7,732,819 B2 | 6/2010 | Akimoto et al. |
| 7,745,798 B2 | 6/2010 | Takahashi |
| 7,855,379 B2 | 12/2010 | Hayashi et al. |
| 7,978,274 B2 | 7/2011 | Umezaki et al. |
| 8,203,144 B2 | 6/2012 | Hoffman et al. |
| 8,436,349 B2 | 5/2013 | Sano et al. |
| 8,520,159 B2 | 8/2013 | Umezaki et al. |
| 8,647,031 B2 | 2/2014 | Hoffman et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001228 A1* | 1/2007 | Kokubo et al. ............... 257/347 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1* | 3/2007 | Akimoto et al. ............. 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200857 A1 | 8/2010 | Shimada |
| 2011/0012105 A1 | 1/2011 | Yamazaki et al. |
| 2011/0012106 A1 | 1/2011 | Yamazaki et al. |
| 2011/0012112 A1 | 1/2011 | Yamazaki et al. |
| 2011/0012116 A1 | 1/2011 | Yamazaki et al. |
| 2011/0012117 A1 | 1/2011 | Yamazaki et al. |
| 2011/0012118 A1 | 1/2011 | Yamazaki et al. |
| 2011/0017995 A1 | 1/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-116067 | 5/1996 |
| JP | 08-264794 | 10/1996 |
| JP | 08-264794 A | 10/1996 |
| JP | 11-505377 | 5/1999 |
| JP | 11-354802 A | 12/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-069022 A | 3/2003 |
| JP | 2003-086000 | 3/2003 |
| JP | 2003-086000 A | 3/2003 |
| JP | 2003-086808 | 3/2003 |
| JP | 2004-014982 | 1/2004 |
| JP | 2004-103957 | 4/2004 |
| JP | 2004-273614 A | 9/2004 |
| JP | 2004-273732 A | 9/2004 |
| JP | 2005-033172 | 2/2005 |

(56) References Cited

FOREIGN PATENT DOCUMENTS

| JP | 2007-081362 | 3/2007 |
|---|---|---|
| JP | 2007-096055 | 4/2007 |
| JP | 2007-123861 | 5/2007 |
| JP | 2007-163467 | 6/2007 |
| JP | 2007-171932 | 7/2007 |
| JP | 2007-529119 | 10/2007 |
| JP | 2007-298601 A | 11/2007 |
| JP | 2009-141001 | 6/2009 |
| JP | 2009-158663 | 7/2009 |
| JP | 2009-265271 | 11/2009 |
| JP | 2010-098280 | 4/2010 |
| WO | WO 2004/114391 | 12/2004 |
| WO | WO-2005/093850 | 10/2005 |
| WO | WO 2009/072533 | 6/2009 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical Properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Transparent Circuit,, Nikkei Electronics, Aug. 27, 2007, No. 959, pp. 39-52.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.2L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, M., "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Radio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and example,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performace oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters), Sep. 1, 2003, vol. 83, No. 9, pp. 1755-1757.

Nozawa, T., "Transparent Circuit,", Nikkei Electronics, Aug. 27, 2007, No. 959, pp. 39-52.

International Search Report (Application No. PCT/JP2010/061304) dated Oct. 12, 2010.

Written Opinion (Application No. PCT/JP2010/061304) dated Oct. 12, 2010.

Kimizuka et al., "Spinel, YbFe$_2$O$_4$, and Yb$_2$Fe$_3$O$_7$ Types of Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

Kimizuka et al., "Syntheses and Single-Crystal Data of Homologous Compounds, In$_2$O$_3$(ZnO)$m$ ($m$=3, 4, and 5), InGaO$_3$(ZnO)$_3$, and Ga$_2$O$_3$(ZnO)$m$ ($m$=7, 8, 9, and 16) in the In$_2$O$_3$-ZnGa$_2$O$_4$-ZnO System," Journal of Solid State Chemistry, Apr. 1, 1995, vol. 116, No. 1, pp. 170-178.

Nakamura et al., "The Phase Relations in the In$_2$O$_3$-Ga$_2$ZnO$_4$-ZnO System at 1350° C.," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13$^{th}$ International Display Workshops, Dec. 7, 2006, pp. 663-666.

(56) References Cited

OTHER PUBLICATIONS

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium—Gallium—Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties, SID Digest '09: SID International Symposium Digest of Technical Papers, May 31, 2009, pp. 983-985.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase","Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn—Oxide TFTS," IDW '09: Proceedings of the $16^{th}$ International Display Workshops, 2009, pp. 689-692.

\* cited by examiner

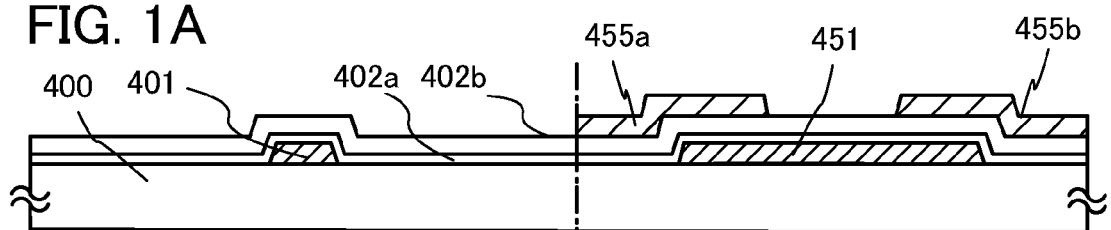
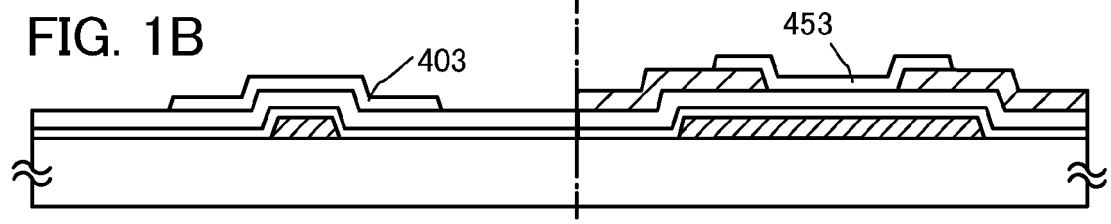
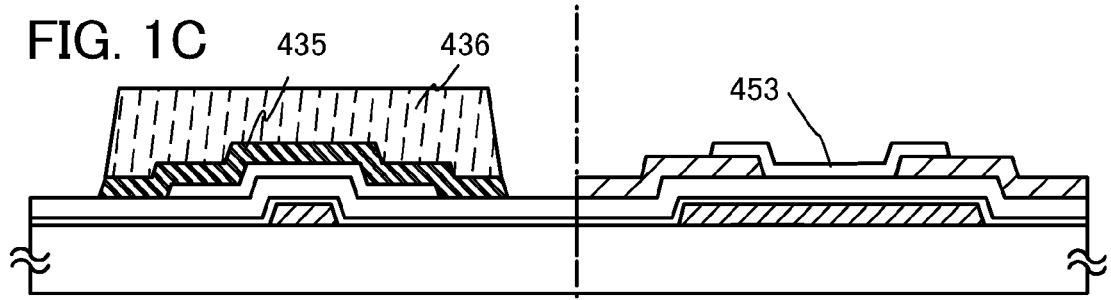
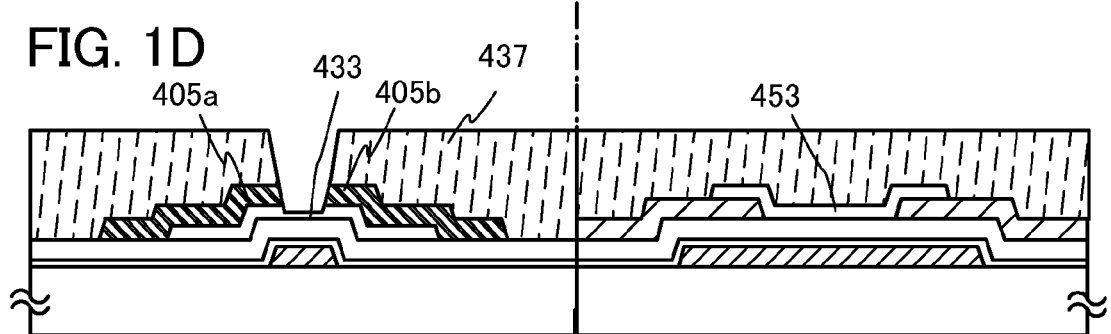
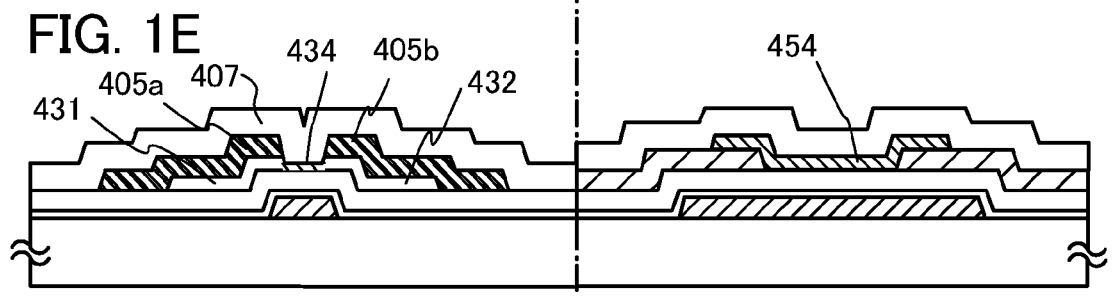
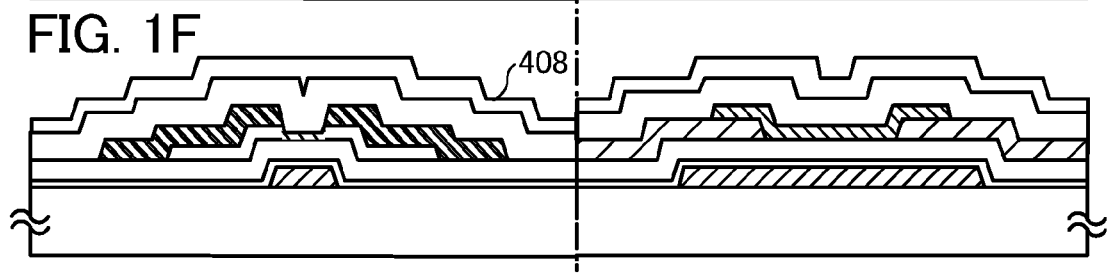

FIG. 2A
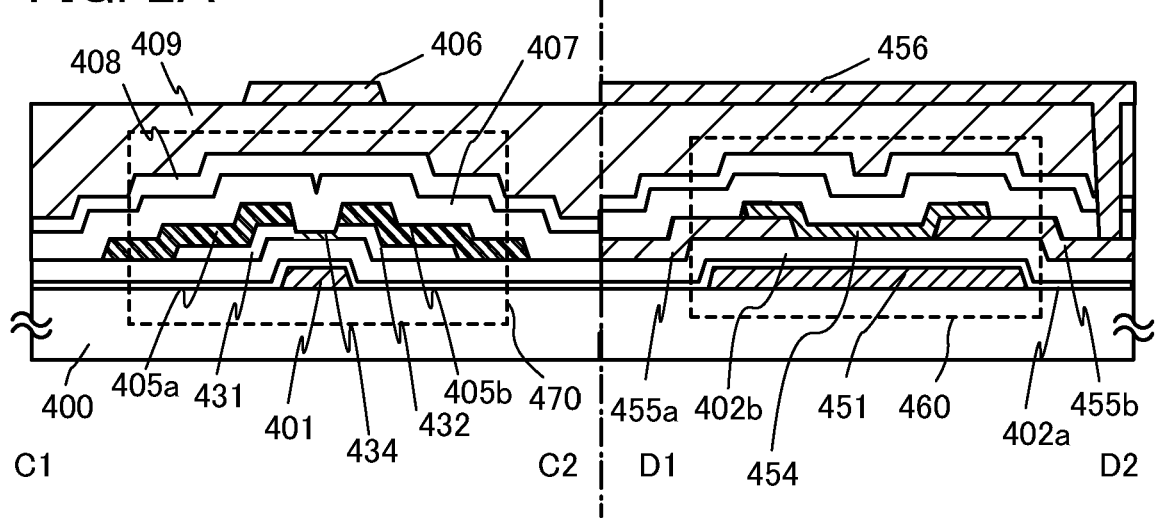
FIG. 2B1
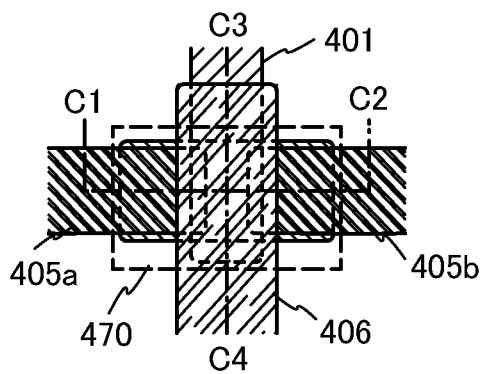
FIG. 2B2
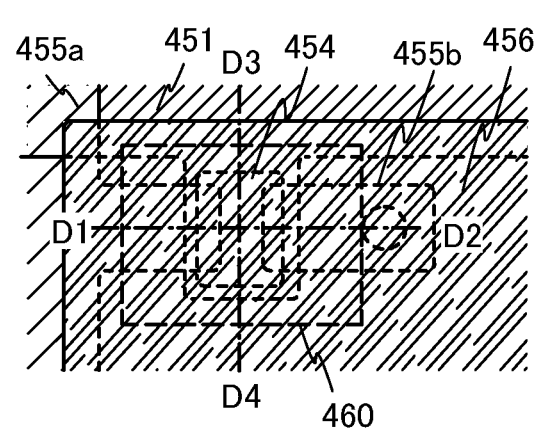
FIG. 2C
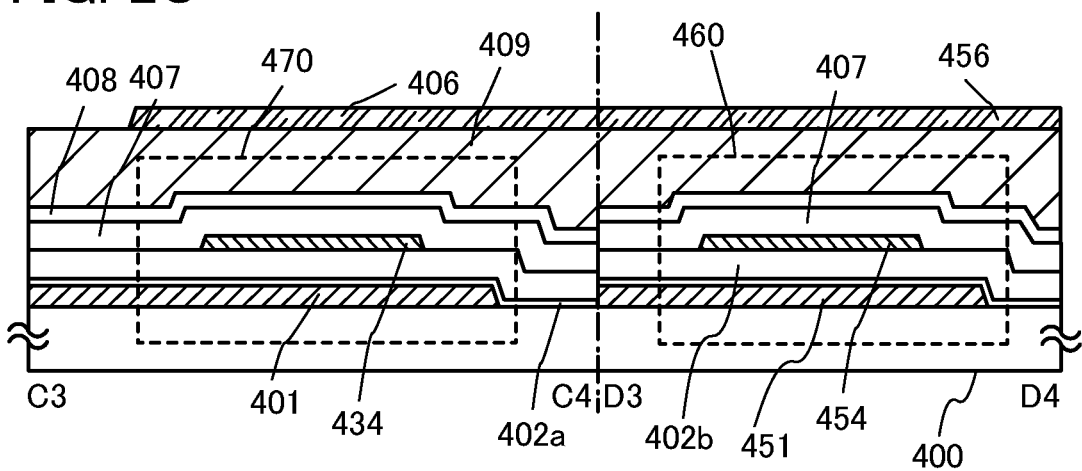

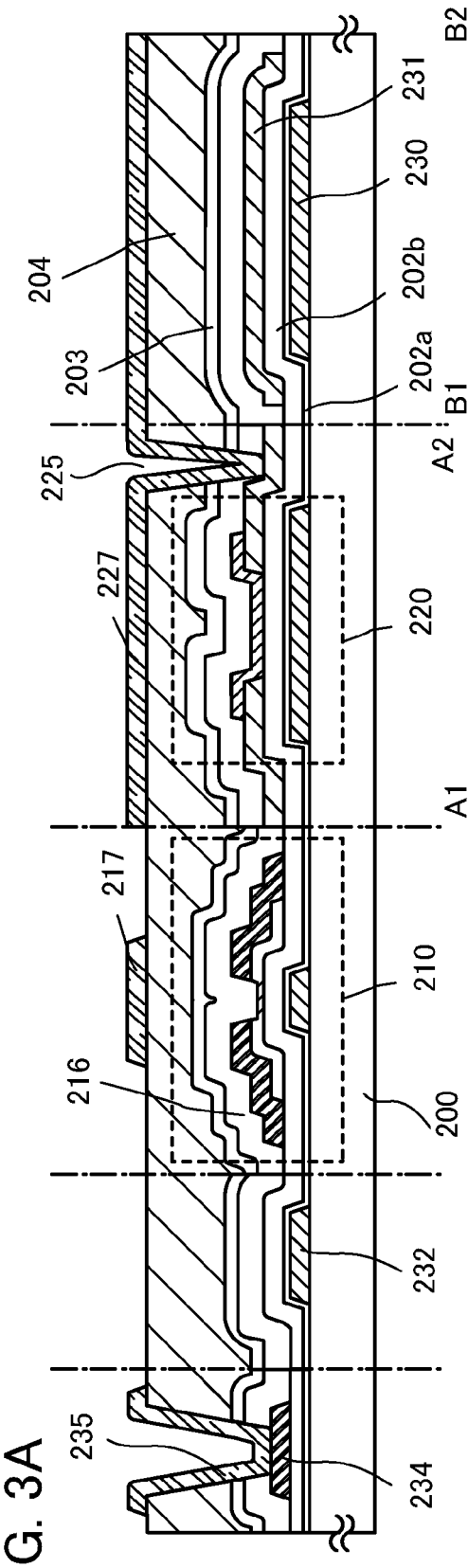

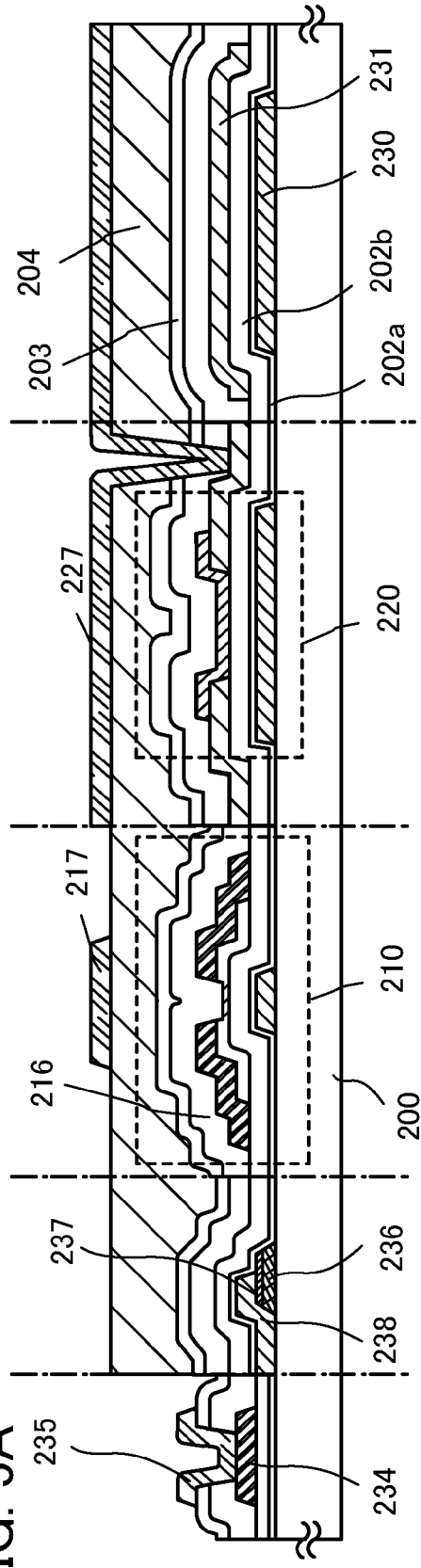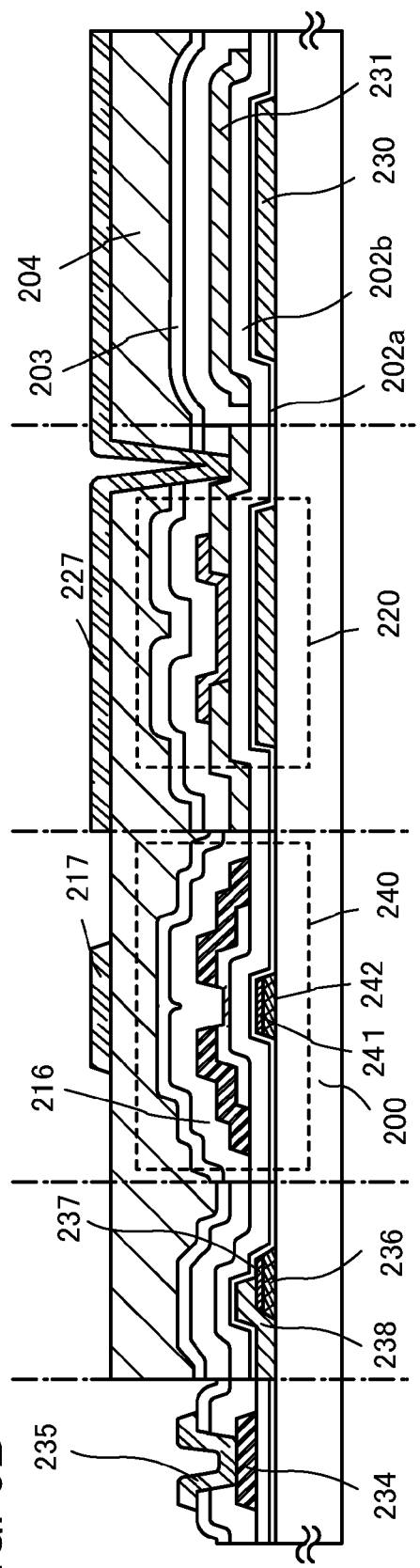

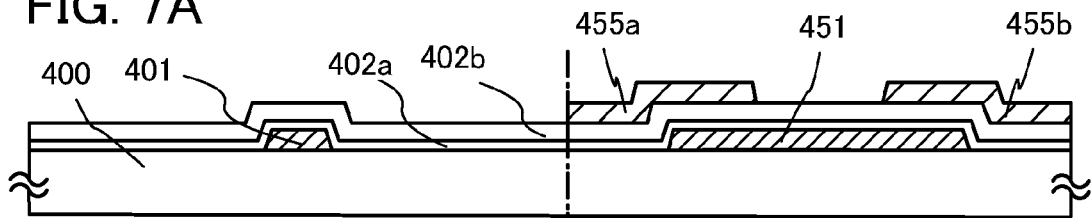
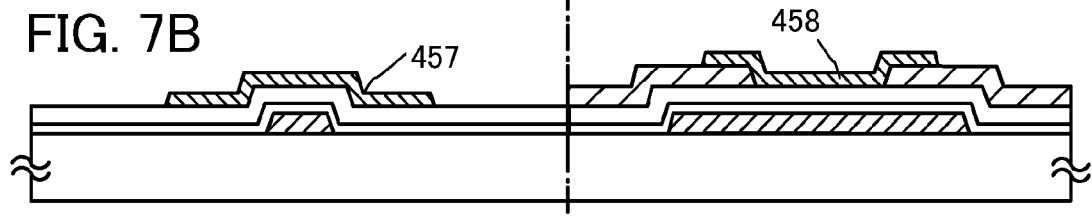
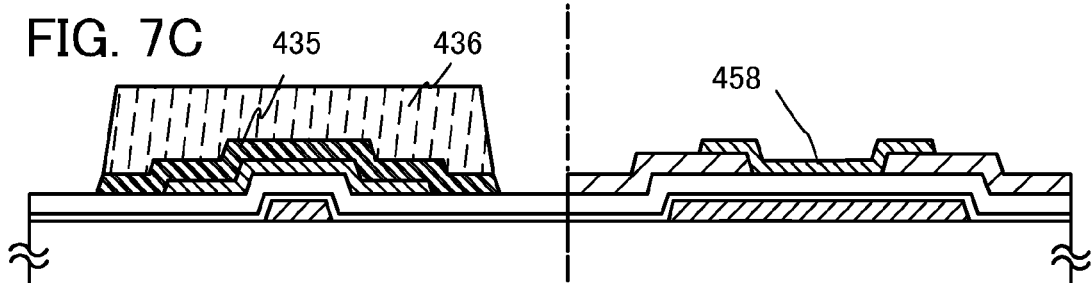
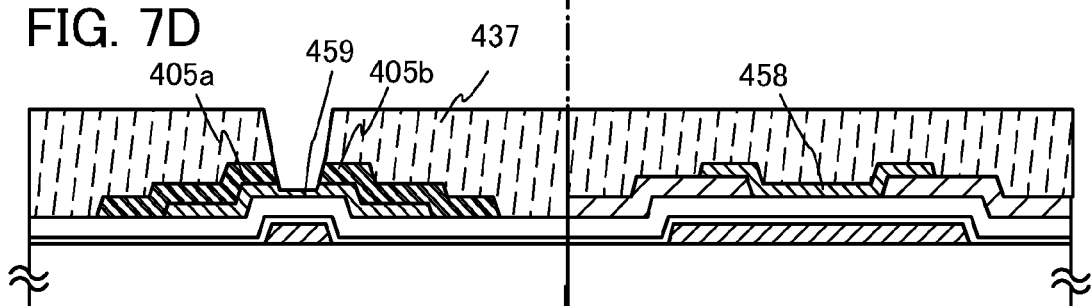
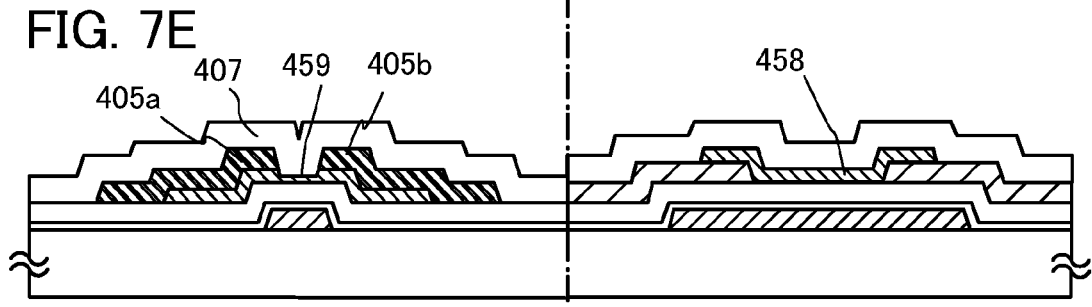
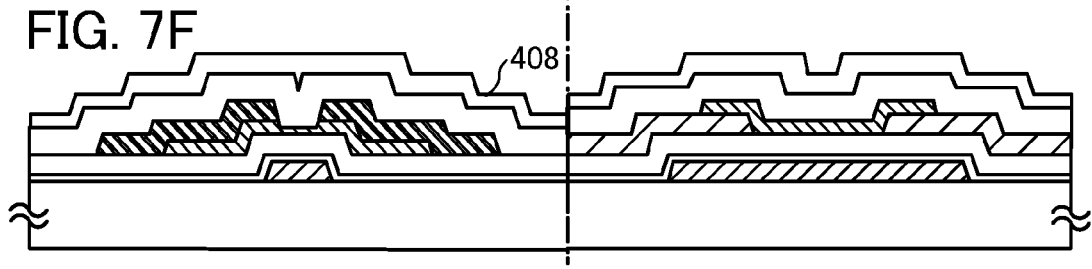

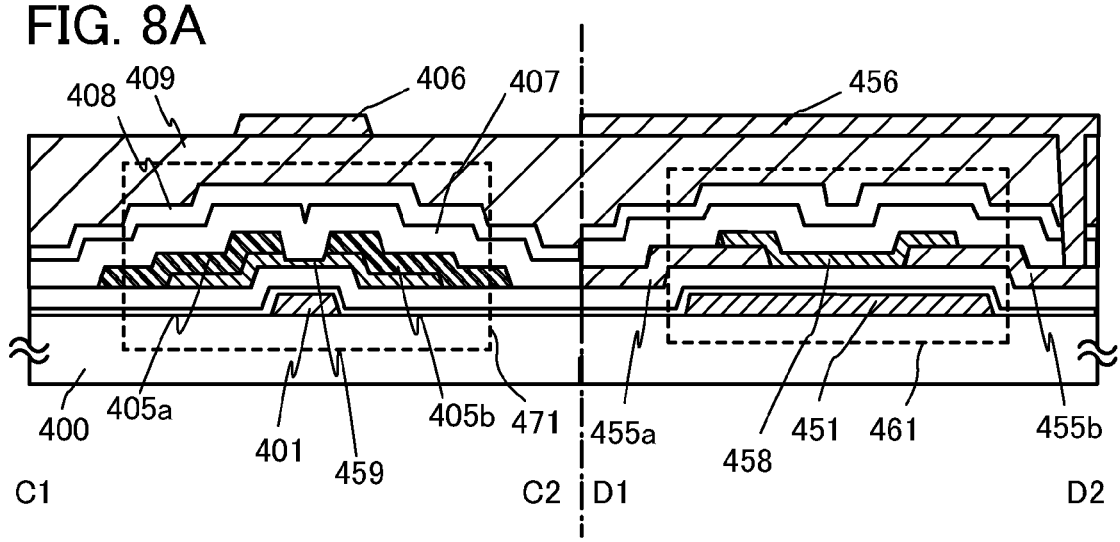
FIG. 8A
FIG. 8B1
FIG. 8B2
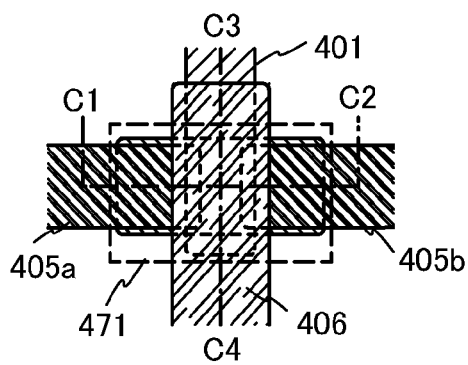
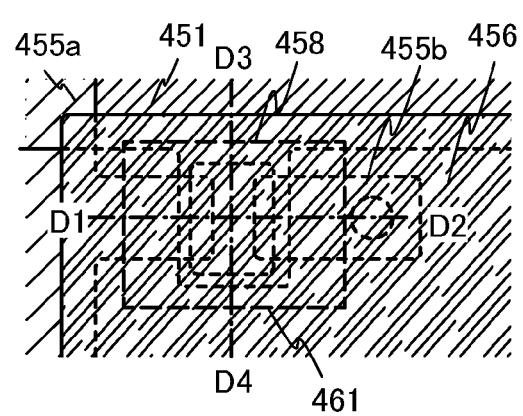
FIG. 8C
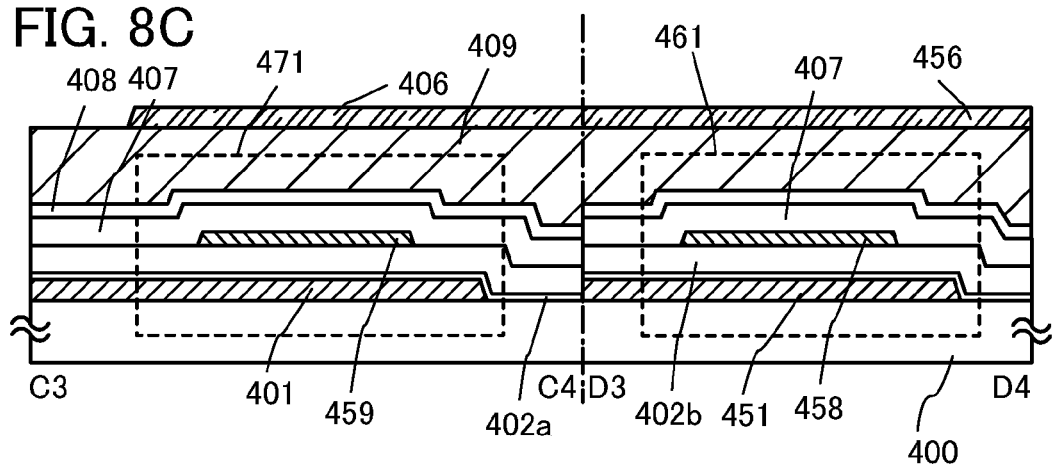

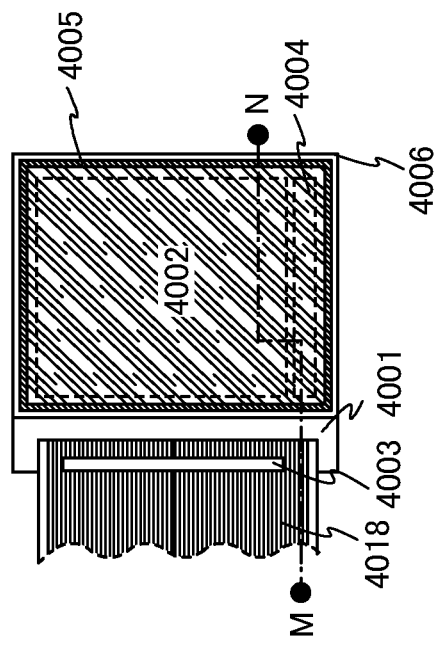
FIG. 10A1
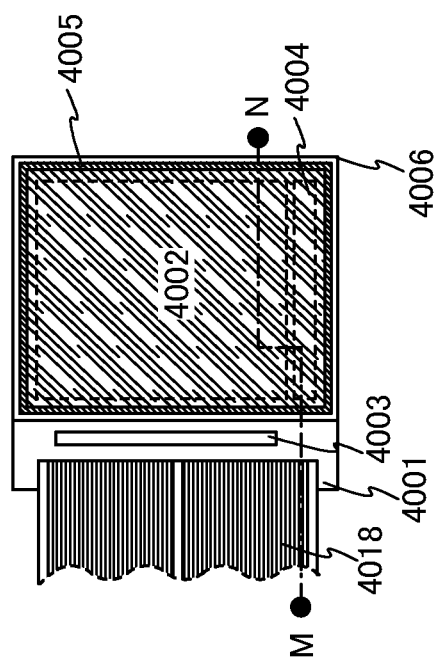
FIG. 10A2
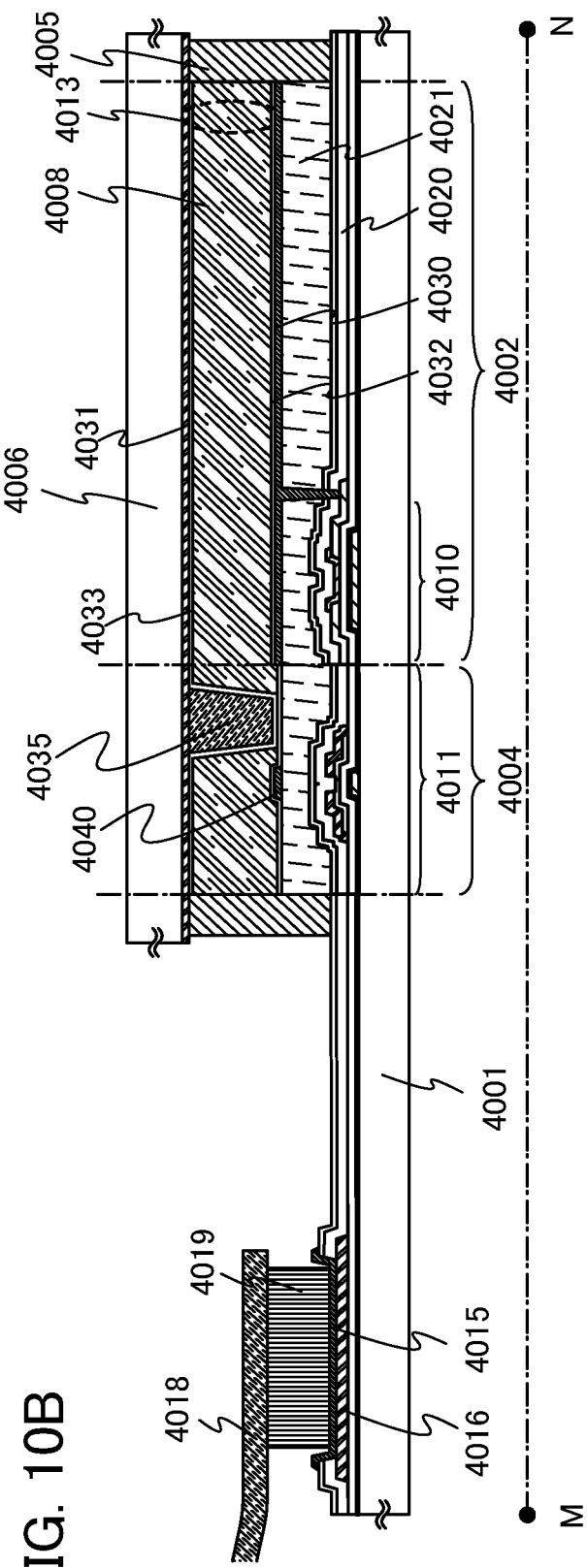
FIG. 10B

SEMICONDUCTOR DEVICE AND METHOD FOR MANUFACTURING THE SAME

TECHNICAL FIELD

The present invention relates to semiconductor devices including oxide semiconductors and manufacturing methods thereof Note that in this specification, a semiconductor device refers to all devices that can function by utilizing semiconductor properties, and electro-optic devices such as display devices, semiconductor circuits, and electronic devices are all semiconductor devices.

BACKGROUND ART

Light-transmitting metal oxides are used in semiconductor devices. For example, conductive metal oxides (hereinafter referred to as oxide conductors) such as indium tin oxide (ITO) are used as transparent electrode materials needed in display devices such as liquid crystal displays.

In addition, light-transmitting metal oxides attract attention as materials having semiconductor properties. For example, In—Ga—Zn—O-based oxides and the like are expected to be used as semiconductor materials needed in display devices such as liquid crystal displays. In particular, they are expected to be used for channel layers of thin film transistors (hereinafter also referred to as TFTs).

TFTs which include metal oxides having semiconductor properties (hereinafter referred to as oxide semiconductors) can be formed by low-temperature processes. Therefore, expectations for oxide semiconductors as materials which replace or surpass amorphous silicon used in display devices and the like are raised.

The use of oxide conductors and oxide semiconductors having light-transmitting properties enables the production of light-transmitting TFTs (for example, see Reference 1).

Furthermore, TFTs including oxide semiconductors as a channel layer have high field-effect mobility. Therefore, driver circuits in display devices or the like can be formed using the TFTs (for example, see Reference 2).

REFERENCE

Reference 1: T. Nozawa, "Transparent Circuitry", *Nikkei Electronics, No.* 959, Aug. 27, 2007, pp. 39-52.

Reference 2: T. Osada et al., "Development of Driver-Integrated Panel using Amorphous In—Ga—Zn—Oxide TFT", *Proc. SID '09 Digest,* 2009, pp. 184-187.

DISCLOSURE OF INVENTION

It is an object of one embodiment of the present invention to reduce the manufacturing cost of a semiconductor device.

It is an object of one embodiment of the present invention to improve the aperture ratio of a semiconductor device.

It is an object of one embodiment of the present invention to make a display portion of a semiconductor device display a higher-resolution image.

It is an object of one embodiment of the present invention to provide a semiconductor device which can operate at high speed.

One embodiment of the present invention is a semiconductor device including a driver circuit portion and a display portion (also referred to as a pixel portion) over the same substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using a metal. A channel layer of the driver circuit thin film transistor is formed using an oxide semiconductor. The driver circuit wiring is formed using a metal. The display portion includes a pixel thin film transistor and a display portion wiring. A source electrode layer and a drain electrode layer of the pixel thin film transistor are formed using an oxide conductor. A semiconductor layer of the pixel thin film transistor is formed using an oxide semiconductor. The display portion wiring is formed using an oxide conductor.

An inverted-staggered thin film transistor having a bottom-gate structure is used as each of the pixel thin film transistor and the driver circuit thin film transistor. The pixel thin film transistor is a bottom-gate thin film transistor having an oxide semiconductor layer which overlaps with a source electrode layer and a drain electrode layer (such a thin film transistor is also referred to as an inverted-coplanar thin film transistor or a bottom-contact thin film transistor). In contrast, the driver circuit thin film transistor is a bottom-gate (channel-etched) thin film transistor which has a source electrode layer and a drain electrode layer overlapping with an oxide semiconductor layer and which is provided with an oxide insulating layer contacting with a region of the oxide semiconductor layer between the source electrode layer and the drain electrode.

Note that a specific manufacturing process of a TFT, a specific structure of a different element (e.g., a capacitor) included in a semiconductor device, and the like are not disclosed in Reference 1. In addition, it is not disclosed that a driver circuit and a light-transmitting TFT are formed over the same substrate.

In a semiconductor device of one embodiment of the present invention, a driver circuit portion including a driver circuit TFT and a display portion including a pixel TFT are formed over the same substrate. Thus, the manufacturing cost of the semiconductor device can be reduced.

In a semiconductor device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the semiconductor device, a region where the pixel TFT and the display portion wiring are formed can be used as a display region in a pixel portion. Thus, the aperture ratio of the semiconductor device can be improved.

In a semiconductor device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the semiconductor device, it is possible to determine the pixel size without limitation by the size of the pixel TFT. Thus, it is possible to make the display portion of the semiconductor device display a higher-resolution image.

In a semiconductor device of one embodiment of the present invention, a driver circuit portion includes a driver circuit TFT and a driver circuit wiring. A source electrode and a drain electrode of the driver circuit TFT are formed using a metal. A channel layer of the driver circuit TFT is formed using an oxide semiconductor. The driver circuit wiring is formed using a metal. That is, in the semiconductor device, a driver circuit includes a TFT having high field-effect mobility and a wiring having low resistance. Thus, the semiconductor device can operate at high speed.

As an oxide semiconductor used in this specification, a thin film of a material expressed by $InMO_3(ZnO)_m$ (m>0) is formed, and a thin film transistor including the thin film as an oxide semiconductor layer is formed. Note that M denotes one or more metal elements selected from Ga, Fe, Ni, Mn, or Co. As an example, M might be Ga or might be Ga and the above metal element other than Ga, for example, M might be Ga and Ni or Ga and Fe. Further, in the oxide semiconductor, in some cases, a transitional metal element such as Fe or Ni or an oxide of the transitional metal is contained as an impurity element in addition to the metal element contained as M. In this specification, among oxide semiconductor layers whose composition formulae are expressed by $InMO_3(ZnO)m$ (m>0), an oxide semiconductor which includes Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above metal oxide: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using the above metal oxide.

In the process for manufacturing the above-mentioned semiconductor device, it is preferable first to change the oxide semiconductor layer into an oxygen-deficient oxide semiconductor layer by the heat treatment of the oxide semiconductor layer in the atmosphere of an inert gas such as nitrogen or a rare gas (e.g., argon or helium) or under reduced pressure so as to be a low-resistant oxide semiconductor layer (i.e., an n-type (e.g., n-type) oxide semiconductor layer) and then to make the oxide semiconductor layer be in an oxygen excess state by the formation of an oxide insulating film which is in contact with the oxide semiconductor layer. Accordingly, the oxide semiconductor layer is changed into a high-resistant oxide semiconductor layer (i.e., an i-type (intrinsic) oxide semiconductor layer). Thus, it is possible to manufacture a semiconductor device including a highly reliable thin film transistor with favorable electrical characteristics.

The above-mentioned heat treatment is performed at a temperature which is higher than or equal to 350° C., preferably higher than or equal to 400° C., and lower than the strain point of a substrate in the atmosphere of an inert gas such as nitrogen or a rare gas (e.g., argon or helium) or under reduced pressure. In this heat treatment, the oxide semiconductor layer undergoes dehydration or dehydrogenation, which results in the reduction of an impurity including a hydrogen atom, such as water, which is contained in the oxide semiconductor layer.

The heat treatment for the above-mentioned dehydration or dehydrogenation is performed under a heat treatment condition that two peaks of water or at least one peak of water at around 300° C. is not detected even if TDS is performed at up to 450° C. on the dehydrated or dehydrogenated oxide semiconductor layer. Even if TDS is performed at up to 450° C. on a thin film transistor including an oxide semiconductor layer obtained under such dehydration or dehydrogenation condition, at least the peak of water at around 300° C. is not detected.

Cooling after the heat treatment is carried out so that the oxide semiconductor layer does not contact with water and hydrogen, which is achieved by performing the cooling in a furnace used for dehydration or dehydrogenation without exposure of the oxide semiconductor layer to the air. When a thin film transistor is formed using an oxide semiconductor layer obtained by changing an oxide semiconductor layer into a low-resistant oxide semiconductor layer, i.e., an n-type (e.g., n$^-$-type or n$^+$-type) oxide semiconductor layer by dehydration and dehydrogenation and then by changing the low-resistant oxide semiconductor layer into a high-resistant oxide semiconductor layer so as to be an i-type semiconductor layer, the threshold voltage of the thin film transistor can be positive voltage, so that a so-called normally-off switching element can be realized. It is preferable for a display device that a channel be formed with positive threshold voltage and as close to 0 V as possible in a thin film transistor. Note that if the threshold voltage of the thin film transistor is negative, the thin film transistor tends to be normally on; in other words, current flows between a source electrode and a drain electrode even when gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even when field-effect mobility is high, it is difficult to control the circuit. In the case where a thin film transistor has high threshold voltage and a large absolute value of its threshold voltage, the thin film transistor cannot perform a switching function as the TFT and might be a load when the TFT is driven at low voltage. In the case of an n-channel thin film transistor, it is preferable that a channel be formed and drain current flows after positive voltage is applied as gate voltage. A transistor in which a channel is not formed unless driving voltage is raised and a transistor in which a channel is formed and drain current flows even when negative voltage is applied are unsuitable for a thin film transistor used in a circuit.

Cooling after the heat treatment may be carried out after switching the gas used in heating to a different gas. For example, cooling may be performed after the furnace used for dehydration or dehydrogenation is filled with a high-purity oxygen gas, a high-purity $N_2O$ gas, or ultra-dry air (having a dew point of –40° C. or lower, preferably –60° C. or lower) without exposure of the oxide semiconductor layer to the air.

With the use of an oxide semiconductor film cooled slowly (or cooled) in an atmosphere which does not contain moisture (having a dew point of –40° C. or lower, preferably –60° C. or lower) after an impurity containing a hydrogen atom, such as water, which is contained in a film is reduced by heat treatment for dehydration or dehydrogenation, the electrical characteristics of a thin film transistor are improved and high-performance thin film transistors which can be mass-produced are realized.

In this specification, heat treatment in the atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refer not only to elimination of $H_2$ but also to elimination of H, OH, or the like.

As mentioned above, by the heat treatment for dehydration or dehydrogenation, the oxide semiconductor layer is changed into an oxygen-deficient oxide semiconductor layer so as to be a low-resistant oxide semiconductor layer, i.e., an n-type (e.g., n$^-$-type) oxide semiconductor layer. Therefore, the formation of a drain electrode layer over the low-resistant oxide semiconductor layer allows a region underneath the drain electrode layer to be a high-resistant drain region (also referred to as an HRD region) which is an oxygen-deficient region.

The carrier concentration of the high-resistant drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

Then, a channel formation region is formed by making at least part of the dehydrated or dehydrogenated oxide semiconductor layer be in an oxygen-excess state so as to be a higher-resistant oxide semiconductor layer, i.e., an i-type oxide semiconductor layer. Note that as the treatment for making part of the dehydrated or dehydrogenated oxide semiconductor layer be in an oxygen-excess state, any of the following methods is employed; deposition of an oxide insulating film by sputtering over and in contact with the dehydrated or dehydrogenated oxide semiconductor layer; heat treatment of the oxide insulating film formed over and in contact with the dehydrated or dehydrogenated oxide semiconductor layer; heat treatment of the oxide insulating film formed over and in contact with the dehydrated or dehydrogenated oxide semiconductor layer in an atmosphere containing oxygen; heat treatment of the oxide insulating film formed over and in contact with the dehydrated or dehydrogenated oxide semiconductor layer in an inert gas atmosphere, which is followed by the cooling treatment in an oxygen atmosphere; and heat treatment of the oxide insulating film formed over and in contact with the dehydrated or dehydrogenated oxide semiconductor layer in an inert gas atmosphere, which is followed by cooling treatment in ultra-dry air (having a dew point of −40° C. or lower, preferably −60° C. or lower).

Further, at least part of the dehydrated or dehydrogenated oxide semiconductor layer (a portion overlapping with a gate electrode (also referred to as a gate electrode layer)) can be selectively made to be in an oxygen-excess state, which allows the part to be a high-resistant oxide semiconductor layer, i.e., an i-type oxide semiconductor layer. Hence, the channel formation region can be formed. For example, the channel formation region can be formed in such a manner that a source electrode layer and a drain electrode layer formed using metal electrodes of Ti or the like are formed on and in contact with the dehydrated or dehydrogenated oxide semiconductor layer and then the exposure regions which do not overlap with at least one of the source electrode layer and the drain electrode layer are selectively made to be in an oxygen-excess state. In the case where the exposure regions are selectively made to be in an oxygen-excess state, a first high-resistant drain region overlapping with the source electrode layer and a second high-resistant drain region overlapping with the drain electrode layer are formed, and the channel formation region is formed between the first high-resistant drain region and the second high-resistant drain region. That is, the channel formation region is formed between the source electrode layer and the drain electrode layer in a self-aligning manner.

Thus, it is possible to manufacture a semiconductor device including a highly reliable thin film transistor with favorable electrical characteristics.

Note that by forming the high-resistant drain regions in the oxide semiconductor layer overlapping with the drain electrode layer (and the source electrode layer), reliability of a driver circuit can be improved. Specifically, by forming the high-resistant drain regions, a structure can be attained in which conductivity can be varied stepwise from the drain electrode layer to the channel formation region via the high-resistant drain region. Therefore, in the case where operation is performed with the drain electrode layer connected to a wiring for supplying a high power supply potential VDD, the high-resistant drain region serves as a buffer and a high electric field is not applied locally even if the high electric field is applied between the gate electrode layer and the drain electrode layer, so that the withstand voltage of the transistor can be improved.

In addition, by forming the high-resistant drain regions in the oxide semiconductor layer overlapping with the drain electrode layer (and the source electrode layer), the amount of leakage current in the channel formation region when the driver circuit is formed can be reduced. Specifically, by forming the high-resistant drain regions, the leakage current of the transistor, which flows between the drain electrode layer and the source electrode layer, flows sequentially through the drain electrode layer, the high-resistant drain region on the drain electrode layer side, the channel formation region, the high-resistant drain region on the source electrode layer side, and the source electrode layer. In this case, in the channel formation region, leakage current flowing from the drain electrode layer side to the channel formation region can be localized in the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the first high-resistant drain region overlapping with the source electrode layer and the second high-resistant drain region overlapping with the drain electrode layer may be formed so that they overlap with the gate electrode layer, which allows the intensity of an electric field in the vicinity of an end portion of the drain electrode layer to be reduced more effectively.

Therefore, one embodiment of a structure of the present invention disclosed in this specification is a semiconductor device which includes a gate electrode layer over an insulating surface, a gate insulating layer over the gate electrode layer, an oxide semiconductor layer over the gate insulating layer, a source electrode layer and a drain electrode layer over the oxide semiconductor layer, and a protective insulating layer which is in contact with part of the oxide semiconductor layer over the gate insulating layer, the oxide semiconductor layer, the source electrode layer, and the drain electrode layer. The oxide semiconductor layer includes at least a channel formation region and high-resistant drain regions overlapping with the source electrode layer or the drain electrode layer.

In the above structure, the carrier concentration of the high-resistant drain regions is higher than or equal to $1\times10^{17}/cm^3$ and is at least higher than the carrier concentration of the channel formation region (lower than $1\times10^{17}/cm^3$). The high-resistant drain regions are formed in a self-aligning manner, and the length of the channel formation region (the channel length L) is determined by the distance between the high-resistant drain regions.

In another embodiment of a structure of the present invention disclosed in this specification is a semiconductor device, where the semiconductor device includes a pixel portion including a first thin film transistor and a driver circuit including a second thin film transistor which are formed over the same substrate. The first thin film transistor includes a gate electrode layer over the substrate, a gate insulating layer over the gate electrode layer, a source electrode layer and a drain electrode layer over the gate insulating layer, an oxide semiconductor layer overlapping with the source electrode layer and the drain electrode layer over the gate insulating layer, a protective insulating layer which is in contact with the oxide semiconductor layer, and a pixel electrode layer over the protective insulating layer. The gate electrode layer, the gate insulating layer, the oxide semiconductor layer, the source electrode layer, the drain electrode layer, the protective insulating layer, and the pixel electrode layer of the first thin film transistor have light-transmitting properties. A material of a source electrode layer and a drain electrode layer of the second thin film transistor is different from a material of the source electrode layer and the drain electrode layer of the first thin film transistor. The material of the source electrode layer and the drain electrode layer of the second thin film transistor is a conductive material having lower resistance than the material of the source electrode layer and the drain electrode layer of the first thin film transistor.

In the above structure, a capacitor portion is further formed over the same substrate. The capacitor portion includes a capacitor wiring and a capacitor electrode overlapping with the capacitor wiring. The capacitor wiring and the capacitor electrode have light-transmitting properties. Note that since the capacitor wiring overlaps with the capacitor electrode with an insulating layer serving as a dielectric, for example, the gate insulating layer therebetween, and the gate insulating layer has a light-transmitting property, the capacitor portion has a light-transmitting property.

In addition, in the above structure, an oxide semiconductor layer of the second thin film transistor includes a channel formation region whose thickness is smaller than the thickness of a region overlapping with the source electrode layer or the drain electrode layer. The second thin film transistor includes a conductive layer over the channel formation region with the protective insulating layer therebetween.

Further, in the above structure, the source electrode layer and the drain electrode layer of the second thin film transistor are formed using a film containing an element selected from Al, Cr, Cu, Ta, Ti, Mo, or W as a main component or a stacked film of the above element.

Furthermore, in the above structure, the source electrode layer, the drain electrode layer, and the pixel electrode layer of the first thin film transistor are formed using indium oxide, a mixed oxide of indium and tin, a mixed oxide of indium and zinc, or zinc oxide. The thickness of each of the gate electrode layer, the source electrode layer, the drain electrode layer, the pixel electrode layer, a different electrode layer, and a different wiring layer which are included in the pixel portion is larger than or equal to 30 nm and smaller than or equal to 200 nm. The thickness may be set such that these layers have a light-transmitting property with respect to visible light or are translucent.

Another embodiment of a structure of the present invention disclosed in this specification is a method for manufacturing a semiconductor. In the method, a first gate electrode layer and a second gate electrode layer are formed over a substrate having an insulating surface; a gate insulating layer is formed over the first gate electrode layer and the second gate electrode layer; a first source electrode layer and a first drain electrode layer overlapping with the first gate electrode layer are formed over the gate insulating layer; a first oxide semiconductor layer which overlaps with the first gate electrode layer, part of the first source electrode layer, and part of the drain electrode layer and a second oxide semiconductor layer which overlaps with the second gate electrode layer are formed over the gate insulating layer; performing dehydration or dehydrogenation on the first oxide semiconductor layer and the second oxide semiconductor layer; a second source electrode layer and a second drain electrode layer are formed over the second oxide semiconductor layer without exposure to the air after the dehydration or dehydrogenation in order to prevent impurities such as water and hydrogen from being mixed into the first oxide semiconductor layer and the second oxide semiconductor layer; an oxide insulating layer which is in contact with part of an upper surface of the second oxide semiconductor layer, a side surface of the second oxide semiconductor layer, and an upper surface of the first second oxide semiconductor layer is formed; and a pixel electrode layer which is electrically connected to the first drain electrode layer or the first source electrode layer and a conductive layer which overlaps with the second oxide semiconductor layer are formed over the oxide insulating layer.

In the above structure, the second source electrode layer and the second drain electrode layer are formed using a film containing an element selected from Al, Cr, Cu, Ta, Ti, Mo, or W as a main component or a stacked film of the above element. The first source electrode layer, the first drain electrode layer, and the pixel electrode layer are formed using indium oxide, a mixed oxide of indium and tin, a mixed oxide of indium and zinc, or zinc oxide.

In this specification, successive treatment is defined as follows: during a series of steps from a first treatment step in which heat treatment is performed to a second treatment step in which deposition such as sputtering is performed, a substrate to be processed is placed in an atmosphere which is controlled to be vacuum or an inert gas atmosphere (a nitrogen atmosphere or a rare gas atmosphere) at all times in order to prevent the substrate from being exposed to a contaminant atmosphere such as the air. By the successive treatment, treatment such as deposition can be carried out while water or the like is prevented from attaching the substrate which has been cleaned.

Performing the series of steps from the first treatment step to the second treatment step in the same chamber is within the scope of the successive treatment in this specification.

In addition, the following is also within the scope of the successive treatment in this specification: in the case where the series of steps from the first treatment step to the second treatment step are performed in different chambers, the substrate is transferred between the chambers without being exposed to the air after the first treatment step and is subjected to the second treatment.

Note that between the first treatment step and the second treatment step, a substrate transfer step, an alignment step, a slow cooling step, a step of heating or cooling the substrate to a temperature which is necessary for the second treatment step, or the like may be provided. A process containing such a step is also within the scope of the successive treatment in this specification.

Note that a step in which liquid is used, such as a cleaning step, wet etching, or resist formation, may be provided between the first treatment step and the second treatment step. This case is not within the scope of the successive treatment in this specification.

Note that ordinal numbers such as "first" and "second" in this specification are used for convenience and do not denote the order of steps and the stacking order of layers. In addition, the ordinal numbers in this specification do not denote particular names which specify the present invention.

Further, as a display device including a driver circuit, there are a light-emitting display device including a light-emitting element and a display device including an electrophoretic display element, which is also referred to as electronic paper, in addition to a liquid crystal display device.

There is no particular limitation to the liquid crystal display device, and a liquid crystal display device including a TN liquid crystal, an IPS liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed. Specifically, one pixel is divided into a plurality of subpixels and a projection portion is provided in the position of a counter substrate corresponding to the center of each subpixel, so that a multi-domain pixel is formed. A driving method for realizing a wide viewing angle, by which one pixel is divided into a plurality of subpixels and a projection portion is provided in the position of a counter substrate corresponding to the center of each subpixel so that a multi-domain pixel is formed, is referred to as subpixel driving. Note that the projection portion may be provided on one or both of the counter substrate and an element substrate. The projection portion makes liquid crystal molecules radially and improves the controllability of alignment.

Further, an electrode for driving a liquid crystal, that is, a pixel electrode may have a top view shape like a comb-shape or a zigzag shape so that a direction in which voltage is applied may be varied. Alternatively, a multi-domain pixel may be formed utilizing photo-alignment.

Furthermore, since a thin film transistor is easily damaged by static electricity or the like, a protection circuit for protecting a thin film transistor in a pixel portion is preferably provided over the same substrate as a gate wiring or a source wiring. The protection circuit is preferably formed using a non-linear element including an oxide semiconductor.

In a light-emitting display device including a light-emitting element, a plurality of thin film transistors are included in a pixel portion. The pixel portion includes a region where a gate electrode of a thin film transistor is connected to a source wiring or a drain wiring of a different transistor. In addition, a driver circuit of the light-emitting display device including a light-emitting element includes a region where a gate electrode of a thin film transistor is connected to a source wiring or a drain wiring of the thin film transistor.

In a pixel portion of a display device which is one embodiment of the present invention, light-transmitting films are used as materials of thin film transistors. Therefore, although the pixel size is reduced due to the increase in the number of scan lines for high-resolution display, high aperture ratio can be realized. In addition, since the light-transmitting films are used as the materials of the thin film transistor, high aperture ratio can be realized even if one pixel is divided into a plurality of subpixels in order to increase a viewing angle.

Further, a light-transmitting thin film transistor is provided in the pixel portion, and a driver circuit including a thin film transistor with a different structure is formed over the same substrate as the pixel portion. Thus, manufacturing cost can be reduced.

BRIEF DESCRIPTION OF DRAWINGS

In the accompanying drawings:

FIGS. 1A to 1F are cross-sectional views illustrating steps of one embodiment of the present invention;

FIGS. 2A to 2C are cross-sectional views and plan views illustrating one embodiment of the present invention;

FIGS. 3A and 3B are cross-sectional views illustrating one embodiment of the present invention;

FIGS. 5A and 5B are cross-sectional views illustrating one embodiment of the present invention;

FIGS. 7A to 7F are cross-sectional views illustrating steps of one embodiment of the present invention;

FIGS. 8A to 8C are cross-sectional views and plan views illustrating one embodiment of the present invention;

FIGS. 10A1 to 10B illustrate a semiconductor device;

BEST MODE FOR CARRYING OUT THE INVENTION

Figure 4:
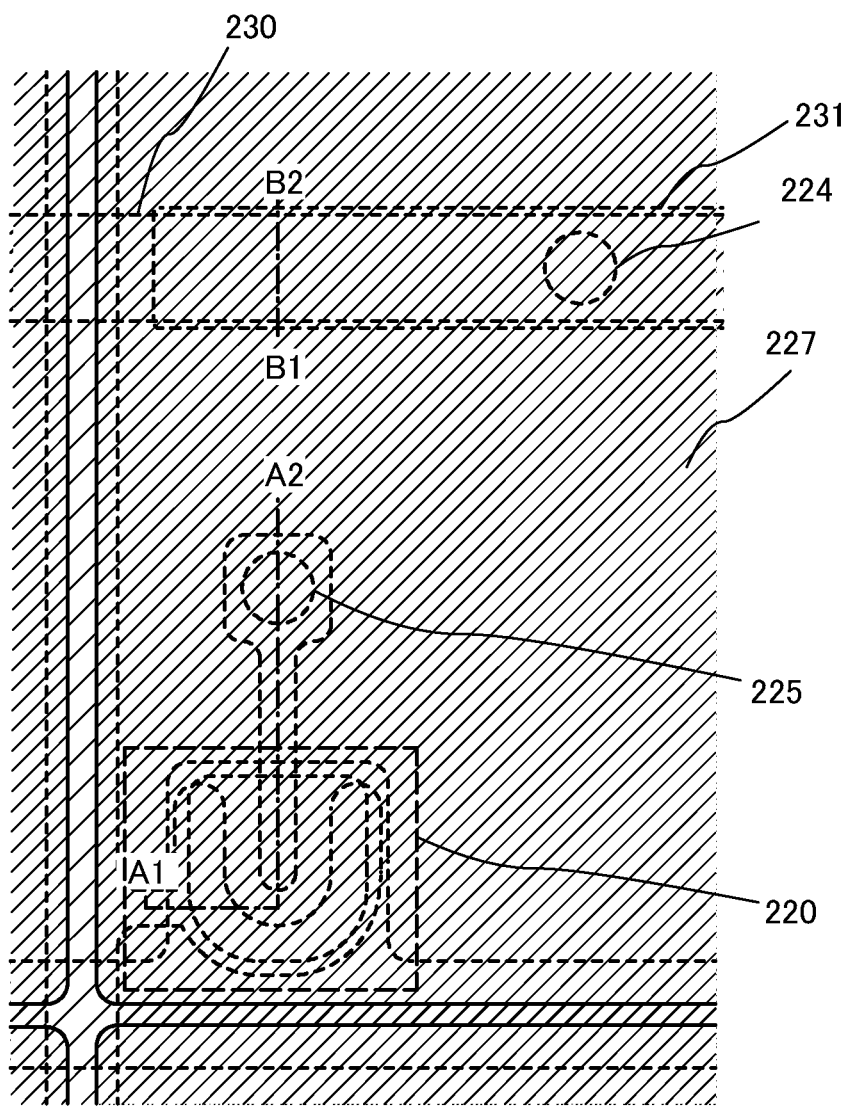
FIG. 4 is a plan view illustrating a pixel of one embodiment of the present invention.

Hereinafter, embodiments of the present invention will be described in detail with reference to the drawings. Note that the present invention is not limited to the following description. It will be readily appreciated by those skilled in the art that modes and details of the present invention can be changed in various ways. Therefore, the present invention should not be construed as being limited to the following description of the embodiments.

Embodiment 1

A semiconductor device and a method for manufacturing the semiconductor device are described with reference to FIGS. 1A to 1F and FIGS. 2A to 2C. FIG. 2A illustrates examples of cross-sectional structures of two thin film transistors with different structures, which are formed over the same substrate. In FIG. 2A, a thin film transistor 470 has a bottom-gate structure called a channel-etched structure, and a thin film transistor 460 has a bottom-gate structure called a bottom-contact structure (also referred to as an inverted-coplanar structure).

FIG. 2B1 is a plan view of the channel-etched thin film transistor 470 provided in a driver circuit. FIG. 2A includes a cross-sectional view taken along line C1-C2 in FIG. 2B1. FIG. 2C includes a cross-sectional view taken along line C3-C4 in FIG. 2B1.

The thin film transistor 470 provided in the driver circuit is a channel-etched thin film transistor and includes a gate electrode layer 401, a first gate insulating layer 402a, a second gate insulating layer 402b, an oxide semiconductor layer which includes at least a channel formation region 434, a first high-resistant drain region 431, and a second high-resistant drain region 432, a source electrode layer 405a, and a drain electrode layer 405b over a substrate 400 having an insulating surface. In addition, an oxide insulating layer 407 which covers the thin film transistor 470 and is in contact with the channel formation region 434 is provided.

The first high-resistant drain region 431 is formed in contact with a lower surface of the source electrode layer 405a in a self-aligning manner. In addition, the second high-resistant drain region 432 is formed in contact with a lower surface of the drain electrode layer 405b in a self-aligning manner. The channel formation region 434 is in contact with the oxide insulating layer 407 and has smaller thickness than the first high-resistant drain region 431 and the second high-resistant drain region 432. Furthermore, the channel formation region 434 is a region (an i-type region) which has higher resistance than the first high-resistant drain region 431 and the second high-resistant drain region 432.

In order to make wirings have low resistance, it is preferable to use a metal material for the source electrode layer 405a and the drain electrode layer 405b in the thin film transistor 470.

In a driver circuit of a liquid crystal display device, which is formed over the same substrate over which a pixel portion is formed, only positive voltage or negative voltage is applied between a source electrode and a drain electrode of a transistor which is included in a logic gate such as an inverter circuit, a NAND circuit, a NOR circuit, or a latch circuit or a transistor which is included in an analog circuit such as a sense amplifier, a constant voltage generation circuit, or a VCO. Therefore, the width of the second high-resistant drain region 432 which needs to have high withstand voltage may be designed to be larger than the width of the first high-resistant drain region 431. Further, the widths of regions where the first high-resistant drain region 431 and the second high-resistant drain region 432 overlap with the gate electrode layer may be made relatively larger.

Although the thin film transistor 470 provided in the driver circuit is described as a single-gate thin film transistor, a multi-gate thin film transistor having a plurality of channel formation regions can be used as necessary.

A conductive layer 406 is provided above the channel formation region 434 so as to overlap with the channel formation region 434. When the conductive layer 406 is electrically connected to the gate electrode layer 401 and has the same potential as the gate electrode layer 401, gate voltage can be applied from upper and lower sides of the oxide semiconductor layer which is provided between the gate electrode layer 401 and the conductive layer 406. In addition, when the gate electrode layer 401 and the conductive layer 406 have different potentials, for example, when the potential of the conductive layer 406 is a fixed potential such as GND or 0 V, electrical characteristics of the TFT, for example, the threshold voltage or the like can be controlled. In other words, when the gate electrode layer 401 functions as a first gate electrode layer and the conductive layer 406 functions as a second gate electrode layer, the thin film transistor 470 can be used as a thin film transistor having four terminals.

A protective insulating layer 408 and a planarization insulating layer 409 are stacked between the conductive layer 406 and the oxide insulating layer 407.

The protective insulating layer 408 is preferably formed in contact with the first gate insulating layer 402a provided below the protective insulating layer 408 or in contact with an insulating film serving as a base so as to prevent entry of an impurity containing a hydrogen atom, such as water, a hydrogen ion, or OH. In particular, it is effective to form the first gate insulating layer 402a or the insulating film serving as a base, which is in contact with the protective insulating layer 408, with the use of a silicon nitride film.

FIG. 2B2 is a plan view of the bottom-contact thin film transistor 460 provided in a pixel. FIG. 2A includes a cross-sectional view taken along line D1-D2 in FIG. 2B2. In addition, FIG. 2C includes a cross-sectional view taken along line D3-D4 in FIG. 2B2.

The thin film transistor 460 provided in the pixel is a bottom-contact thin film transistor and includes a gate electrode layer 451, the first gate insulating layer 402a, the second gate insulating layer 402b, an oxide semiconductor layer 454 which includes a channel formation region, a source electrode layer 455a, and a drain electrode layer 455b over the substrate 400 having an insulating surface. In addition, the oxide insulating layer 407 which covers the thin film transistor 460 and is in contact with an upper surface and a side surface of the oxide semiconductor layer 454 is provided.

Note that AC drive is performed in a liquid crystal display device in order to prevent deterioration in a liquid crystal. Through the AC drive, the polarity of a signal potential applied to a pixel electrode layer is inverted to be positive or negative every predetermined period. In a TFT which is connected to the pixel electrode layer, a pair of electrodes alternately functions as a source electrode layer and a drain electrode layer. In this specification, for convenience, one of a pair of electrodes of a thin film transistor in a pixel is referred to as a source electrode layer and the other of the electrodes is referred to as a drain electrode layer; however, practically, one of the electrodes functions as the source electrode layer and the drain electrode layer in the case of AC drive. In addition, in order to reduce the amount of leakage current, the width of the gate electrode layer in the thin film transistor 460 provided in the pixel may be made smaller than the width of the gate electrode layer in the thin film transistor 470 in the driver circuit. Alternatively, in order to reduce the amount of leakage current, the gate electrode layer in the thin film transistor 460 provided in the pixel may be designed so as not to overlap with the source electrode layer and the drain electrode layer.

Although the thin film transistor 460 provided in the pixel is described as a single-gate thin film transistor, a multi-gate thin film transistor having a plurality of channel formation regions can be used as necessary.

Heat treatment for reducing an impurity such as water (heat treatment for dehydration or dehydrogenation) is performed on the oxide semiconductor layer 454 at least after an oxide semiconductor film is deposited. The carrier concentration of the oxide semiconductor layer is lowered by, for example, the formation of an oxide insulating film which is contact with the oxide semiconductor layer after the heat treatment for dehydration or dehydrogenation and slow cooling are performed, which leads to improvement in electrical characteristics of the thin film transistor 460 and improvement in reliability.

Note that the oxide semiconductor layer 454 is formed over the source electrode layer 455a and the drain electrode layer 455b so as to partly overlap with the source electrode layer 455a and the drain electrode layer 455b. In addition, the oxide semiconductor layer 454 overlaps with the gate electrode layer 451 with the first gate insulating layer 402a and the second gate insulating layer 402b therebetween. The channel formation region of the thin film transistor 460 provided in the pixel is a region which is surrounded by a side surface of the source electrode layer 455a and a side surface of the drain electrode layer 455b, which faces the side surface of the source electrode layer 455a, in the oxide semiconductor layer 454, that is, a region which is in contact with the second gate insulating layer 402b and overlaps with the gate electrode layer 451.

In order to realize a display device having high aperture ratio, in which a light-transmitting thin film transistor is used as the thin film transistor 460, a light-transmitting conductive film is used for the source electrode layer 455a and the drain electrode layer 455b.

In addition, a light-transmitting conductive film is used for the gate electrode layer 451 of the thin film transistor 460.

In the pixel in which the thin film transistor 460 is provided, a conductive film having a light-transmitting property with respect to visible light is used for a pixel electrode layer 456, a different electrode layer (e.g., a capacitor electrode layer) or a different wiring layer (e.g., a capacitor wiring layer) so that the display device having high aperture ratio is realized. Needless to say, it is preferable to use films having light-transmitting properties with respect to visible light for the gate insulating layers 402a and 402b and the oxide insulating layer 407.

In this specification, a film having a light-transmitting property with respect to visible light refers to a film whose transmittance of visible light is 75 to 100%. In the case where such a film has conductivity, it is also referred to as a transparent conductive film. In addition, a conductive film having translucence with respect to visible light may be used for a metal oxide used for a gate electrode layer, a source electrode layer, a drain electrode layer, a pixel electrode layer, a different electrode layer, or a different wiring layer. Translucence with respect to visible light refers to a transmittance of 50 to 75%.

Steps of manufacturing the thin film transistor 470 and the thin film transistor 460 over the same substrate are described below with reference to FIGS. 1A to 1F and FIGS. 2B1 and 2B2.

First, a light-transmitting conductive film is formed over the substrate 400 having an insulating surface. Then, the gate electrode layers 401 and 451 are formed in a first photolithography step. In addition, in a pixel portion, a capacitor wiring layer is formed using the same light-transmitting material as the gate electrode layers 401 and 451 in the first photolithography step. In the case where a capacitor is needed not only in the pixel portion but also in the driver circuit, a capacitor wiring layer is formed in the driver circuit. Note that a resist mask may be formed by an inkjet method. When the resist mask is formed by an inkjet method, a photomask is not used; thus, manufacturing cost can be reduced.

Although there is no particular limitation to a substrate which can be used as the substrate 400 having an insulating surface, it is necessary that the substrate have at least heat resistance enough to withstand heat treatment to be performed later. As the substrate 400 having an insulating surface, a glass substrate formed using barium borosilicate glass, aluminoborosilicate glass, or the like can be used.

In the case where the temperature of the heat treatment to be performed later is high, a substrate whose strain point is higher than or equal to 730° C. is preferably used as the substrate 400. For the substrate 400, for example, a glass material such as aluminosilicate glass, aluminoborosilicate glass, or barium borosilicate glass is used. Note that by containing more barium oxide (BaO) than boric acid, a more practical heat-resistant glass substrate can be obtained. Therefore, a glass substrate containing more BaO than $B_2O_3$ is preferably used.

Note that instead of the substrate 400, a substrate formed using an insulator, such as a ceramic substrate, a quartz substrate, or a sapphire substrate, may be used. Alternatively, crystallized glass or the like can be used.

An insulating film serving as a base film may be provided between the substrate 400 and the gate electrode layers 401 and 451. The base film has a function of preventing diffusion of an impurity element from the substrate 400 and can be formed to have a single-layer structure or a layered structure of one or more of a silicon nitride film, a silicon oxide film, a silicon nitride oxide film, and a silicon oxynitride film.

As the material of the gate electrode layers 401 and 451, a conductive material having a light-transmitting property with respect to visible light, for example, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be used. The thickness of the gate electrode layers 401 and 451 is selected as appropriate within a range of 50 to 300 nm. As a deposition method of the metal oxide used for the gate electrode layers 401 and 451, sputtering, vacuum evaporation (e.g., electron beam deposition), arc discharge ion plating, or a spray method is used. In addition, in the case where sputtering is used, it is preferable that deposition be performed using a target containing $SiO_2$ at 2 to 10 wt %, and $SiO_x$ (x>0), which inhibits crystallization, be contained in the light-transmitting conductive film so that crystallization is suppressed when the heat treatment for dehydration or dehydrogenation is performed in the later step.

Next, a gate insulating layer is formed over the gate electrode layers 401 and 451.

The gate insulating layer can be formed to have a single-layer structure or a layered structure of one or more of a silicon oxide layer, a silicon nitride layer, a silicon oxynitride layer, and a silicon nitride oxide layer by plasma-enhanced CVD, sputtering, or the like. For example, a silicon oxynitride layer may be formed using a deposition gas containing $SiH_4$, oxygen, and nitrogen by plasma-enhanced CVD.

In this embodiment, a gate insulating layer in which the first gate insulating layer 402a with a thickness of 50 to 200 nm and the second gate insulating layer 402b with a thickness of 50 to 300 nm are stacked is used. For the first gate insulating layer 402a, a 100-nm-thick silicon nitride film or a 100-nm-thick silicon nitride oxide film is used. Further, for the second gate insulating layer 402b, a 100-nm-thick silicon oxide film is used.

Next, the source electrode layer 455a and the drain electrode layer 455b are formed in a second photolithography step after a light-transmitting conductive film is formed over the second gate insulating layer 402b (see FIG. 1A). As a deposition method of the light-transmitting conductive film, sputtering, vacuum evaporation (e.g., electron beam deposition), arc discharge ion plating, or a spray method is used. As the material of the conductive film, a conductive material having a light-transmitting property with respect to visible light, for example, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be used. The thickness of the conductive film is selected as appropriate within a range of 50 to 300 nm In addition, in the case where sputtering is used, it is preferable that deposition be performed using a target containing $SiO_2$ at 2 to 10 wt %, and $SiO_x$ (x>0), which inhibits crystallization, be contained in the light-transmitting conductive film so that crystallization is suppressed when the heat treatment for dehydration or dehydrogenation is performed in the later step.

Note that a resist mask for forming the source electrode layer 455a and the drain electrode layer 455b may be formed by an inkjet method. When the resist mask is formed by an inkjet method, a photomask is not used; thus, manufacturing cost can be reduced.

Next, an oxide semiconductor film with a thickness of 2 to 200 nm is formed over the second gate insulating layer 402b, the source electrode layer 455a, and the drain electrode layer 455b. The thickness of the oxide semiconductor film is preferably smaller than or equal to 50 nm in order that the oxide semiconductor layer be amorphous even when heat treatment for dehydration or dehydrogenation is performed after the oxide semiconductor film is formed. When the thickness of the oxide semiconductor film is made small, crystallization can be suppressed when heat treatment is performed after the oxide semiconductor layer is formed.

Note that before the oxide semiconductor film is formed by sputtering, dust on a surface of the second gate insulating layer 402b is preferably removed by reverse sputtering in which an argon gas is introduced and plasma is generated. The reverse sputtering refers to a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere.

As the oxide semiconductor film, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film is formed by sputtering with the use of an In—Ga—Zn—O-based oxide semiconductor target. Sputtering may be carried out in a rare gas (typically argon) atmosphere, an oxygen atmosphere, or an atmosphere including a rare gas (typically argon) and oxygen. In the case where sputtering is used, it is preferable that deposition be performed using a target containing $SiO_2$ at 2 to 10 wt % to allow $SiO_x$ (x>0), which inhibits crystallization, to be contained in the oxide semiconductor film so that crystallization is suppressed when the heat treatment for dehydration or dehydrogenation is performed in the later step.

Next, the oxide semiconductor film is processed into an island-shaped oxide semiconductor layer in a third photolithography step. Note that in order to obtain an oxide semiconductor layer overlapping with the source electrode layer 455a and the drain electrode layer 455b, the material of the source electrode layer 455a and the drain electrode layer 455b and etching conditions are adjusted as appropriate so that the source electrode layer 455a and the drain electrode layer 455b are not etched when the oxide semiconductor layer is etched. A resist mask for forming the island-shaped oxide semiconductor layer may be formed by an inkjet method. When the resist mask is formed by an inkjet method, a photomask is not used; thus, manufacturing cost can be reduced.

Then, the oxide semiconductor layer is subjected to dehydration or dehydrogenation. The temperature of first heat treatment for dehydration or dehydrogenation is higher than or equal to 350° C. and lower than the strain point of the substrate, preferably higher than or equal to 400° C. and lower than the strain point of the substrate. Here, after the substrate is put in an electric furnace which is a kind of heat treatment apparatus and heat treatment is performed on the oxide semiconductor layer in a nitrogen atmosphere, water and hydrogen are prevented from being mixed into the oxide semiconductor layer by preventing the substrate from being exposed to the air; thus, oxide semiconductor layers 403 and 453 are obtained (see FIG. 1B). In this embodiment, the same furnace is used from the heating temperature T at which the oxide semiconductor layer is subjected to dehydration or dehydrogenation to a temperature low enough to prevent water from entering again; specifically, slow cooling is performed in a nitrogen atmosphere until the temperature drops by 100° C. or more from the heating temperature T. Note that without limitation to a nitrogen atmosphere, dehydration or dehydrogenation may be performed in a rare gas atmosphere (e.g., helium, neon, or argon) or under reduced pressure.

Note that in the first heat treatment, it is preferable that water, hydrogen, and the like be not included in nitrogen or a rare gas such as helium, neon, or argon. For example, the purity of nitrogen or a rare gas such as helium, neon, or argon, which is introduced into the heat treatment apparatus, is preferably 6N (99.9999%) or more, more preferably 7N (99.99999%) or more (i.e., impurity concentration is preferably 1 ppm or lower, more preferably 0.1 ppm or lower).

In some cases, the oxide semiconductor layer is crystallized to be a microcrystalline film or a polycrystalline film depending on the conditions of the first heat treatment or the material of the oxide semiconductor layer.

The first heat treatment can be performed before processing the oxide semiconductor film into an island-shaped oxide semiconductor layer. In this case, after the first heat treatment, the substrate is taken out from the heat treatment apparatus and a photolithography step is performed.

Before the oxide semiconductor film is formed, heat treatment (at higher than or equal to 400° C. and lower than the strain point of the substrate) may be performed in an inert gas atmosphere (e.g., nitrogen, helium, neon, or argon), an oxygen atmosphere, or under reduced pressure so that impurities such as hydrogen and water, which are included in the gate insulating layer, are removed.

Next, a resist mask 436 is formed in a fourth photolithography step after a metal conductive film is formed over the second gate insulating layer 402b, and etching is selectively performed so that a metal electrode layer 435 is formed (see FIG. 1C). As the material of the metal conductive film, an element selected from Al, Cr, Cu, Ta, Ti, Mo, or W, an alloy containing any of these elements as a component, an alloy containing these elements in combination, or the like can be used.

The metal conductive film preferably has a three-layer structure in which a titanium layer, an aluminum layer, and a titanium layer are stacked in that order or a three-layer structure in which a molybdenum layer, an aluminum layer, and a molybdenum layer are stacked in that order. Needless to say, the metal conductive film may have a single-layer structure, a two-layer structure, or a layered structure of four or more layers.

Note that in order to selectively remove the metal conductive film which overlaps with the oxide semiconductor layer 453, the source electrode layer 455*a*, and the drain electrode layer 455*b* in the fourth photolithography step, the materials of the oxide semiconductor layer 453, the source electrode layer 455*a*, and the drain electrode layer 455*b* and etching conditions are adjusted as appropriate so that the oxide semiconductor layer 453, the source electrode layer 455*a*, and the drain electrode layer 455*b* are not etched when the metal conductive film is etched. The resist mask 436 for forming the metal electrode layer 435 may be formed by an inkjet method. When the resist mask 436 is formed by an inkjet method, a photomask is not used; thus, manufacturing cost can be reduced.

Then, the resist mask 436 is removed, a resist mask 437 is formed in a fifth photolithography step, and etching is selectively performed so that the source electrode layer 405*a* and the drain electrode layer 405*b* are formed (see FIG. 1D). Note that in the fifth photolithography step, only part of the oxide semiconductor layer 403 is etched so that an oxide semiconductor layer 433 having a groove (a depression portion) is formed. The resist mask 437 for forming the groove (the depression portion) in the oxide semiconductor layer may be formed by an inkjet method. When the resist mask 437 is formed by an inkjet method, a photomask is not used; thus, manufacturing cost can be reduced.

Then, the resist mask 437 is removed, and the oxide insulating layer 407 serving as a protective insulating film is formed in contact with an upper surface and a side surface of the oxide semiconductor layer 453 and the groove (the depression portion) in the oxide semiconductor layer 433.

The oxide insulating layer 407 has a thickness of at least 1 nm or larger and can be formed by a method by which impurities such as water and hydrogen are not mixed into the oxide insulating layer 407, such as sputtering, as appropriate. In this embodiment, a 300-nm-thick silicon oxide film is deposited as the oxide insulating layer 407 by sputtering. The substrate temperature at the time of deposition is in the range of room temperature to 300° C., and is 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, silicon oxide can be deposited using a silicon target in an atmosphere including oxygen and nitrogen by sputtering. The oxide insulating layer 407 which is formed in contact with the oxide semiconductor layer whose resistance is lowered by the dehydration or dehydrogenation is formed using an inorganic insulating film which does not contain an impurity containing a hydrogen atom, such as water, a hydrogen ion, or OH$^-$, and blocks entry of such an impurity from the outside, typically a silicon oxide film, a silicon nitride oxide film, an aluminum oxide film, or an aluminum oxynitride film.

Next, second heat treatment (preferably at 200 to 400° C., for example, 250 to 350° C.) is performed in an inert gas atmosphere or an oxygen gas atmosphere (see FIG. 1E). For example, the second heat treatment is performed at 250° C. for one hour in a nitrogen atmosphere. With the second heat treatment, heat is applied while the groove in the oxide semiconductor layer 433 and the upper surface and the side surface of the oxide semiconductor layer 453 are in contact with the oxide insulating layer 407.

Through the above steps, heat treatment for dehydration or dehydrogenation is performed on the oxide semiconductor film after deposition to reduce the resistance, and then, part of the oxide semiconductor film is selectively made to be in an oxygen-excess state. Accordingly, the channel formation region 434 overlapping with the gate electrode layer 401 becomes intrinsic, and the first high-resistant drain region 431 which overlaps with the source electrode layer 405*a* and the second high-resistant drain region 432 which overlaps with the drain electrode layer 405*b* are formed in a self-aligning manner. Further, the entire oxide semiconductor layer 453 becomes intrinsic and serves as the oxide semiconductor layer 454 including a channel formation region.

Note that by forming the second high-resistant drain region 432 (or the first high-resistant drain region 431) in the oxide semiconductor layer overlapping with the drain electrode layer 405*b* (and the source electrode layer 405*a*), reliability of a driver circuit can be improved. Specifically, by forming the second high-resistant drain region 432, a structure can be employed in which conductivity can be varied stepwise from the drain electrode layer to the channel formation region via the second high-resistant drain region 432. Therefore, in the case where operation is performed with the drain electrode layer 405*b* connected to a wiring for supplying a high power supply potential VDD, the high-resistant drain region serves as a buffer and a high electric field is not applied locally even if the high electric field is applied between the gate electrode layer 401 and the drain electrode layer 405*b*, so that the withstand voltage of the transistor can be improved.

Note that by forming the second high-resistant drain region 432 (or the first high-resistant drain region 431) in the oxide semiconductor layer overlapping with the drain electrode layer 405*b* (and the source electrode layer 405*a*), the amount of leakage current in the channel formation region 434 can be reduced.

Then, the protective insulating layer 408 is formed over the oxide insulating layer 407 (see FIG. 1F). In this embodiment, a silicon nitride film is formed by RF sputtering. Since RF sputtering has high productivity, it is preferably used as a deposition method of the protective insulating layer 408. The protective insulating layer 408 is formed using an inorganic insulating film which does not contain an impurity containing a hydrogen atom, such as water, a hydrogen ion, or OH$^-$, and blocks entry of such an impurity from the outside, typically a silicon nitride film, an aluminum nitride film, a silicon nitride oxide film, or an aluminum oxynitride film. Needless to say, the protective insulating layer 408 is formed using a light-transmitting insulating film.

It is preferable that the protective insulating layer 408 be in contact with the first gate insulating layer 402*a* provided below the protective insulating layer 408 or in contact with the insulating film serving as a base so that entry of an impurity containing a hydrogen atom, such as water, a hydrogen ion, or OH$^-$, from the vicinity of an edge portion of the substrate can be prevented. In particular, it is effective to form the first gate insulating layer 402*a* or the insulating film serving as a base, which is in contact with the protective insulating layer 408, with the use of a silicon nitride film. In other words, when a silicon nitride film is provided so as to surround a lower surface, an upper surface, and a side surface of the oxide semiconductor layer, reliability of the display device is improved.

Next, the planarization insulating layer 409 is formed over the protective insulating layer 408. The planarization insulating layer 409 can be formed using an organic material having heat resistance, such as polyimide, an acrylic resin, a benzocyclobutene-based resin, polyamide, or an epoxy resin. Other than such an organic material, it is possible to use a low-dielectric constant material (a low-k material), a siloxane-based resin, PSG (phosphosilicate glass), BPSG (borophosphosilicate glass), or the like. Note that the planarization insulating layer 409 may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation to the method for forming the planarization insulating layer 409. The planarization insulating layer 409 can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

Then, a resist mask is formed in a sixth photolithography step and a contact hole which reaches the drain electrode layer 455b is formed by etching of the planarization insulating layer 409, the protective insulating layer 408, and the oxide insulating layer 407. In addition, contact holes which reach the gate electrode layers 401 and 451 are formed with the etching. The resist mask for forming the contact hole which reaches the drain electrode layer 455b may be formed by an inkjet method. When the resist mask is formed by an inkjet method, a photomask is not used; thus, manufacturing cost can be reduced.

Next, a light-transmitting conductive film is formed after the resist mask is removed. The light-transmitting conductive film is formed using indium oxide, a mixed oxide of indium and tin (abbreviated as ITO), or the like by sputtering, vacuum evaporation, or the like. Alternatively, an Al—Zn—O-based non-single-crystal film containing nitrogen (i.e., an Al—Zn—O—N-based non-single-crystal film), a Zn—O-based non-single-crystal film containing nitrogen (i.e., a Zn—O—N-based non-single-crystal film), or a Sn—Zn—O-based non-single-crystal film containing nitrogen (i.e., a Sn—Zn—O—N-based non-single-crystal film) may be used as the material of the light-transmitting conductive film. Note that the composition ratio (atomic %) of zinc in the Al—Zn—O—N-based non-single-crystal film is less than or equal to 47 atomic % and is higher than that of aluminum in the non-single-crystal film; the composition ratio (atomic %) of aluminum in the Al—Zn—O—N-based non-single-crystal film is higher than that of nitrogen in the non-single-crystal film. Such a material is etched with a hydrochloric acid-based solution. However, since a residue is easily left on the substrate particularly in etching ITO, a mixed oxide of indium and zinc may be used in order to improve etching processability.

Note that the unit of the composition ratio in the light-transmitting conductive film is atomic percent (atomic %), and the composition ratio is evaluated by analysis using an electron probe X-ray micro analyzer (EPMA).

Next, a resist mask is formed in a seventh photolithography step, and unnecessary portions are removed by etching so that the pixel electrode layer 456 and the conductive layer 406 are formed (see FIG. 2A).

Through the above steps, over the same substrate, the thin film transistor 470 and the thin film transistor 460 can be separately formed in the driver circuit and the pixel portion with the use of seven masks. Further, a storage capacitor which includes a capacitor wiring layer and a capacitor electrode with the first gate insulating layer 402a and the second gate insulating layer 402b used as dielectrics can be formed over the same substrate. The thin film transistors 460 and storage capacitors are arranged in matrix to correspond to individual pixels so that the pixel portion is formed and the driver circuit including the thin film transistor 470 is provided around the pixel portion. Thus, one of the substrates for manufacturing an active matrix display device can be obtained. In this specification, such a substrate is referred to as an active matrix substrate for convenience.

Note that the pixel electrode layer 456 is electrically connected to the capacitor electrode layer through the contact hole formed in the planarization insulating layer 409, the protective insulating layer 408, and the oxide insulating layer 407. Note that the capacitor electrode layer can be formed using the same light-transmitting material in the same step as the drain electrode layer 455b.

The conductive layer 406 is provided so as to overlap with the channel formation region 434 in the oxide semiconductor layer, whereby in a bias-temperature stress test (hereinafter referred to as a BT test) for examining the reliability of a thin film transistor, the amount of change in the threshold voltage of the thin film transistor 470 before and after the BT test can be reduced. Further, a potential of the conductive layer 406 may be the same as or different from that of the gate electrode layer 401. The conductive layer 406 can function also as a second gate electrode layer. Alternatively, the potential of the conductive layer 406 may be GND or 0 V, or the conductive layer 406 may be in a floating state.

Alternatively, the resist mask for forming the pixel electrode layer 456 may be formed with by inkjet method. When the resist mask is formed by an inkjet method, a photomask is not used; thus, manufacturing cost can be reduced.

Embodiment 2

In this embodiment, an example is described in which an active matrix liquid crystal display device is manufactured using the active matrix substrate illustrated in Embodiment 1.

FIG. 3A illustrates an example of a cross-sectional structure of an active matrix substrate. Note that FIG. 4 illustrates part of a top view of a pixel portion. A cross section taken along dash-dot line A1-A2 in FIG. 4 corresponds to a cross section between A1 and A2 in FIG. 3A. A cross section taken along dash-dot line B1-B2 in FIG. 4 corresponds to a cross section between B1 and B2 in FIG. 3A. In the layout of a pixel illustrated in FIG. 4, the shape of an upper surface of a source electrode layer overlapping with an oxide semiconductor layer is a U-shape or a C-shape, which is different from that in Embodiment 1; however, this embodiment is not particularly limited to this.

The thin film transistor in the driver circuit and the thin film transistor in the pixel portion which are formed over the same substrate are illustrated in Embodiment 1; in this embodiment, a storage capacitor, a gate wiring, and a terminal portion of a source wiring are illustrated in addition to these thin film transistors. The capacitor, the gate wiring, and the terminal portion of the source wiring can be formed in the same manufacturing steps as in Embodiment 1 and can be manufactured without the increase in the number of photomasks and the increase in the number of steps. Further, in a portion serving as a display region in a pixel portion, all the gate wiring, the source wiring, and a capacitor wiring layer are formed using light-transmitting conductive films, which results in high aperture ratio. Further, a metal wiring is used for a source wiring layer in a portion which is not the display region in order to reduce wiring resistance.

In FIG. 3A, a thin film transistor 210 is a channel-etched thin film transistor provided in a driver circuit, and a thin film transistor 220 which is electrically connected to a pixel electrode layer 227 is a bottom-contact thin film transistor provided in a pixel portion.

In this embodiment, the thin film transistor 220 formed over a substrate 200 has the same structure as the thin film transistor 460 in Embodiment 1.

A capacitor wiring layer 230 which is formed using the same light-transmitting material in the same step as a gate electrode layer of the thin film transistor 220 overlaps with a capacitor electrode 231 with a first gate insulating layer 202a and a second gate insulating layer 202b serving as dielectrics therebetween; thus, a storage capacitor is formed. Note that the capacitor electrode 231 is formed using the same light-transmitting material in the same step as a source electrode layer and a drain electrode layer of the thin film transistor 220. Thus, the storage capacitor has a light-transmitting property as well as the thin film transistor 220, so that the aperture ratio can be improved.

It is important for the storage capacitor to have a light-transmitting property in improving the aperture ratio. In a small liquid crystal display panel of 10 inches or smaller in particular, high aperture ratio can be realized even when the size of a pixel is made small in order to realize higher resolution of display images by increasing the number of gate wirings, for example. Further, high aperture ratio can be realized by using light-transmitting films as materials of the thin film transistor 220 and the storage capacitor even when one pixel is divided into a plurality of subpixels in order to realize a wide viewing angle. That is, high aperture ratio can be realized even when thin film transistors are densely arranged, and the display region can have a sufficient area. For example, when one pixel includes two to four subpixels and storage capacitors, the storage capacitors have light-transmitting properties as well as the thin film transistors, so that the aperture ratio can be improved.

Note that the storage capacitor is provided below the pixel electrode layer 227, and the capacitor electrode 231 is electrically connected to the pixel electrode layer 227.

In this embodiment, an example is described in which the storage capacitor is formed using the capacitor electrode 231 and the capacitor wiring layer 230; however, there is no particular limitation to the structure of the storage capacitor. For example, the storage capacitor may be formed in such a manner that, without provision of a capacitor wiring layer, a pixel electrode layer overlaps with a gate wiring in an adjacent pixel with a planarization insulating layer, a protective insulating layer, a first gate insulating layer, and a second gate insulating layer therebetween.

FIG. 4 illustrates a contact hole 224 for electrically connecting the capacitor electrode 231 and the pixel electrode layer 227 to each other. The contact hole 224 can be formed using the same photomask as that used for forming a contact hole 225 for electrically connecting the drain electrode layer of the thin film transistor 220 and the pixel electrode layer 227 to each other. Thus, the contact hole 224 can be formed without the increase in the number of steps.

A plurality of gate wirings, source wirings, and capacitor wiring layers are provided in accordance with pixel density. Further, in the terminal portion, a plurality of first terminal electrodes each having the same potential as the gate wiring, a plurality of second terminal electrodes each having the same potential as the source wiring, a plurality of third terminal electrodes each having the same potential as the capacitor wiring layer, and the like are arranged. There is no particular limitation to the number of each of the terminal electrodes, and the number of the terminals may be determined by a practitioner as appropriate.

In the terminal portion, the first terminal electrode which has the same potential as the gate wiring can be formed using the same light-transmitting material as the pixel electrode layer 227. The first terminal electrode is electrically connected to the gate wiring through a contact hole which reaches the gate wiring. The contact hole which reaches the gate wiring is formed by selective etching of a planarization insulating layer 204, a protective insulating layer 203, an oxide insulating layer 216, the second gate insulating layer 202b, and the first gate insulating layer 202a with the use of the same photomask as that used for forming the contact hole for electrically connecting the drain electrode layer of the thin film transistor 220 and the pixel electrode layer 227 to each other.

A gate electrode layer of the thin film transistor 210 provided in the driver circuit may be electrically connected to a conductive layer 217 provided above an oxide semiconductor layer. In that case, a contact hole is formed by selective etching of the planarization insulating layer 204, the protective insulating layer 203, the oxide insulating layer 216, the second gate insulating layer 202b, and the first gate insulating layer 202a with the use of the same photomask as that used for forming the contact hole for electrically connecting the drain electrode layer of the thin film transistor 220 and the pixel electrode layer 227 to each other. The conductive layer 217 and the gate electrode layer of the thin film transistor 210 provided in the driver circuit are electrically connected to each other through the contact hole.

A second terminal electrode 235 which has the same potential as a source wiring 234 in the driver circuit can be formed using the same light-transmitting material as the pixel electrode layer 227. The second terminal electrode 235 is electrically connected to the source wiring through a contact hole which reaches the source wiring 234. The source wiring 234 is a metal wiring, is formed using the same material in the same step as a source electrode layer of the thin film transistor 210, and has the same potential as the source electrode layer of the thin film transistor 210.

The third terminal electrode which has the same potential as the capacitor wiring layer 230 can be formed using the same light-transmitting material as the pixel electrode layer 227. Further, a contact hole which reaches the capacitor wiring layer 230 can be formed using the same photomask in the same step as those for forming the contact hole 224 for electrically connecting the capacitor electrode 231 and the pixel electrode layer 227 to each other.

In the case of manufacturing an active matrix liquid crystal display device, a liquid crystal layer is provided between an active matrix substrate and a counter substrate provided with a counter electrode, and the active matrix substrate and the counter substrate are fixed. Note that a common electrode which is electrically connected to the counter electrode provided on the counter substrate is provided over the active matrix substrate, and a fourth terminal electrode which is electrically connected to the common electrode is provided in the terminal portion. The fourth terminal electrode is used for setting a potential of the common electrode to a fixed potential such as GND or 0 V. The fourth terminal electrode can be formed using the same light-transmitting material as the pixel electrode layer 227.

There is no particular limitation to the structure where the source electrode layer of the thin film transistor 220 and the source electrode layer of the thin film transistor 210 are electrically connected to each other. For example, a connection electrode for connecting the source electrode layer of the thin film transistor 220 and the source electrode layer of the thin film transistor 210 may be formed in the same step as the pixel electrode layer 227. Further, in the portion which is not the display region, the source electrode layer of the thin film transistor 220 and the source electrode layer of the thin film transistor 210 may be in contact with each other so as to overlap with each other.

Note that FIG. 3A illustrates a cross-sectional structure of a gate wiring layer 232 in the driver circuit. Since this embodiment illustrates an example of a small liquid crystal display panel of 10 inches or smaller, the gate wiring layer 232 in the driver circuit is formed using the same light-transmitting material as the gate electrode layer of the thin film transistor 220.

When the same material is used for the gate electrode layer, the source electrode layer, the drain electrode layer, the pixel electrode layer, a different electrode layer, and a different wiring layer, a common sputtering target and a common manufacturing apparatus can be used, so that material cost and cost of an etchant (or an etching gas) used in etching can be reduced. Accordingly, manufacturing cost can be reduced.

In the case where a photosensitive resin material is used for the planarization insulating layer 204 in the structure of FIG. 3A, the step of forming a resist mask can be omitted.

FIG. 3B illustrates a cross-sectional structure which is slightly different from the structure in FIG. 3A. FIG. 3B is the same as FIG. 3A except that the planarization insulating layer 204 is not provided; therefore, the same portions are denoted by the same reference numerals and detailed description of the same portions is omitted. In FIG. 3B, the pixel electrode layer 227, the conductive layer 217, and the second terminal electrode 235 are formed on and in contact with the protective insulating layer 203.

With the structure in FIG. 3B, the step of forming the planarization insulating layer 204 can be omitted.

This embodiment can be freely combined with Embodiment 1.

Embodiment 3

In this embodiment, an example is described in which part of a gate wiring is formed using a metal wiring so that wiring resistance is reduced, because there is a possibility that the resistance of a light-transmitting wiring might become a problem when the size of a liquid crystal display panel exceeds 10 inches and reaches 60 inches and even 120 inches.

Note that in FIG. 5A, the same portions as those in FIG. 3A are denoted by the same reference numerals and detailed description of the same portions is omitted.

FIG. 5A illustrates an example where part of a gate wiring in a driver circuit is formed using a metal wiring and is formed in contact with a light-transmitting wiring which is the same as the gate electrode layer of the thin film transistor 210. Note that the number of photomasks is larger than that in Embodiment 1 because the metal wiring is formed.

First, a heat-resistant conductive material film (with a thickness of 100 to 500 nm) which can withstand first heat treatment for dehydration or dehydrogenation is formed over the substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation, and the conductive film may be formed using an element selected from Ta, W, Ti, Mo, Al, or Cu, an alloy containing any of these elements as a component, an alloy film containing these elements in combination, or a nitride containing any of these elements as a component. The heat-resistant conductive material film is not limited to a single layer containing the above element and may be a stack of two or more layers.

In a first photolithography step, metal wirings are formed, so that a first metal wiring layer 236 and a second metal wiring layer 237 are formed. ICP (inductively coupled plasma) etching is preferably used for etching of the tungsten film and the tantalum nitride film. The films can be etched to have a desired tapered shape with ICP etching with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film thereon can be reduced.

Then, a gate wiring layer 238, a gate electrode layer of the thin film transistor 210, and a gate electrode layer of the thin film transistor 220 are formed in a second photolithography step after the light-transmitting conductive film is formed. The light-transmitting conductive film is formed using any of the conductive materials having light-transmitting properties with respect to visible light in Embodiment 1.

Note that some materials for the light-transmitting conductive film cause the formation of an oxide film on a surface of the first metal wiring layer 236 or the second metal wiring layer 237 which contacts with the gate wiring layer 238, which occurs in later heat treatment or the like and results in the increase in contact resistance. Therefore, the second metal wiring layer 237 is preferably formed using a metal nitride film which prevents oxidation of the first metal wiring layer 236.

Next, a gate insulating layer, an oxide semiconductor layer, and the like are formed in the same steps as in Embodiment 1. In the following steps, as described in Embodiment 1, the active matrix substrate is manufactured.

Further, in this embodiment, an example is described in which after the formation of the planarization insulating layer 204, the planarization insulating layer in a terminal portion is selectively removed using a photomask. It is preferable that the planarization insulating layer be not placed in the terminal portion so that the terminal portion can be connected to an FPC in a favorable manner.

In FIG. 5A, the second terminal electrode 235 is formed over the protective insulating layer 203. FIG. 5A illustrates the gate wiring layer 238 which overlaps with part of the second metal wiring layer 237; however, the gate wiring layer may cover all the first metal wiring layer 236 and the second metal wiring layer 237. In other words, the first metal wiring layer 236 and the second metal wiring layer 237 can be referred to as auxiliary wirings for reducing the resistance of the gate wiring.

In the terminal portion, a first terminal electrode which has the same potential as the gate wiring is formed over the protective insulating layer 203 and is electrically connected to the second metal wiring layer 237. A wiring led from the terminal portion is also formed using a metal wiring.

Further, in order to reduce the wiring resistance, the metal wirings (i.e., the first metal wiring layer 236 and the second metal wiring layer 237) can be used as the auxiliary wirings for the gate wiring and a capacitor wiring in a portion which is not located in a display region.

FIG. 5B illustrates a cross-sectional structure which is slightly different from the structure in FIG. 5A. FIG. 5B is the same as FIG. 5A except for a material of the gate electrode layer in the thin film transistor in the driver circuit; therefore, the same portions are denoted by the same reference numerals and detailed description of the same portions is omitted.

FIG. 5B illustrates an example in which the gate electrode layer in the thin film transistor in the driver circuit is formed using a metal wiring. In the driver circuit, the material of the gate electrode layer is not limited to a light-transmitting material.

In FIG. 5B, a thin film transistor 240 provided in the driver circuit includes a gate electrode layer in which a second metal wiring layer 241 is stacked over a first metal wiring layer 242. Note that the first metal wiring layer 242 can be formed using the same material in the same step as the first metal wiring layer 236. Further, the second metal wiring layer 241 can be formed using the same material in the same step as the second metal wiring layer 237.

In the case where the gate electrode layer of the thin film transistor 240 is electrically connected to the conductive layer 217, it is preferable to use a metal nitride film as the second metal wiring layer 241 for preventing oxidation of the first metal wiring layer 242.

In this embodiment, a metal wiring is used for some wirings of the driver circuit so that the wiring resistance is reduced, and higher definition of display images can be realized and high aperture ratio can be maintained even when the size of a liquid crystal display panel exceeds 10 inches and reaches 60 inches and even 120 inches.

Embodiment 4

Figure 6A:
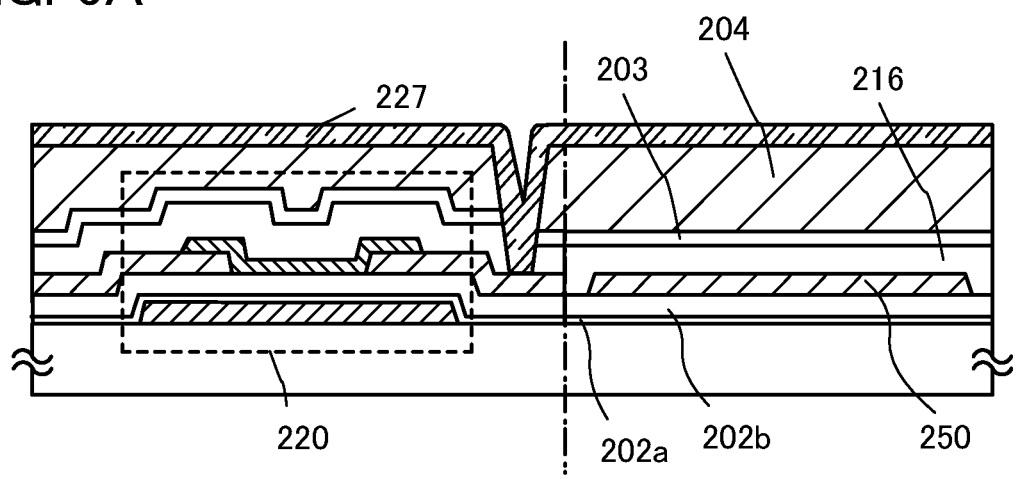
FIGS. 6A and 6B are cross-sectional views illustrating one embodiment of the present invention.
Figure 6B:
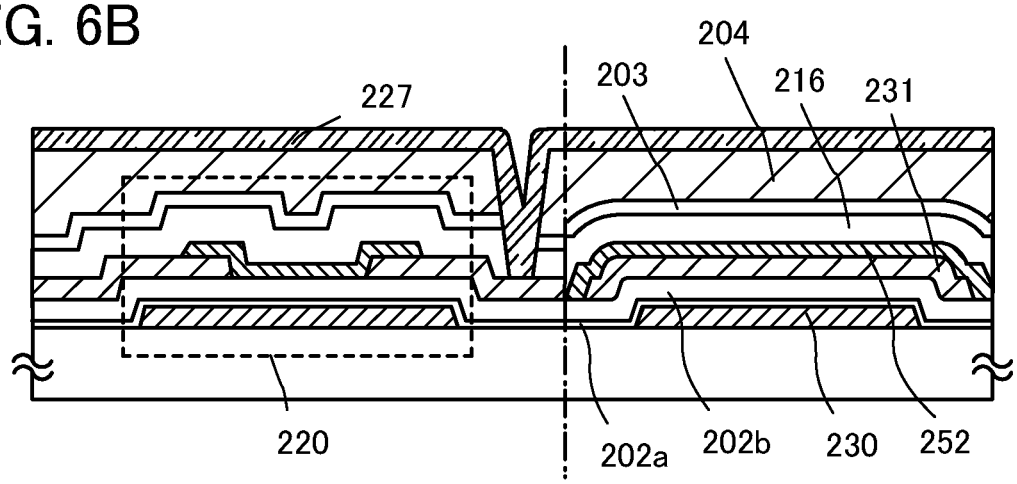

In this embodiment, an example of a structure of a storage capacitor, which is different from that in Embodiment 2, is illustrated in FIGS. 6A and 6B. FIG. 6A is the same as FIG. 3A except for a structure of the storage capacitor; therefore, the same portions are denoted by the same reference numerals and detailed description of the same portions is omitted. Note that FIG. 6A illustrates a cross-sectional structure of the thin film transistor 220 provided in a pixel portion and a storage capacitor.

FIG. 6A illustrates an example in which the storage capacitor is constituted by the pixel electrode layer 227 and a capacitor wiring layer 250 which overlaps with the pixel electrode layer 227, with the oxide insulating layer 216, the protective insulating layer 203, and the planarization insulating layer 204 used as dielectrics. Since the capacitor wiring layer 250 is formed using the same light-transmitting material in the same step as the source electrode layer of the thin film transistor 220 provided in the pixel portion, the capacitor wiring layer 250 is arranged so as not to overlap with a source wiring layer of the thin film transistor 220.

In the storage capacitor illustrated in FIG. 6A, a pair of electrodes and the dielectrics have light-transmitting properties; thus, the storage capacitor as a whole has a light-transmitting property.

FIG. 6B illustrates an example of a structure of the storage capacitor, which is different from that in FIG. 6A. FIG. 6B is the same as FIG. 6A except for a structure of the storage capacitor; therefore, the same portions are denoted by the same reference numerals and detailed description of the same portions is omitted.

FIG. 6B illustrates an example in which the storage capacitor is constituted by the capacitor wiring layer 230 and a stack of an oxide semiconductor layer 252 which overlaps with the capacitor wiring layer 230 and the capacitor electrode 231, with the first gate insulating layer 202a and the second gate insulating layer 202b used as dielectrics. The oxide semiconductor layer 252 is stacked on and in contact with the capacitor electrode 231 and functions as one of electrodes of the storage capacitor. Note that the capacitor electrode 231 is formed using the same light-transmitting material in the same step as the source electrode layer and the drain electrode layer of the thin film transistor 220. Further, since the capacitor wiring layer 230 is formed using the same light-transmitting material in the same step as the gate electrode layer of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 6B, a pair of electrodes and the dielectrics have light-transmitting properties; thus, the storage capacitor as a whole has a light-transmitting property.

Each of the storage capacitors illustrated in FIGS. 6A and 6B has light-transmitting properties; thus, sufficient capacitance and high aperture ratio can be realized even when the size of a pixel is made small in order to realize higher resolution of display images by increasing the number of gate wirings, for example.

This embodiment can be freely combined with any of the other embodiments.

Embodiment 5

In this embodiment, an example where first heat treatment is different from that in Embodiment 1 is illustrated in FIGS. 7A to 7F and FIGS. 8A to 8C. Since FIGS. 7A to 7F and FIGS. 8A to 8C are the same as FIGS. 1A to 1F and FIGS. 2A to 2C except for part of steps, the same portions are denoted by the same reference numerals and detailed description of the same portions is omitted.

First, as described in Embodiment 1, a light-transmitting conductive film is formed over the substrate 400 having an insulating surface. Then, the gate electrode layers 401 and 451 are formed in a first photolithography step.

Next, a stack of the first gate insulating layer 402a and the second gate insulating layer 402b is formed over the gate electrode layers 401 and 451.

Then, the source electrode layer 455a and the drain electrode layer 455b are formed in a second photolithography step after a light-transmitting conductive film is formed over the second gate insulating layer 402b (see FIG. 7A). Note that FIG. 7A is the same as FIG. 1A.

Next, an oxide semiconductor film with a thickness of 2 to 200 nm is formed over the second gate insulating layer 402b, the source electrode layer 455a, and the drain electrode layer 455b. Note that the steps up to here are the same as the steps in Embodiment 1.

Next, the oxide semiconductor film is subjected to dehydration or dehydrogenation in an inert gas atmosphere or under reduced pressure. The temperature of the first heat treatment for dehydration or dehydrogenation is higher than or equal to 350° C. and lower than the strain point of the substrate, preferably higher than or equal to 400° C. and lower than the strain point of the substrate. Here, after the substrate is put in an electric furnace which is a kind of heat treatment apparatus and heat treatment is performed on the oxide semiconductor film in a nitrogen atmosphere, water and hydrogen are prevented from being mixed into the oxide semiconductor film by preventing the substrate from being exposed to the air. Thus, the oxide semiconductor film is changed into a low-resistant oxide semiconductor film, i.e., an n-type (e.g., an $n^-$-type or an $n^+$-type) oxide semiconductor film as an oxygen deficient oxide semiconductor film. After that, a high-purity oxygen gas, a high-purity $N_2O$ gas, or ultra-dry air (having a dew point of $-40°$ C. or lower, preferably $-60°$ C. or lower) is introduced into the same furnace and cooling is performed. It is preferable that water, hydrogen, and the like be not included in the oxygen gas or the $N_2O$ gas. For example, the purity of the oxygen gas or the $N_2O$ gas, which is introduced into the heat treatment apparatus, is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Further, after the first heat treatment for dehydration or dehydrogenation, heat treatment may be performed at 200 to 400° C., preferably 200 to 300° C. in an oxygen gas atmosphere, an $N_2O$ gas atmosphere, or an ultra-dry air (having a dew point of $-40°$ C. or lower, preferably $-60°$ C. or lower) atmosphere.

The entire oxide semiconductor layer is made to be in an oxygen excess state through the above steps; thus, the oxide semiconductor layer has higher resistance, that is, the oxide semiconductor layer becomes intrinsic.

Accordingly, the reliability of a thin film transistor which is to be formed later can be improved.

Then, the oxide semiconductor film is processed into island-shaped oxide semiconductor layers 457 and 458 in a photolithography step (see FIG. 7B).

Note that an example in which dehydration or dehydrogenation are performed after the formation of the oxide semiconductor film is described in this embodiment; however, this embodiment is not particularly limited to this. The first heat treatment of the oxide semiconductor layer can be performed on the oxide semiconductor film which has been processed into the island-shaped oxide semiconductor layers.

Alternatively, after dehydration or dehydrogenation are performed on the oxide semiconductor film in an inert gas atmosphere or under reduced pressure and cooling is performed in an inert gas atmosphere, the oxide semiconductor film may be processed into the island-shaped oxide semiconductor layers 457 and 458 in the photolithography step. Then, heat treatment may be performed at 200 to 400° C., preferably 200 to 300° C. in an oxygen gas atmosphere, an $N_2O$ gas atmosphere, or an ultra-dry air (having a dew point of $-40°$ C. or lower, preferably $-60°$ C. or lower) atmosphere.

Before the oxide semiconductor film is formed, heat treatment (at higher than or equal to 400° C. and lower than the strain point of the substrate) may be performed in an inert gas atmosphere (e.g., nitrogen, helium, neon, or argon), an oxygen atmosphere, an ultra-dry air (having a dew point of $-40°$ C. or lower, preferably $-60°$ C. or lower) atmosphere, or under reduced pressure so that impurities such as hydrogen and water, which are included in the gate insulating layer, are removed.

Next, the resist mask 436 is formed in a fourth photolithography step after a metal conductive film is formed over the second gate insulating layer 402b, and etching is selectively performed so that the metal electrode layer 435 is formed (see FIG. 7C).

Then, the resist mask 436 is removed, the resist mask 437 is formed in a fifth photolithography step, and etching is selectively performed so that the source electrode layer 405a and the drain electrode layer 405b are formed (see FIG. 7D). Note that in the fifth photolithography step, only part of the oxide semiconductor layer is etched so that an oxide semiconductor layer 459 having a groove (a depression portion) is formed.

Then, the resist mask 437 is removed, and the oxide insulating layer 407 serving as a protective insulating film is formed in contact with an upper surface and a side surface of the oxide semiconductor layer 458 and the groove (the depression portion) in the oxide semiconductor layer 459.

Next, second heat treatment (preferably at 200 to 400° C., for example, 250 to 350° C.) is performed in an inert gas atmosphere, an oxygen gas atmosphere, or an ultra-dry air (having a dew point of $-40°$ C. or lower, preferably $-60°$ C. or lower) atmosphere (see FIG. 7E). For example, the second heat treatment is performed at 250° C. for one hour in a nitrogen atmosphere.

Then, the protective insulating layer 408 is formed over the oxide insulating layer 407 (see FIG. 7F).

Next, the planarization insulating layer 409 is formed over the protective insulating layer 408.

Then, a resist mask is formed in a sixth photolithography step and a contact hole which reaches the drain electrode layer 455b is formed by etching of the planarization insulating layer 409, the protective insulating layer 408, and the oxide insulating layer 407.

Next, a light-transmitting conductive film is formed after the resist mask is removed.

Next, a resist mask is formed in a seventh photolithography step, and unnecessary portions are etched away so that the pixel electrode layer 456 and the conductive layer 406 are formed (see FIG. 8A).

Through the above steps, over the same substrate, a thin film transistor 471 and a thin film transistor 461 can be separately formed in a driver circuit and a pixel portion with the use of seven masks. Further, a storage capacitor which includes a capacitor wiring layer and a capacitor electrode with the first gate insulating layer 402a and the second gate insulating layer 402b used as dielectrics can be formed over the same substrate. The thin film transistors 461 and storage capacitors are arranged in matrix to correspond to individual pixels so that the pixel portion is formed and the driver circuit including the thin film transistor 471 is provided around the pixel portion. Thus, one of the substrates for manufacturing an active matrix display device can be obtained.

The conductive layer 406 is provided so as to overlap with a channel formation region in the oxide semiconductor layer 459, whereby in a bias-temperature stress test (a BT test) for examining the reliability of a thin film transistor, the amount of change in the threshold voltage of the thin film transistor 471 before and after the BT test can be reduced. Further, the potential of the conductive layer 406 may be the same as or different from that of the gate electrode layer 401. The conductive layer 406 can function also as a second gate electrode layer. Alternatively, the potential of the conductive layer 406 may be GND or 0 V, or the conductive layer 406 may be in a floating state.

FIG. 8B1 is a plan view of the channel-etched thin film transistor 471 provided in the driver circuit. FIG. 8A includes a cross-sectional view taken along line C1-C2 in FIG. 8B1. In addition, FIG. 8C includes a cross-sectional view taken along line C3-C4 in FIG. 8B1. FIG. 8B2 is a plan view of the bottom-contact thin film transistor 461 provided in a pixel. FIG. 8A includes a cross-sectional view taken along line D1-D2 in FIG. 8B2. In addition, FIG. 8C includes a cross-sectional view taken along line D3-D4 in FIG. 8B2

This embodiment can be freely combined with any of the other embodiments.

Embodiment 6

In this embodiment, an example where the number of steps and the number of photomasks are smaller than those in Embodiment 1 is illustrated in FIGS. 9A to 9E. Since FIGS. 9A to 9E are the same as FIGS. 1A to 1F and FIGS. 2A to 2C except for part of steps, the same portions are denoted by the same reference numerals and detailed description of the same portions is omitted.

First, as described in Embodiment 1, a light-transmitting conductive film is formed over the substrate 400 having an insulating surface. Then, the gate electrode layers 401 and 451 are formed in a first photolithography step.

Next, a stack of the first gate insulating layer 402a and the second gate insulating layer 402b is formed over the gate electrode layers 401 and 451.

Figure 9A:
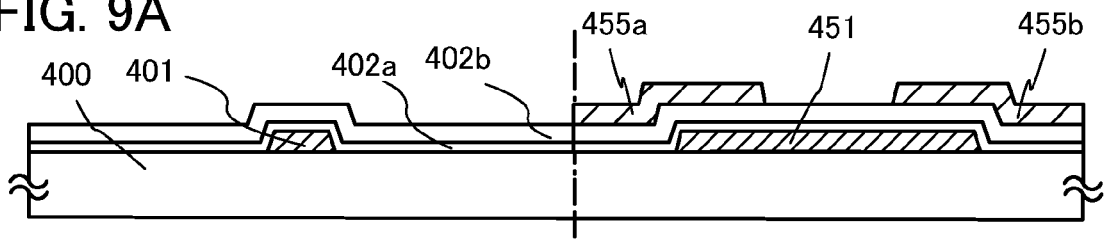
FIGS. 9A to 9E are cross-sectional views illustrating steps of one embodiment of the present invention.
Figure 9B:
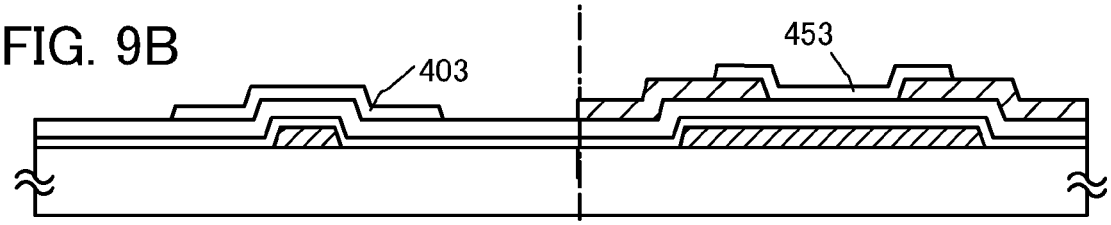

Then, the source electrode layer 455a and the drain electrode layer 455b are formed in a second photolithography step after a light-transmitting conductive film is formed over the second gate insulating layer 402b (see FIG. 9A). Note that FIG. 9A is the same as FIG. 1A.

Next, an oxide semiconductor film with a thickness of 2 to 200 nm is formed over the second gate insulating layer 402b, the source electrode layer 455a, and the drain electrode layer 455b. In this embodiment, the oxide semiconductor film is formed in an oxygen atmosphere, an argon atmosphere, or an atmosphere containing argon and oxygen under a condition that a target is an oxide semiconductor target containing In, Ga, and Zn (an In—Ga—Zn—O-based oxide semiconductor target ($In_2O_3:Ga_2O_3:ZnO=1:1:1$)) with a diameter of 8 inches, the distance between the substrate and the target is 170 mm, pressure is 0.4 Pa, and a direct current (DC) power source is 0.5 kW. Note that a pulse direct current (DC) power source is preferable because dust can be reduced and the film thickness can be uniform.

Next, the oxide semiconductor film is processed into an island-shaped oxide semiconductor layer in a third photolithography step.

Then, the oxide semiconductor layer is subjected to dehydration or dehydrogenation. The temperature of first heat treatment for dehydration or dehydrogenation is higher than or equal to 350° C. and lower than the strain point of the substrate, preferably higher than or equal to 400° C. lower than the strain point of the substrate. Here, after the substrate is put in an electric furnace which is a kind of heat treatment apparatus and heat treatment is performed on the oxide semiconductor layer in a nitrogen atmosphere, water and hydrogen are prevented from being mixed into the oxide semiconductor layer by preventing the substrate from being exposed to the air; thus, the oxide semiconductor layers 403 and 453 are obtained (see FIG. 9B). Note that the steps up to here are the same as the steps in Embodiment 1.

Figure 9C:
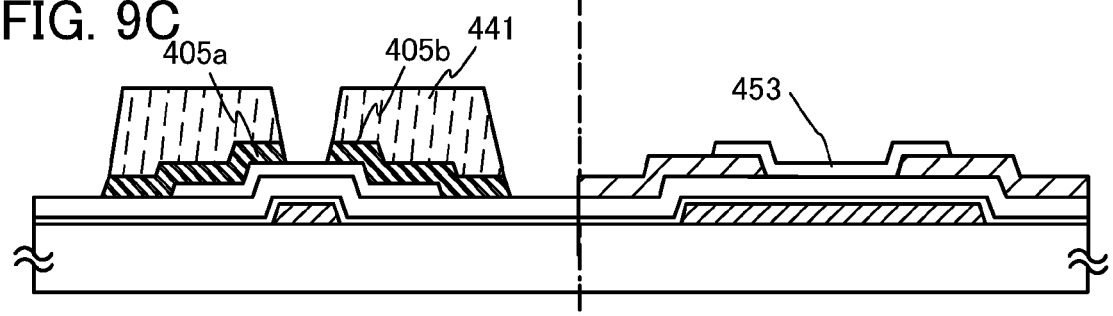

Next, a resist mask 441 is formed in a fourth photolithography step after a metal conductive film is formed over the second gate insulating layer 402b, and etching is selectively performed so that the source electrode layer 405a and the drain electrode layer 405b are formed (see FIG. 9C). When an alkaline etchant is used in order to perform etching selectively, the structure in FIG. 9C can be obtained. As the material of the metal conductive film, an element selected from Al, Cr, Cu, Ta, Ti, Mo, or W, an alloy containing any of these elements as a component, an alloy containing these elements in combination, or the like can be used. In this embodiment, a Ti film with a thickness of 50 to 400 nm formed by sputtering is used as the metal conductive film.

When the Ti film is used as the metal conductive film and an ammonia hydrogen peroxide mixture (hydrogen peroxide: ammonia:water=5:2:2) or the like is used as the alkaline etchant, the metal conductive film is selectively removed, so that the oxide semiconductor layer including an In—Ga—Zn—O-based oxide semiconductor can be left.

Figure 9D:
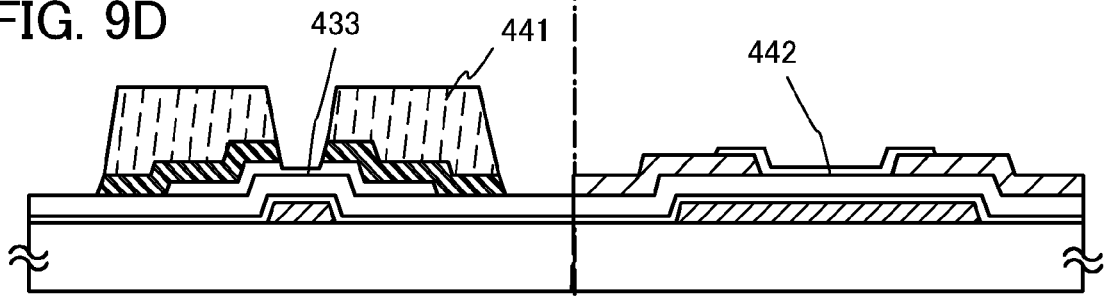

Then, part of the oxide semiconductor layer is thinned using the resist mask 441 so that the oxide semiconductor layer 433 having a groove (a depression portion) is formed (see FIG. 9D). In this etching, the thickness of the oxide semiconductor layer 453 is made smaller and a thinned oxide semiconductor layer 442 is obtained. Therefore, the thickness of a region of the oxide semiconductor layer 453 between the source electrode layer 405a and the drain electrode layer 405b is substantially the same as the thickness of the oxide semiconductor layer 442. Note that in the case where the thin film transistor functions as a switching element even if a groove (a depression portion) is not formed in the oxide semiconductor layer, this etching is not necessarily performed. In the case where the etching is not performed, needless to say, the thickness of the oxide semiconductor layer 453 is not made smaller and the thin film transistor 460 that is the same as Embodiment 1 is formed.

Then, the resist mask 441 is removed, and the oxide insulating layer 407 serving as a protective insulating film is formed in contact with an upper surface and a side surface of the oxide semiconductor layer 442 and the groove (the depression portion) in the oxide semiconductor layer 433.

Figure 9E:
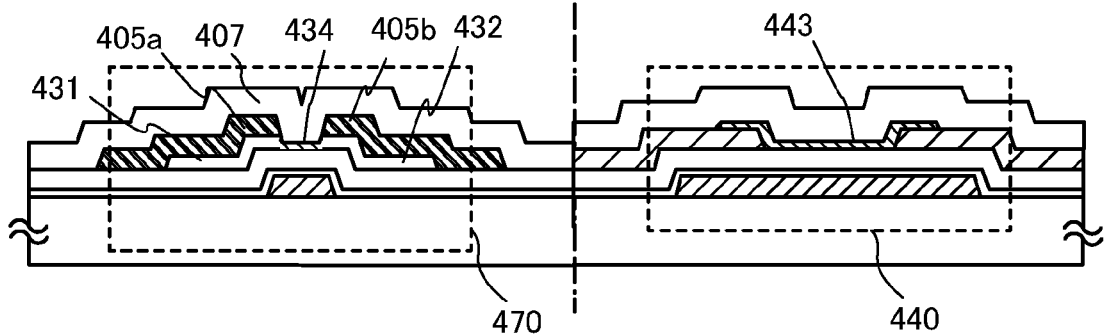

Next, second heat treatment (preferably at 200 to 400° C., for example, 250 to 350° C.) is performed in an inert gas atmosphere or an oxygen gas atmosphere (see FIG. 9E).

Through the above steps, heat treatment for dehydration or dehydrogenation is performed on the oxide semiconductor film after deposition to reduce the resistance, and then, part of the oxide semiconductor film is selectively made to be in an oxygen-excess state. Accordingly, the channel formation region 434 overlapping with the gate electrode layer 401 becomes intrinsic, and the first high-resistant drain region 431 which overlaps with the source electrode layer 405a and the second high-resistant drain region 432 which overlaps with the drain electrode layer 405b are formed in a self-aligning manner. Further, the entire channel formation region 443 overlapping with the gate electrode layer 451 becomes intrinsic.

Through the above steps, the thin film transistor 470 and a thin film transistor 440 are formed over the same substrate. In the case where the thickness of the oxide semiconductor layer 453 is the same as that of the oxide semiconductor layer 453 in Embodiment 1, the oxide semiconductor layer 442 of the thin film transistor 440 of this embodiment can be thinner than that of the thin film transistor 460 in Embodiment 1. In order to keep the amorphous state, the thickness of the oxide semiconductor layer is preferably 50 nm or less. In particular, in the channel-etched thin film transistor 470, it is preferable that the thickness of the channel formation region 433 after the etching step of FIG. 9D be 30 nm or less, which allows the thickness of the channel formation region 443 of the thin film transistor 440 to be 30 nm or less. More specifically, the thickness of the channel formation regions 443 and 434 of the formed thin film transistors 440 and 470 in FIG. 9E is adjusted to 5 to 20 nm.

In addition, the channel width of the formed thin film transistor is preferably 0.5 to 10 μm.

In the following steps, as in Embodiment 1, after the protective insulating layer 408 and the planarization insulating layer 409 are formed, a contact hole which reaches the drain electrode layer 455b, the pixel electrode layer 456, and the conductive layer 406 are formed.

Through the above steps, over the same substrate, the thin film transistor 470 and the thin film transistor 440 can be separately formed in a driver circuit and a pixel portion with the use of six masks. Without the increase in the number of steps, a variety of circuits can be formed by the formation of transistors with optimal structures over the same substrate.

This embodiment can be freely combined with any of the other embodiments.

Embodiment 7

A thin film transistor is formed, and a semiconductor device having a display function (also referred to as a display device) can be manufactured using the thin film transistor in a pixel portion and also in a driver circuit. Further, when part or whole of a driver circuit including a thin film transistor is formed over the substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Further, a display medium whose contrast is changed by electric action, such as electronic ink, can be used.

The display device includes a panel in which the display element is sealed, and a module in which an IC or the like including a controller is mounted on the panel. Further, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is formed, a state after the formation of a conductive film serving as a pixel electrode and before etching of the conductive film so that the pixel electrode is formed, or any other states.

Note that a display device in this specification refers to an image display device or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is one embodiment of a semiconductor device, is described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view taken along line M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a liquid crystal layer 4008 by the first substrate 4001, the sealant 4005, and the second substrate 4006. A signal line driver circuit 4003 which is formed using a single crystal semiconductor film or a polycrystalline semiconductor film over a substrate separately prepared is mounted in a region which is different from the region surrounded by the sealant 4005 over the first substrate 4001.

Note that there is no particular limitation to the connection method of the driver circuit which is separately formed, and a COG method, a wire bonding method, a TAB method, or the like can be used. FIG. 10A1 illustrates an example in which the signal line driver circuit 4003 is mounted by a COG method. FIG. 10A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 10B illustrates the thin film transistor 4010 included in the pixel portion 4002 and the thin film transistor 4011 included in the scan line driver circuit 4004. A protective insulating layer 4020 and an insulating layer 4021 are provided over the thin film transistors 4010 and 4011.

Any of the highly reliable thin film transistors including the oxide semiconductor layers, which are described in Embodiments 1 to 6, can be used as the thin film transistors 4010 and 4011. Any of the thin film transistors 470, 210, and 471 described in Embodiments 1 to 6 can be used as the thin film transistor 4011 for the driver circuit. Any of the thin film transistors 460, 220, and 461 can be used as the thin film transistor 4010 for a pixel. In this embodiment, the thin film transistors 4010 and 4011 are n-channel thin film transistors.

A conductive layer 4040 is provided over part of the insulating layer 4021 so as to overlap with a channel formation region of an oxide semiconductor layer in the thin film transistor 4011 for the driver circuit. The conductive layer 4040 is provided so as to overlap with the channel formation region of the oxide semiconductor layer, whereby the amount of change in the threshold voltage of the thin film transistor 4011 before and after BT test can be reduced. Further, a potential of the conductive layer 4040 may be the same as or different from that of a gate electrode layer of the thin film transistor 4011. The conductive layer 4040 can function also as a second gate electrode layer. Alternatively, the potential of the conductive layer 4040 may be GND or 0 V, or the conductive layer 4040 may be in a floating sate.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 which serve as alignment films, and the liquid crystal layer 4008 is sandwiched between the pixel electrode layer 4030 and the counter electrode layer 4031 with the insulating layers 4032 and 4033 therebetween.

Note that a light-transmitting substrate can be used as each of the first substrate 4001 and the second substrate 4006, and glass, ceramics, or plastics can be used. As plastics, a fiberglass-reinforced plastic (FRP) plate, a poly(vinyl fluoride) (PVF) film, a polyester film, or an acrylic resin film can be used.

A columnar spacer 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line formed over the same substrate as the thin film transistor 4010. The counter electrode layer 4031 and the common potential line can be electrically connected to each other through conductive particles provided between a pair of substrates with the use of a common connection portion. Note that the conductive particles are included in the sealant 4005.

Alternatively, a liquid crystal exhibiting a blue phase for which an alignment film is not used may be used. A blue phase is one of liquid crystal phases, which is generated just before a cholesteric phase changes into an isotropic phase while the temperature of a cholesteric liquid crystal is raised. Since the blue phase is generated within a relatively narrow range of temperature, a liquid crystal composition containing a chiral agent at 5 wt % or more is used for the liquid crystal layer 4008 in order to improve the temperature range. A liquid crystal composition including a liquid crystal exhibiting a blue phase and a chiral agent has a short response time of 1 msec or less and is optically isotropic; thus, alignment treatment is not necessary and viewing angle dependence is small.

Note that this embodiment can also be applied to a transflective liquid crystal display device in addition to a transmissive liquid crystal display device.

In an example of the liquid crystal display device, a polarizer is provided on an outer surface of the substrate (on the viewer side), and a coloring layer (a color filter) and an electrode layer used for a display element are sequentially provided on an inner surface of the substrate; however, the polarizer may be provided on the inner surface of the substrate. The layered structure of the polarizer and the coloring layer is not limited to that in this embodiment and may be set as appropriate depending on the materials of the polarizer and the coloring layer or conditions of the manufacturing process. Further, a light-blocking film serving as a black matrix may be provided except in a display portion.

In the thin film transistors 4010 and 4011, the protective insulating layer 4020 is formed in contact with the oxide semiconductor layer including the channel formation region. The protective insulating layer protective 4020 may be formed using a material and a method which are similar to those of the oxide insulating layer 407 described in Embodiment 1. Further, the insulating layer 4021 functioning as a planarization insulating film covers the thin film transistors in order to reduce surface unevenness of the thin film transistors. Here, as the protective insulating layer 4020, a silicon oxide film is formed by sputtering, as described in Embodiment 1.

A protective insulating layer is formed over the protective insulating layer 4020. The protective insulating layer may be formed using a material and a method which are similar to those of the protective insulating layer 408 described in Embodiment 1. Here, a silicon nitride film is formed by RF sputtering as the protective insulating layer.

The insulating layer 4021 may be formed using a material and a method which are similar to those of the planarization insulating layer 409 described in Embodiment 1, and an organic material having heat resistance, such as polyimide, an acrylic resin, a benzocyclobutene-based resin, polyamide, or an epoxy resin, can be used. Other than such an organic material, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation to the method of forming the insulating layer 4021. The insulating layer 4021 can be formed, depending on the material, by a method such as sputtering, an SOG method, a spin coating method, a dipping method, a spray coating method, a droplet discharge method (e.g., an inkjet method, screen printing, or offset printing), a roll coating method, a curtain coating method, or a knife coating method. A baking step of the insulating layer 4021 also serves as annealing of the oxide semiconductor layer, whereby a semiconductor device can be efficiently manufactured.

Each of the pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for each of the pixel electrode layer 4030 and the counter electrode layer 4031. The pixel electrode formed using the conductive composition preferably has a sheet resistance of lower than or equal to 10000 ohms per square and a transmittance of higher than or equal to 70% at a wavelength of 550 nm The sheet resistance is preferably lower. Further, the resistivity of the conductive high molecule included in the conductive composition is preferably lower than or equal to 0.1 Ω·cm.

As the conductive high molecule, a so-called π-electron conjugated conductive high molecule can be used. Examples are polyaniline and a derivative thereof, polypyrrole and a derivative thereof, polythiophene and a derivative thereof, a copolymer of two or more kinds of these conductive high molecules, and the like.

A variety of signals and potentials are supplied from an FPC 4018 to the signal line driver circuit 4003 which is separately formed, the scan line driver circuit 4004, or the pixel portion 4002.

A connection terminal electrode 4015 is formed using the same conductive film as the pixel electrode layer 4030 included in the liquid crystal element 4013. A terminal electrode 4016 is formed using the same conductive film as a source electrode layer and a drain electrode layer of the thin film transistors 4011.

The connection terminal electrode 4015 is electrically connected to a terminal of the FPC 4018 through an anisotropic conductive film 4019.

Note that FIGS. 10A1, 10A2, and 10B illustrate an example in which the signal line driver circuit 4003 is formed separately and mounted on the first substrate 4001; however, this embodiment is not limited to this structure. Part of the signal line driver circuit or part of the scan line driver circuit may be separately formed and mounted.

Figure 19:
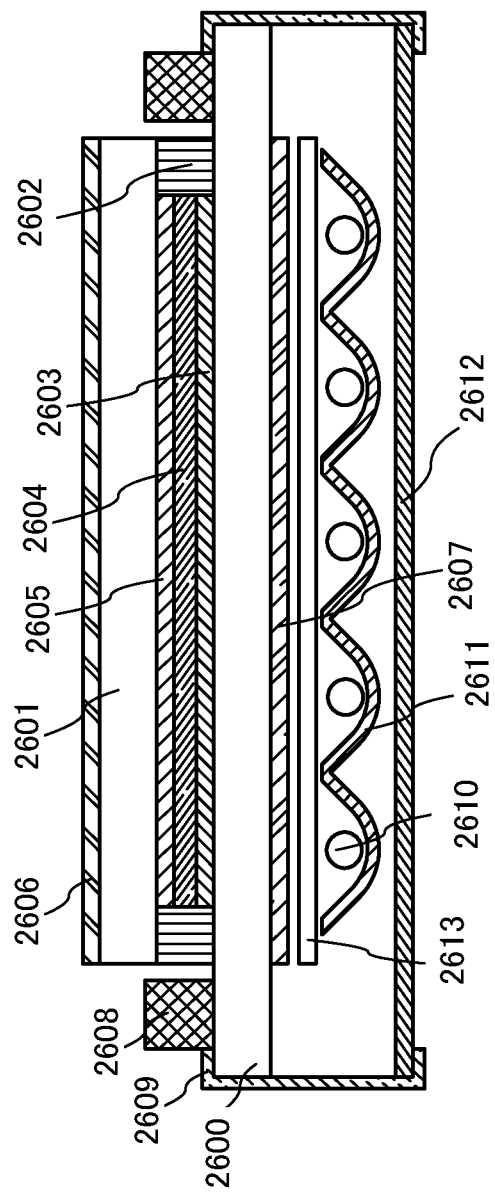
FIG. 19 illustrates a semiconductor device.

FIG. 19 illustrates an example of a liquid crystal display module which is formed as a semiconductor device by using a TFT substrate 2600 manufactured by the manufacturing method disclosed in this specification.

FIG. 19 illustrates an example of a liquid crystal display module, in which the TFT substrate 2600 and a counter substrate 2601 are fixed with a sealant 2602, and a pixel portion 2603 including a TFT and the like, a display element 2604 including a liquid crystal layer, and a coloring layer 2605 are provided between the TFT substrates 2600 and the counter substrate 2601 to form a display region. The coloring layer 2605 is necessary to perform color display. In an RGB system, coloring layers corresponding to colors of red, green, and blue are provided for pixels. Polarizers 2606 and 2607 and a diffusion plate 2613 are provided outside the TFT substrate 2600 and the counter substrate 2601. A light source includes a cold cathode fluorescent lamp 2610 and a reflector 2611. A circuit board 2612 is connected to a wiring circuit portion 2608 of the TFT substrate 2600 by a flexible wiring board 2609 and includes an external circuit such as a control circuit or a power source circuit. The polarizer and the liquid crystal layer may be stacked with a retardation plate therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above steps, a highly reliable liquid crystal display panel can be manufactured as a semiconductor device.

This embodiment can be combined with any of the structures described in the other embodiments as appropriate.

Embodiment 8

In this embodiment, an example of electronic paper is described as one embodiment of a semiconductor device.

The semiconductor device may be used for electronic paper in which electronic ink is driven by an element which is electrically connected to a switching element. Electronic paper is also referred to as an electrophoretic display device (an electrophoretic display) and has advantages of the same level of readability as plain paper, lower power consumption than other display devices, and reduction in thickness and weight.

Electrophoretic displays can have various modes. Electrophoretic displays contain a plurality of microcapsules dispersed in a solvent or a solute, each of which contains first particles which are positively charged and second particles which are negatively charged. By applying an electric field to the microcapsules, the particles in the microcapsules move in opposite directions and only the color of the particles gathering on one side is displayed. Note that the first particles and the second particles contain pigments and do not move without an electric field. Further, the first particles and the second particles have different colors (which may be colorless).

In this manner, an electrophoretic display utilizes a so-called dielectrophoretic effect by which a substance having a high dielectric constant moves to a high-electric field region. Note that the electrophoretic display does not need a polarizer which is needed in a liquid crystal display device.

A solution in which the above microcapsules are dispersed in a solvent is referred to as electronic ink. This electronic ink can be printed on a surface of glass, plastics, cloth, paper, or the like. Further, color display can be realized with a color filter or particles including pigments.

When a plurality of the above microcapsules are arranged as appropriate over an active matrix substrate so as to be sandwiched between two electrodes, an active matrix display device is completed, and display can be performed by application of an electric field to the microcapsules. For example, the active matrix substrate including the thin film transistor in any of Embodiments 1 to 6 can be used.

Note that each of the first particles and the second particles in the microcapsules may be formed using one of a conductive material, an insulating material, a semiconductor material, a magnetic material, a liquid crystal material, a ferroelectric material, an electroluminescent material, an electrochromic material, and a magnetophoretic material, or a composite material of any of these materials.

Figure 18:
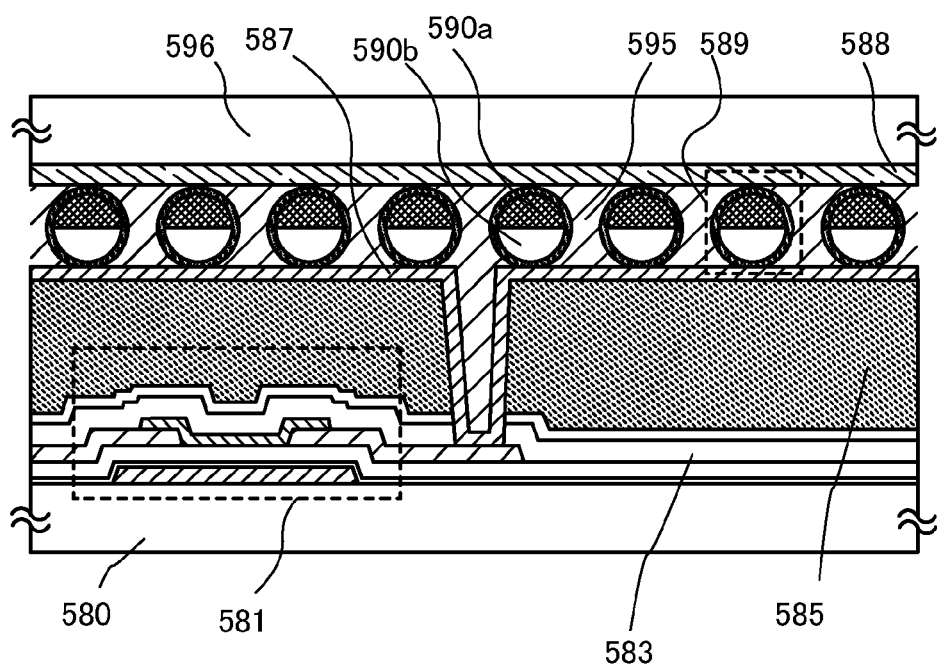
FIG. 18 illustrates a semiconductor device.

FIG. 18 illustrates active matrix electronic paper as an example of a semiconductor device. A thin film transistor 581 used in the semiconductor device can be formed in a manner which is similar to that of the thin film transistor described in Embodiment 1 and is a highly reliable thin film transistor including an oxide semiconductor layer. Further, any of the thin film transistors described in Embodiments 2 to 6 can be used as the thin film transistor 581 in this embodiment.

The electronic paper in FIG. 18 is an example of a display device using a twisting ball display system. The twisting ball display system refers to a method in which spherical particles each colored in black and white are provided between a first electrode layer and a second electrode layer which are electrode layers used for a display element, and a potential difference is generated between the first electrode layer and the second electrode layer in order to control the orientation of the spherical particles, so that display is performed.

The thin film transistor 581 formed over a substrate 580 is a bottom-gate thin film transistor and is covered with an insulating film 583 which is in contact with the oxide semiconductor layer. A source electrode layer or a drain electrode layer of the thin film transistor 581 which is sealed between the substrate 580 and a substrate 596 is in contact with a first electrode layer 587 through an opening formed in the insulating film 583 and an insulating layer 585, whereby the thin film transistor 581 is electrically connected to the first electrode layer 587. Spherical particles 589 are provided between the first electrode layer 587 and a second electrode layer 588 formed on the substrate 596. Each of the spherical particles 589 includes a black region 590a and a white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 and the common potential line can be electrically connected to each other through conductive particles provided between the substrates 580 and 596.

It is possible to use an electrophoretic element instead of the element using the twisting ball. A microcapsule having a diameter of approximately 10 to 200 μm, in which transparent liquid, positively charged white microparticles, and negatively charged black microparticles are encapsulated, is used. In the microcapsule provided between a first electrode layer and a second electrode layer, when an electric field is applied by the first electrode layer and the second electrode layer, the white microparticles and the black microparticles move in opposite directions, so that white or black can be displayed. A display element utilizing this principle is an electrophoretic display element, and a device including an electrophoretic display element is called an electronic paper in general. The electrophoretic display element has higher reflectance than a liquid crystal display element; thus, an auxiliary light is unnecessary, power consumption is low, and a display portion can be recognized even in a dim environment. In addition, even when power is not supplied to the display portion, an image which has been displayed once can be held. Thus, a displayed image can be held even if a semiconductor device having a display function (which may be referred to simply as a display device or a semiconductor device including a display device) is disconnected from a power supply.

Through the above steps, highly reliable electronic paper can be manufactured as a semiconductor device.

This embodiment can be combined with any of the structures described in the other embodiments as appropriate.

Embodiment 9

A structure of a light-emitting display device is described as a semiconductor device. Here, a light-emitting element utilizing electroluminescence is described as a display element included in a display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. These carriers (electrons and holes) are recombined, so that the light-emitting organic compound is excited. The light-emitting organic compound emits light in returning to a ground state from the excited state. Due to such a mechanism, such a light-emitting element is referred to as a current-excitation light-emitting element.

Inorganic EL elements are classified according to their element structures into dispersion-type inorganic EL elements and thin-film inorganic EL elements. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is interposed between dielectric layers, which are further interposed between electrodes, and its light emission mechanism is localized type light emission which utilizes inner-shell electron transition of metal ions. Note that here, an organic EL element is used as a light-emitting element.

Figure 12:
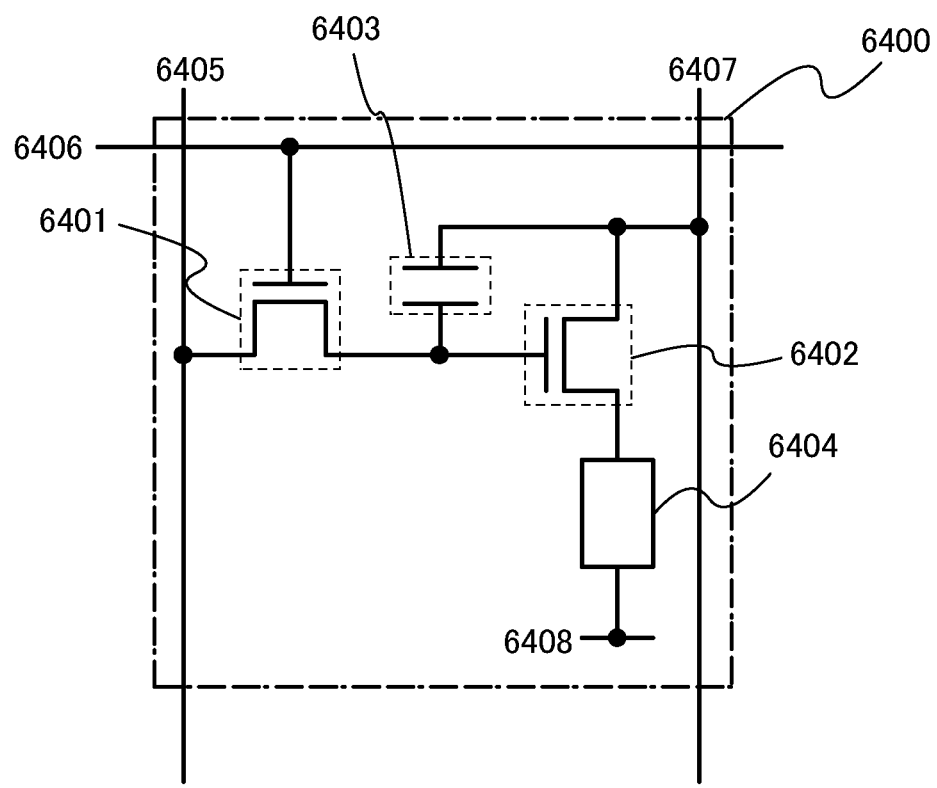
FIG. 12 illustrates an equivalent circuit of a pixel in a semiconductor device.

FIG. 12 illustrates an example of a pixel structure to which digital time ratio grayscale driving can be applied, as an example of a semiconductor device.

A structure and operation of a pixel to which digital time ratio grayscale driving can be applied are described. Here, one pixel includes two n-channel transistors each having an oxide semiconductor layer as a channel formation region.

A pixel 6400 includes a switching transistor 6401, a transistor 6402 for driving a light-emitting element (hereinafter referred to as the driving transistor 6402), a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line formed over the same substrate.

Note that the second electrode (the common electrode 6408) of the light-emitting element 6404 is set to a low power supply potential. Note that the low power supply potential is a potential satisfying a relationship, the low power supply potential<a high power supply potential, with reference to the high power supply potential which is set to the power supply line 6407. As the low power supply potential, GND, 0 V, or the like may be employed, for example. A potential difference between the high power supply potential and the low power supply potential is applied to the light-emitting element 6404 and current flows to the light-emitting element 6404, so that the light-emitting element 6404 emits light. Here, in order to make the light-emitting element 6404 emit light, each potential is set so that the potential difference between the high power supply potential and the low power supply potential is higher than or equal to the forward threshold voltage of the light-emitting element 6404.

Note gate capacitance of the driving transistor 6402 may be used as a substitute for the capacitor 6403, so that the capacitor 6403 can be eliminated. The gate capacitance of the driving transistor 6402 may be formed with a channel region and the gate electrode.

Here, in the case of a voltage-input voltage driving method, a video signal is input to the gate of the driving transistor 6402 so that the driving transistor 6402 is sufficiently turned on or turned off. That is, the driving transistor 6402 operates in a linear region. Since the driving transistor 6402 operates in the linear region, voltage which is higher than the voltage of the power supply line 6407 is applied to the gate of the driving transistor 6402. Note that voltage which is higher than or equal to (voltage of the power supply line+$V_{th}$ of the driving transistor 6402) is applied to the signal line 6405.

In the case of employing an analog grayscale method instead of the digital time ratio grayscale method, the same pixel structure as in FIG. 12 can be used by changing signal input.

In the case of performing analog grayscale driving, voltage which is higher than or equal to voltage which is the sum of the forward voltage of the light-emitting element 6404 and $V_{th}$ of the driving transistor 6402 is applied to the gate of the driving transistor 6402. The forward voltage of the light-emitting element 6404 refers to voltage at which desired luminance is obtained and is larger than at least forward threshold voltage. Note that a video signal by which the driving transistor 6402 operates in a saturation region is input, so that current can flow to the light-emitting element 6404. In order to operate the driving transistor 6402 in the saturation region, a potential of the power supply line 6407 is set higher than a gate potential of the driving transistor 6402. When an analog video signal is used as a video signal, current corresponding to the video signal can flow to the light-emitting element 6404, and the analog grayscale driving can be performed.

Note that the pixel structure is not limited to the pixel structure illustrated in FIG. 12. For example, the pixel illustrated in FIG. 12 may further include a switch, a resistor, a capacitor, a transistor, a logic circuit, or the like.

Next, structures of a light-emitting element are described with reference to FIGS. 13A to 13C. Here, cross-sectional structures of pixels are described using n-channel TFTs for driving light-emitting elements as an example. TFTs 7001, 7011, and 7021 serving as TFTs for driving light-emitting elements used in semiconductor devices in FIGS. 13A to 13C can be formed in a manner which is similar to that of the thin film transistor provided in the pixel described in Embodiment 1 and are highly reliable thin film transistors each including an oxide semiconductor layer. Alternatively, any of the thin film transistors provided in the pixels described in Embodiments 2 to 6 can be used as the TFTs 7001, 7011, and 7021.

In order to extract light emitted from the light-emitting element, at least one of an anode and a cathode may be transparent. A thin film transistor and a light-emitting element are formed over a substrate. The light-emitting element can have a top emission structure in which light is extracted through a surface which is opposite to the substrate; a bottom emission structure in which light is extracted through a surface on the substrate side; or a dual emission structure in which light is extracted through a surface which is opposite to the substrate and a surface on the substrate side. The pixel structure can be applied to a light-emitting element having any of these emission structures.

A light-emitting element having a top emission structure is described with reference to FIG. 13A.

Figure 13A:
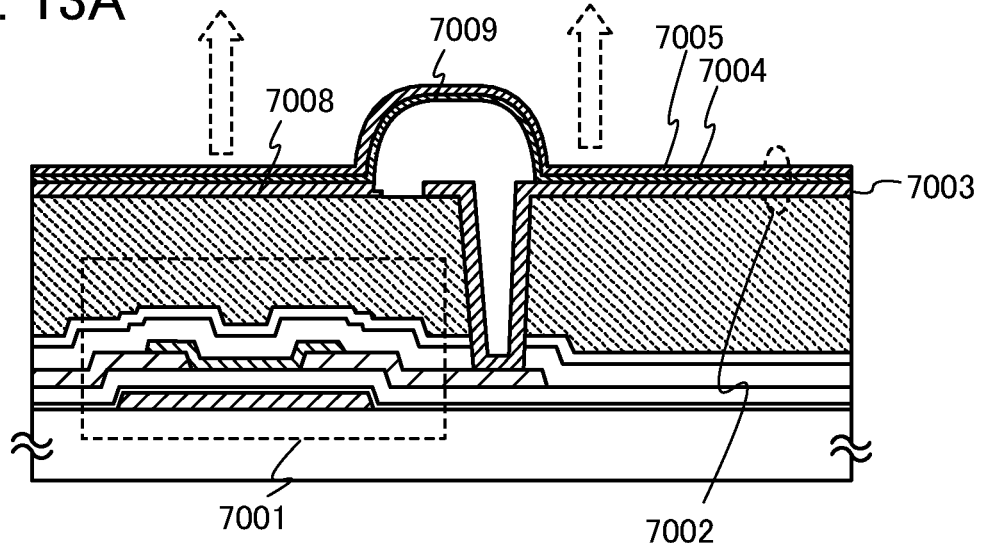
FIGS. 13A to 13C each illustrate a semiconductor device.

FIG. 13A is a cross-sectional view of a pixel when the driving TFT 7001 provided in the pixel is an n-channel TFT and light is emitted from a light-emitting element 7002 to an anode 7005 side. In FIG. 13A, a cathode 7003 of the light-emitting element 7002 and the driving TFT 7001 provided in the pixel are electrically connected to each other, and a light-emitting layer 7004 and the anode 7005 are stacked in that order over the cathode 7003. The cathode 7003 can be formed using a variety of conductive materials as long as they have low work functions and reflect light. For example, Ca, Al, MgAg, AlLi, or the like is preferably used. The light-emitting layer 7004 may be formed using either a single layer or a plurality of layers stacked. In the case where the light-emitting layer 7004 is formed using a plurality of layers, the light-emitting layer 7004 is formed by stacking an electron injection layer, an electron transport layer, a light-emitting layer, a hole transport layer, and a hole injection layer in that order over the cathode 7003. Note that it is not necessary to provide all these layers. The anode 7005 is formed using a light-transmitting conductive material such as a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

A partition 7009 is provided between the cathode 7003 and a cathode 7008 in an adjacent pixel so as to cover end portions of the cathodes 7003 and 7008. The partition 7009 is formed using an organic resin film of polyimide, an acrylic resin, polyamide, an epoxy resin, or the like; an inorganic insulating film; or a polysiloxane. It is particularly preferable that the partition 7009 be formed using a photosensitive resin material so that a sidewall of the partition 7009 is formed as an inclined surface with continuous curvature. When a photosensitive resin material is used for the partition 7009, a step of forming a resist mask can be omitted.

The light-emitting element 7002 corresponds to a region where the light-emitting layer 7004 is interposed between the cathode 7003 and the anode 7005. In the case of the pixel illustrated in FIG. 13A, light is emitted from the light-emitting element 7002 to the anode 7005 side, as indicated by arrows.

Next, a light-emitting element having a bottom emission structure is described with reference to FIG. 13B. FIG. 13B is a cross-sectional view of a pixel when the TFT 7011 for driving a light-emitting element (also referred to as the driving TFT 7011) is an n-channel TFT and light is emitted from a light-emitting element 7012 to a cathode 7013 side. In FIG. 13B, the cathode 7013 of the light-emitting element 7012 is formed over a light-transmitting conductive film 7017 which is electrically connected to the driving TFT 7011, and a light-emitting layer 7014 and an anode 7015 are stacked in that order over the cathode 7013. Note that a light-blocking film 7016 for reflecting or blocking light may be formed so as to cover the anode 7015 in the case where the anode 7015 has a light-transmitting property. As in FIG. 13A, the cathode 7013 can be formed using a variety of conductive materials as long as they have low work functions. Note that the cathode 7013 is formed to a thickness that can transmit light (preferably, approximately 5 to 30 nm). For example, a 20-nm-thick aluminum film can be used as the cathode 7013. As in FIG. 13A, the light-emitting layer 7014 may be formed using either a single layer or a plurality of layers stacked. The anode 7015 does not need to transmit light, but can be formed using a light-transmitting conductive material, as in FIG. 13A. For the light-blocking film 7016, metal or the like which reflects light can be used, for example; however, the light-blocking film 7016 is not limited to a metal film. For example, a resin to which a black pigment is added or the like can be used.

The light-emitting element 7012 corresponds to a region where the light-emitting layer 7014 is interposed between the cathode 7013 and the anode 7015. In the case of the pixel illustrated in FIG. 13B, light is emitted from the light-emitting element 7012 to the cathode 7013 side, as indicated by arrows.

Further, a partition 7019 is provided between the conductive film 7017 and a conductive film 7018 in an adjacent pixel so as to cover end portions of the conductive films 7017 and 7018. The partition 7019 is formed using an organic resin film of polyimide, an acrylic resin, polyamide, an epoxy resin, or the like; an inorganic insulating film; or a polysiloxane. It is particularly preferable that the partition 7019 be formed using a photosensitive resin material so that a sidewall of the partition 7019 is formed as an inclined surface with continuous curvature. When a photosensitive resin material is used for the partition 7019, a step of forming a resist mask can be omitted.

Next, a light-emitting element having a dual emission structure is described with reference to FIG. 13C. In FIG. 13C, a cathode 7023 of a light-emitting element 7022 is formed over a light-transmitting conductive film 7027 which is electrically connected to the TFT 7021 for driving a light-emitting element, and a light-emitting layer 7024 and an anode 7025 are stacked in that order over the cathode 7023. As in FIG. 13A, the cathode 7023 can be formed using a variety of conductive materials as long as they have low work functions. Note that the cathode 7023 is formed to a thickness that can transmit light. For example, 20-nm-thick Al can be used for the cathode 7023. As in FIG. 13A, the light-emitting layer 7024 may be formed using either a single layer or a plurality of layers stacked. The anode 7025 can be formed using a light-transmitting conductive material, as in FIG. 13A.

Further, a partition 7029 is provided between the conductive film 7027 and a conductive film 7028 in an adjacent pixel so as to cover end portions of the conductive films 7027 and 7028. The partition 7029 is formed using an organic resin film of polyimide, an acrylic resin, polyamide, an epoxy resin, or the like; an inorganic insulating film; or a polysiloxane. It is particularly preferable that the partition 7029 be formed using a photosensitive resin material so that a sidewall of the partition 7029 is formed as an inclined surface with continuous curvature. When a photosensitive resin material is used for the partition 7029, a step of forming a resist mask can be omitted.

The light-emitting element 7022 corresponds to a portion where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side, as indicated by arrows.

Note that although the organic EL elements are described here as the light-emitting elements, an inorganic EL element can be provided as a light-emitting element.

Note that an example is described in which a thin film transistor (a TFT for driving a light-emitting element) which controls driving of the light-emitting element is electrically connected to the light-emitting element; however, a structure may be employed in which a TFT for controlling current is connected between the driving TFT and the light-emitting element.

Figure 13B:
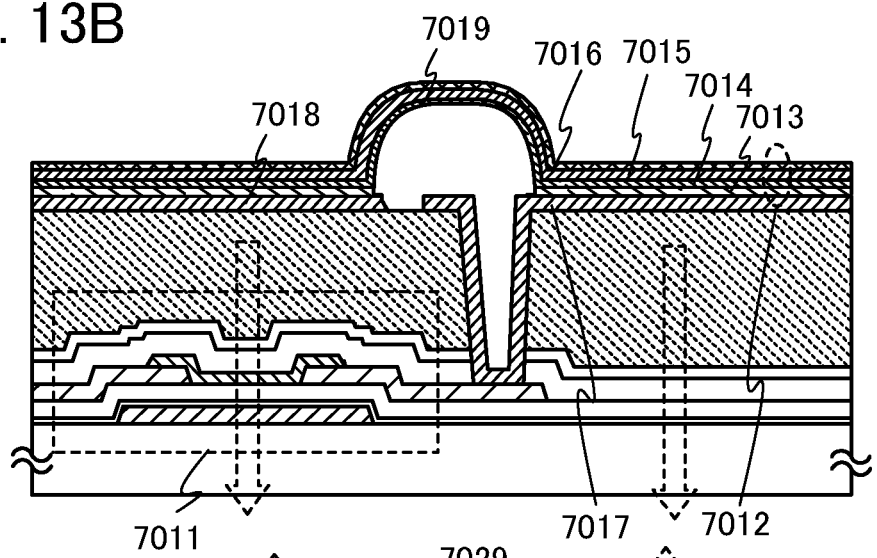
Figure 13C:
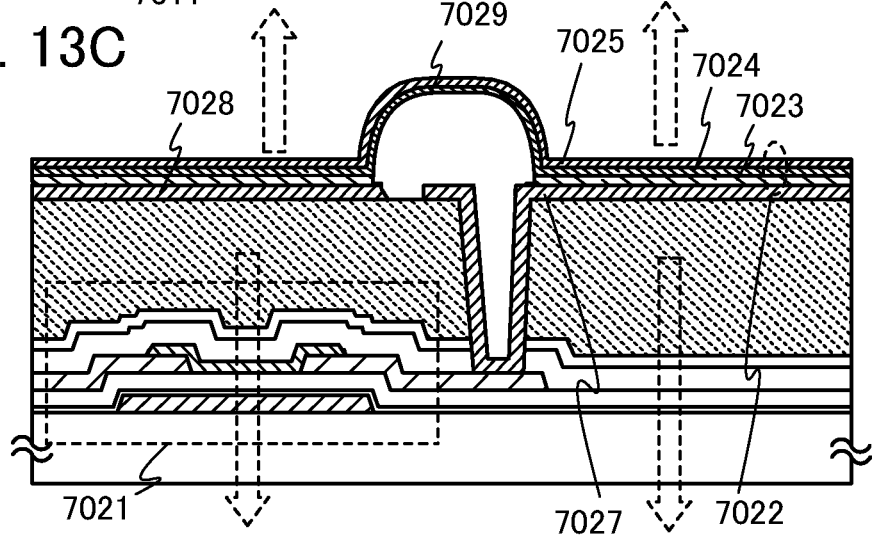

Note that the structure of a semiconductor device is not limited to the structures illustrated in FIGS. 13A to 13C and can be modified in various ways on the basis of the spirit of techniques disclosed in this specification.

Figure 11A:
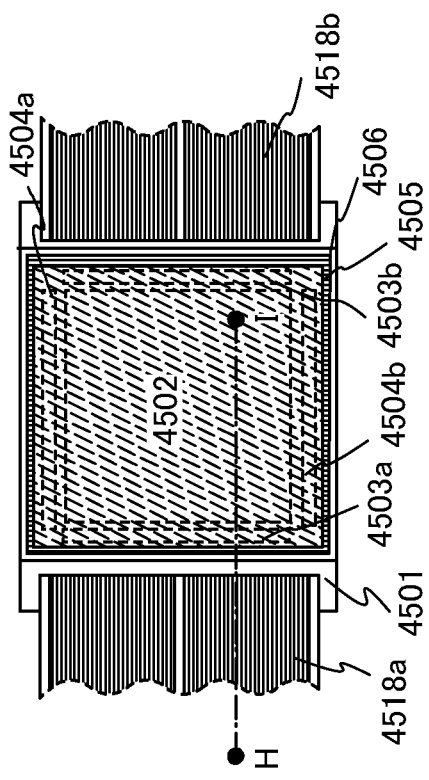
FIGS. 11A and 11B illustrate a semiconductor device.
Figure 11B:
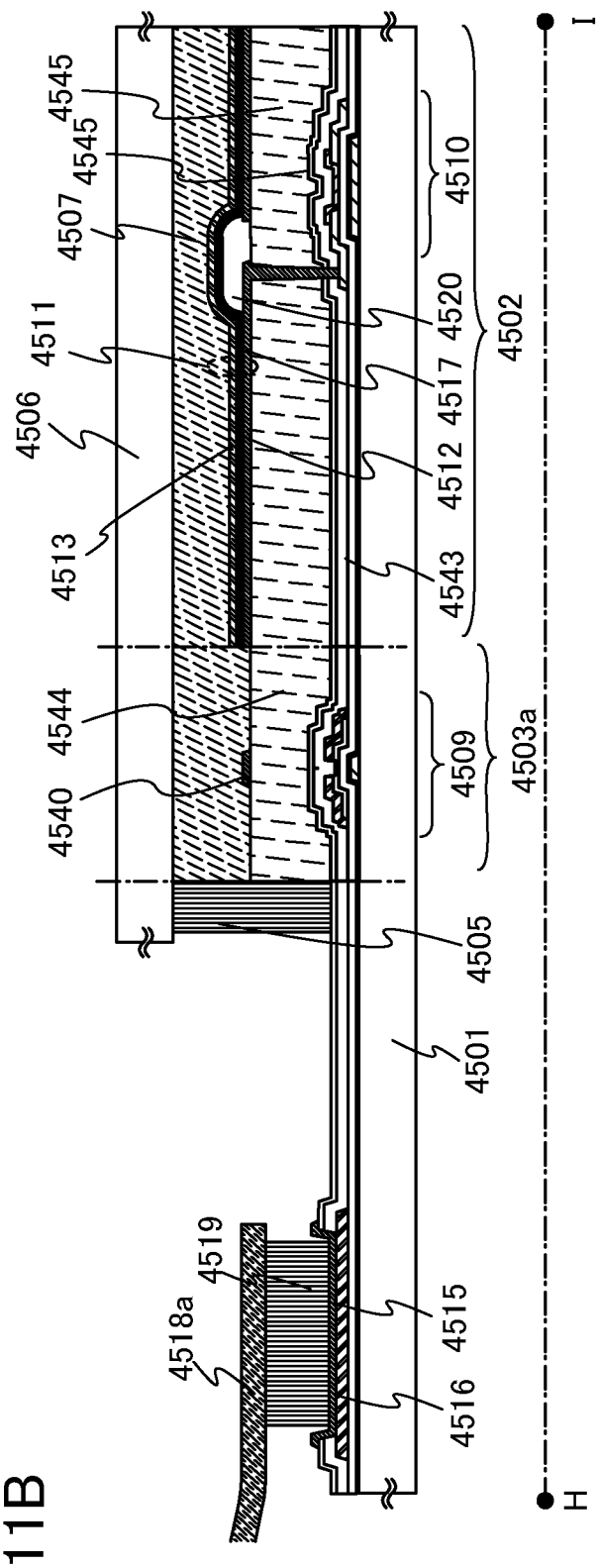

Next, the appearance and a cross section of a light-emitting display panel (also referred to as a light-emitting panel), which is one embodiment of a semiconductor device, are described with reference to FIGS. 11A and 11B. FIG. 11A is a plan view of a panel in which a thin film transistor and a light-emitting element which are formed over a first substrate are sealed between the first substrate and a second substrate with a sealant. FIG. 11B is a cross-sectional view taken along line H-I in FIG. 11A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Thus, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. It is preferable that the panel be packaged (sealed) with a protective film (e.g., an attachment film or an ultraviolet curable resin film) or a cover material, which has high air-tightness and causes less degasification so that the panel is not exposed to the external air, in this manner.

Further, the pixel portion 4502, the signal line driver circuits 4503a and 4503b, and the scan line driver circuits 4504a and 4504b which are provided over the first substrate 4501 each include a plurality of thin film transistors, and a thin film transistor 4510 included in the pixel portion 4502 and a thin film transistor 4509 included in the signal line driver circuit 4503a are illustrated in FIG. 11B.

Any of the highly reliable thin film transistors including the oxide semiconductor layers, which are described in Embodiments 1 to 6, can be used as the thin film transistors 4509 and 4510. Any of the thin film transistors 470, 210, 240, and 471 described in Embodiments 1 to 5 can be used as the thin film transistor 4509 provided in the driver circuit. Any of the thin film transistors 460, 220, and 461 can be used as the thin film transistor 4510 provided in a pixel. In this embodiment, the thin film transistors 4509 and 4510 are n-channel thin film transistors.

A conductive layer 4540 is provided over part of an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change in the threshold voltage of the thin film transistor 4509 before and after BT test can be reduced. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

In the thin film transistors 4509 and 4510, an insulating layer 4543 is formed in contact with the semiconductor layer including the channel formation region, as a protective insulating film. The insulating layer 4543 may be formed using a material and a method which are similar to those of the oxide insulating layer 407 described in Embodiment 1. Further, an insulating layer 4545 functioning as a planarization insulating film covers the thin film transistors in order to reduce surface unevenness of the thin film transistors. Here, as the insulating layer 4545, a silicon oxide film is formed by sputtering, as described in Embodiment 1.

A protective insulating layer 4547 is formed over the insulating layer 4543. The protective insulating layer 4547 may be formed using a material and a method which are similar to those of the protective insulating layer 408 described in Embodiment 1. Here, a silicon nitride film is formed by RF sputtering as the protective insulating layer 4547.

The insulating layer 4545 may be formed using a material and a method which are similar to those of the planarization insulating layer 409 described in Embodiment 1. Here, an acrylic resin is used for the insulating layer 4545.

Further, reference numeral 4511 denotes a light-emitting element. A first electrode layer 4517 which is a pixel electrode of the light-emitting element 4511 is electrically connected to a source electrode layer or a drain electrode layer of the thin film transistor 4510. Note that although the light-emitting element 4511 has a layered structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

A partition 4520 is formed using an organic resin film, an inorganic insulating film, or a polysiloxane. It is particularly preferable that the partition 4520 be formed using a photosensitive material and an opening portion be formed over the first electrode layer 4517 so that a sidewall of the opening portion is formed as an inclined surface with continuous curvature.

The electroluminescent layer 4512 may be formed using either a single layer or a plurality of layers stacked.

A protective film may be formed over the second electrode layer 4513 and the partition 4520 in order to prevent oxygen, hydrogen, water, carbon dioxide, or the like from entering the light-emitting element 4511. As the protective film, a silicon nitride film, a silicon nitride oxide film, a DLC film, or the like can be formed.

A variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 may be formed using the same conductive film as the first electrode layer 4517 of the light-emitting element 4511, and a terminal electrode 4516 is formed using the same conductive film as a source electrode layer and a drain electrode layer of the thin film transistor 4509.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In this case, a light-transmitting material such as a glass plate, a plastic plate, a polyester film, or an acrylic film is used.

Further, in addition to an inert gas such as nitrogen or argon, an ultraviolet curable resin or a thermosetting resin can be used as the filler 4507. PVC (poly(vinyl chloride)), an acrylic resin, polyimide, an epoxy resin, a silicone resin, PVB (poly(vinyl butyral)), or EVA (a copolymer of ethylene with vinyl acetate) can be used. For example, nitrogen may be used for the filler.

In addition, if needed, an optical film such as a polarizer, a circular polarizer (including an elliptical polarizer), a retardation plate (a quarter-wave plate or a half-wave plate), or a color filter may be provided as appropriate on a light-emitting surface of the light-emitting element. Further, the polarizer or the circular polarizer may be provided with an anti-reflection film. For example, anti-glare treatment can be performed by which reflected light can be diffused by projections and depressions on a surface so that glare can be reduced.

Note that only the signal line driver circuits 4503a and 4503b or part thereof, or only the scan line driver circuits 4504a and 4504b or part thereof may be separately formed and mounted. This embodiment is not limited to the structure illustrated in FIGS. 11A and 11B.

Through the above steps, a highly reliable light-emitting display device (display panel) can be manufactured as a semiconductor device.

This embodiment can be combined with any of the structures described in the other embodiments as appropriate.

Embodiment 10

In this embodiment, an example in which at least some of driver circuits and a thin film transistor provided in a pixel portion are formed over the same substrate is described below.

The thin film transistor provided in the pixel portion is formed as described in Embodiment 1, 5, or 6. Since the thin film transistors described in Embodiments 1 to 6 are n-channel TFTs, some of driver circuits which can be formed using n-channel TFTs among the driver circuits are formed over the same substrate as the thin film transistor in the pixel portion.

Figure 14A:
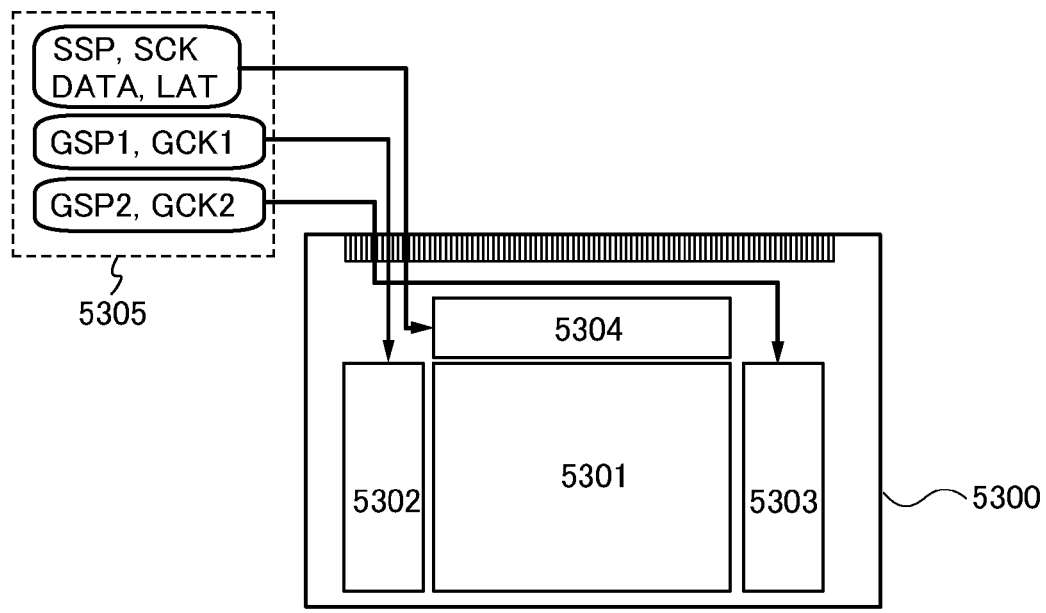
FIGS. 14A and 14B illustrate block diagrams of a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are provided and a plurality of scan lines extended from the first scan line driver circuit 5302 and the second scan line driver circuit 5303 are provided. Note that pixels each including a display element are arranged in matrix in regions where the scan lines and the signal lines intersect with each other. Further, the substrate 5300 in the display device is connected to a timing control circuit 5305 (also referred to as a controller or a control IC) through a connection portion such as an FPC (flexible printed circuit).

In FIG. 14A, the first scan line driver circuit 5302, the second scan line driver circuit 5303, and the signal line driver circuit 5304 are formed over the same substrate 5300 as the pixel portion 5301. Thus, the number of components of a driver circuit and the like which are provided outside is reduced, so that cost can be reduced. Further, when wirings are extended from the driver circuit provided outside the substrate 5300, the number of connections in the connection portion can be reduced, and reliability and yield can be improved.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Further, the timing control circuit 5305 supplies, for example, a second scan line driver circuit start signal (GSP2) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals with shifted phases or may be supplied together with a signal (CKB) obtained by inversion of the clock signal. It is possible to eliminate one of the first scan line driver circuit 5302 and the second scan line driver circuit 5303.

Figure 14B:
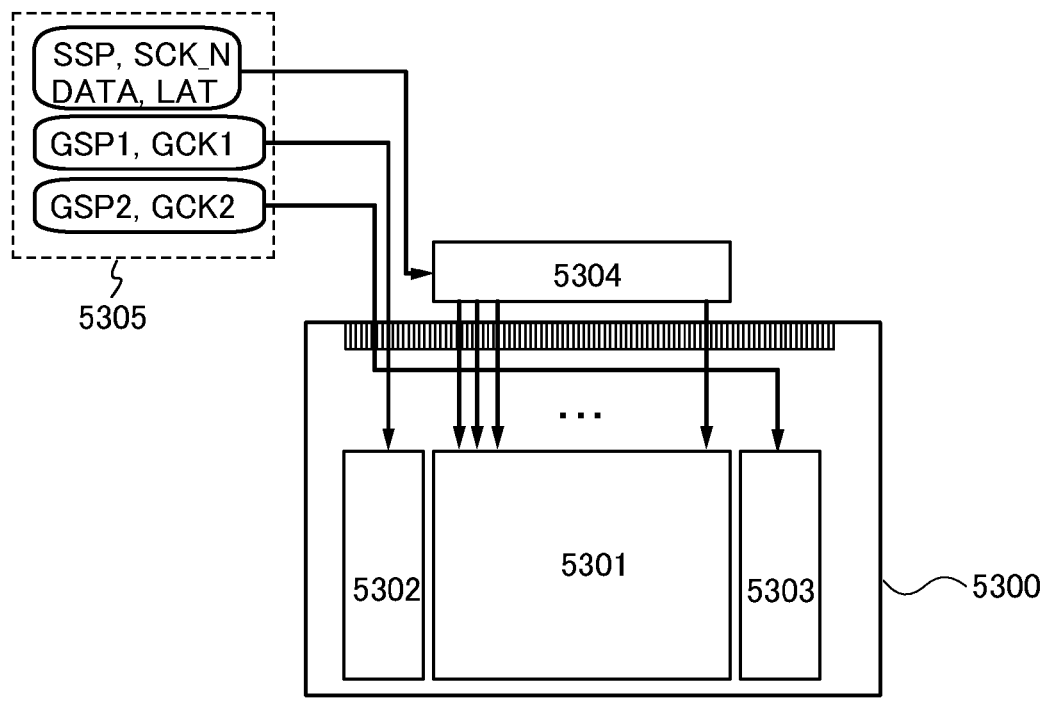

FIG. 14B illustrates a structure in which the first scan line driver circuit 5302 and the second scan line driver circuit 5303 are formed over the same substrate 5300 as the pixel portion 5301, and the signal line driver circuit 5304 is formed over a substrate which is different from the substrate 5300 where the pixel portion 5301 is formed.

Figure 15A:
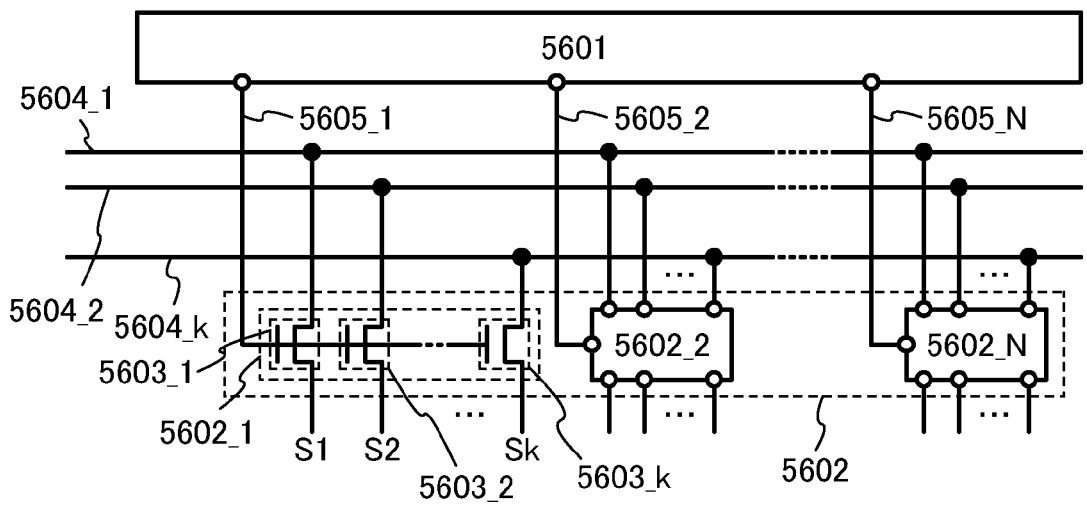
FIGS. 15A and 15B are a circuit diagram and a timing chart of a signal line driver circuit.
Figure 15B:
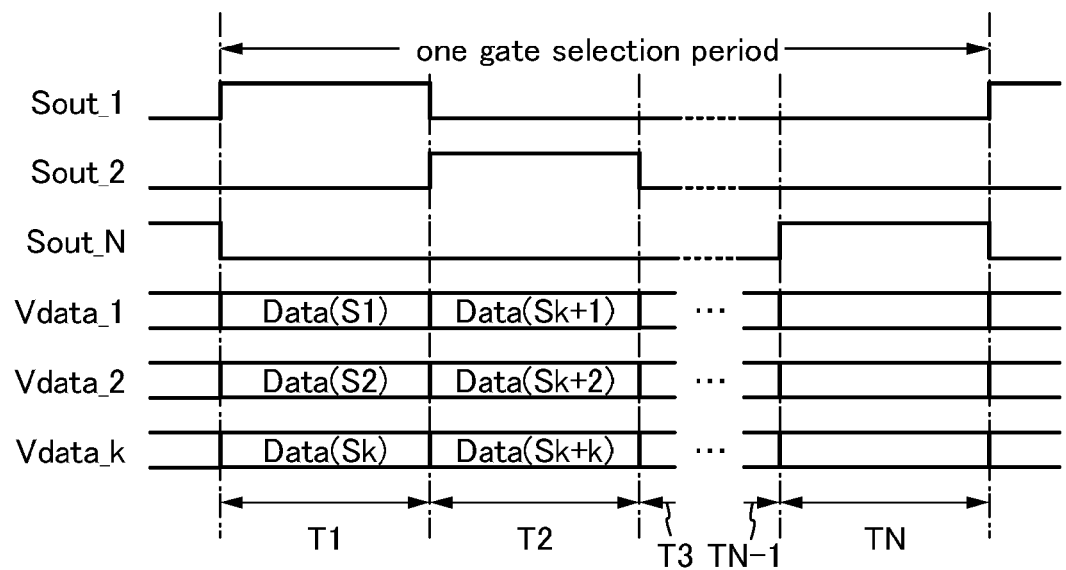

The thin film transistors in Embodiments 1 to 6 are n-channel TFTs. FIGS. 15A and 15B illustrate an example of a structure and operation of a signal line driver circuit formed using n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example where the thin film transistors 5603_1 to 5603_k are n-channel TFTs is described below.

A connection relationship in the signal line driver circuit is described using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential levels) to the wiring 5605_1 and wirings 5605_2 to 5605_N.

The switching circuit 5602_1 has a function of controlling a conduction state between the wiring 5604_1 and the signal line S1 (electrical continuity between the first terminal and the second terminal), that is, a function of controlling whether potential of the wirings 5604_1 is supplied to the signal line S1. In this manner, the switching circuit 5602_1 functions as a selector. In a similar way, the thin film transistors 5603_2 to 5603__k_ have functions of controlling conduction states between the wirings 5604_2 to 5604__k_ and the signal lines S2 to Sk, respectively, that is, functions of supplying potentials of the wirings 5604_2 to 5604__k_ to the signal lines S2 to Sk, respectively. In this manner, each of the thin film transistors 5603_1 to 5603__k_ functions as a switch.

The video signal data (DATA) is input to each of the wirings 5604_1 to 5604__k_. The video signal data (DATA) is an analog signal corresponding to an image signal or image data.

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of signals output from the shift register 5601. The signals Vdata_1 to Vdata_k are examples of signals input to the wirings 5604_1 to 5604__k_. Note that one operation period of the signal line driver circuit corresponds to one gate selection period in a display device. For example, one gate selection period is divided into periods T1 to TN. Each of the periods T1 to TN is a period during which the video signal data (DATA) is written to a pixel in a selected row.

Note that signal waveform distortion and the like in each structure illustrated in drawings and the like in this embodiment are exaggerated for simplicity in some cases. Thus, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603__k_ are turned on, so that the wirings 5604_1 to 5604__k_ and the signal lines S1 to Sk are brought into conduction. At this time, Data (S1) to Data (Sk) are input to the wirings 5604_1 to 5604__k_, respectively. The Data (S1) to Data (Sk) are written to pixels in first to k-th columns in a selected row through the thin film transistors 5603_1 to 5603__k_, respectively. In this manner, in the periods T1 to TN, the video signal data (DATA) is sequentially written to the pixels in the selected row by k columns.

When the video signal data (DATA) is written to pixels by a plurality of columns as described above, the number of video signal data (DATA) or the number of wirings can be reduced. Thus, the number of connections with an external circuit can be reduced. Further, writing time can be extended when video signals are written to pixels by a plurality of columns; thus, insufficient writing of video signals can be prevented.

Note that any of the circuits formed using the thin film transistors described in Embodiments 1 to 6 can be used for the shift register 5601 and the switching circuit 5602.

One embodiment of a shift register which is used for part of the scan line driver circuit and/or the signal line driver circuit is described with reference to FIGS. 14A and 14B and FIGS. 15A and 15B.

The scan line driver circuit includes a shift register. Further, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified in the buffer, and the resulting signal is supplied to a corresponding scan line. Gate electrodes of transistors in pixels of one line are connected to a scan line. Since the transistors in the pixels of one line must be turned on all at once, a buffer which can supply a large amount of current is used.

One embodiment of a shift register which is used for part of the scan line driver circuit and/or the signal line driver circuit is described with reference to FIGS. 16A to 16D and FIGS. 17A and 17B.

The shift register in the scan line driver circuit and/or the signal line driver circuit is described with reference to FIGS. 16A to 16D and FIGS. 17A and 17B. The shift register includes first to N-th pulse output circuits 10_1 to 10_N (N is a natural number greater than or equal to 3) (see FIG. 16A). In the first to N-th pulse output circuits 10_1 to 10_N in the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively. A start pulse SP1 (a first start pulse) is input from a fifth wiring 15 to the first pulse output circuit 10_1. To the n-th pulse output circuit 10__n_ of the second or subsequent stage (n is a natural number greater than or equal to 2 and less than or equal to N), a signal from the pulse output circuit of the preceding stage (such a signal is referred to as a preceding-stage signal OUT(n−1)) is input. To the first pulse output circuit 10_1, a signal from the third pulse output circuit 10_3 of the stage following the next stage is input. Similarly, to the n-th pulse output circuit 10__n_ of the second or subsequent stage, a signal from the (n+2)th pulse output circuit 10_(n+2) of the stage following the next stage (such a signal is referred to as a subsequent-stage signal OUT(n+2)) is input. Therefore, from the pulse output circuits of the respective stages, first output signals OUT(1)(SR) to OUT(N)(SR) to be input to the pulse output circuits of the subsequent stages and/or the stages before the preceding stages and second output signals OUT(1) to OUT(N) to be input to different circuits or the like are output. Note that since the subsequent-stage signal OUT (n+2) is not input to the last two stages of the shift register as illustrated in FIG. 16A, a second start pulse SP2 and a third start pulse SP3 may be input to the stage before the last stage and the last stage, respectively, for example.

Note that a clock signal (CK) is a signal that oscillates between an H-level signal and an L-level signal (also referred to as an L signal or a signal at a low power supply potential level) at regular intervals. Here, the first clock signal (CK1) to the fourth clock signal (CK4) are delayed by ¼ cycle sequentially (i.e., they are 90° out of phase with each other). In this embodiment, driving of the pulse output circuits is controlled with the first to fourth clock signals (CK1) to (CK4). Note that the clock signal is also referred to as GCK or SCK in some cases depending on a driver circuit to which the clock signal is input, and the clock signal is referred to as CK in the following description.

Figure 16A:
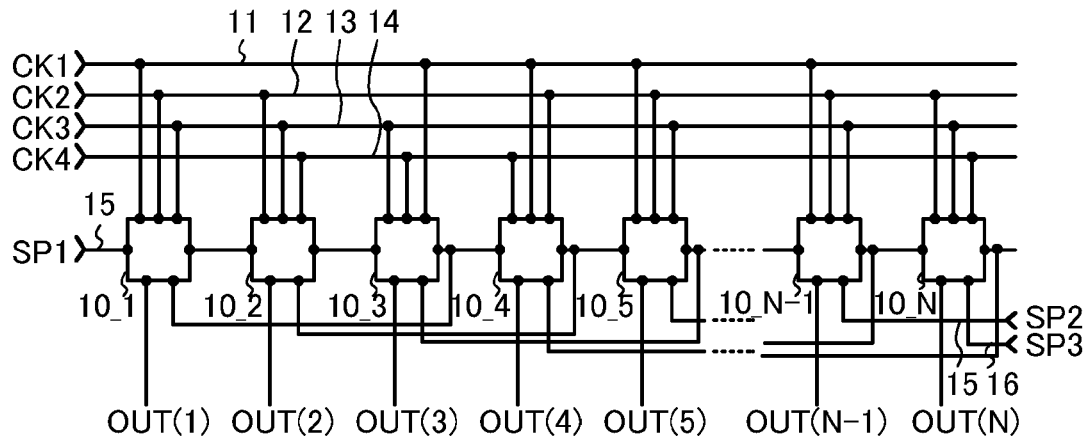
FIGS. 16A to 16D are circuit diagrams illustrating a structure of a shift register.
Figure 16B:
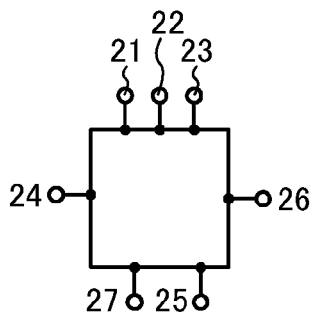

FIG. 16B is one of the pulse output circuits 10__n_ shown in FIG. 16A. A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

Figure 16C:
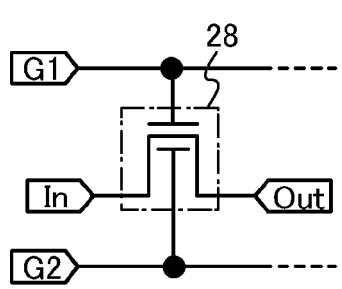

Note that in the first to N-th pulse output circuits 10_1 to 10_N, the thin film transistor (TFT) having four terminals, which is described in the above embodiment, can be used in addition to a thin film transistor having three terminals. FIG. 16C illustrates the symbol of a thin film transistor 28 having four terminals, which is described in the above embodiment. The symbol of the thin film transistor 28 illustrated in FIG. 16C indicates the thin film transistor having four terminals, which is described in any of Embodiments 1 to 5, and is used in the drawings and the like. Note that in this specification, when a thin film transistor has two gate electrodes with a semiconductor layer therebetween, the gate electrode below the semiconductor layer is also called a lower gate electrode and the gate electrode above the semiconductor layer is also called an upper gate electrode. The thin film transistor 28 is an element which can control electric current between an IN terminal and an OUT terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in a positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor 28 having four terminals can be controlled to be a desired level by providing gate electrodes above and below a channel formation region of the thin film transistor 28 and controlling a potential of the upper gate electrode and/or the lower gate electrode.

Next, an example of a specific circuit structure of the pulse output circuit illustrated in FIG. 16B is described with reference to FIG. 16D.

Figure 16D:
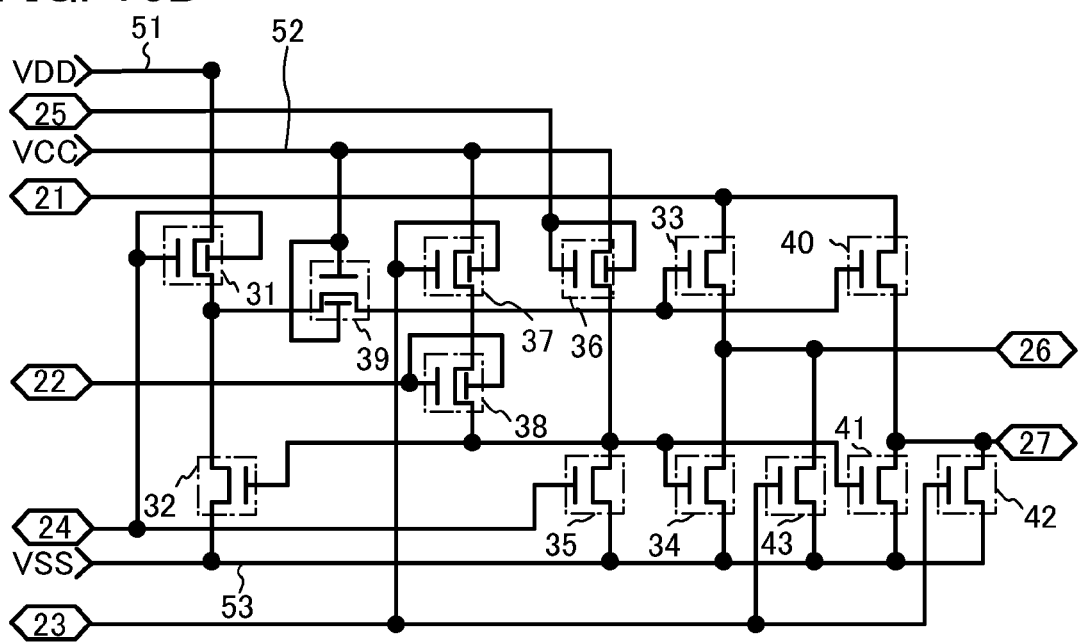

A first pulse output circuit illustrated in FIG. 16D includes first to thirteenth transistors 31 to 43. Signals or power supply potentials are supplied to the first to thirteenth transistors 31 to 43 from a power supply line 51 to which a first high power supply potential VDD is supplied, from a power supply line 52 to which a second high power supply potential VCC is supplied, and from a power supply line 53 to which a low power supply potential VSS is supplied, in addition to the first to fifth input terminals 21 to 25. Signals and the like are output from the first output terminal 26 and the second output terminal 27. The relationship of the power supply potentials of the power supply lines in FIG. 16D is as follows: the first power supply potential VDD is higher than or equal to the second power supply potential VCC, and the second power supply potential VCC is higher than the third power supply potential VSS. Note that each of the first to fourth clock signals (CK1) to (CK4) oscillates between an H-level signal and an L-level signal at regular intervals; the clock signal at an H level is VDD and the clock signal at an L level is VSS. By making the potential VDD of the power supply line 51 higher than the potential VCC of the power supply line 52, a potential applied to a gate electrode of a transistor can be lowered, shift in the threshold voltage of the transistor can be reduced, and degradation of the transistor can be suppressed without adverse effects on the operation of the transistor. The thin film transistor 28 having four terminals in FIG. 16C is preferably used as each of the first transistor 31 and the sixth to ninth transistors 36 to 39 among the first to thirteenth transistors 31 to 43, as illustrated in FIG. 16D. The first transistor 31 and the sixth to ninth transistors 36 to 39 need to operate so that a potential of a node to which one electrode serving as a source or a drain is connected is switched, with a control signal of a gate electrode, and can further reduce a malfunction of the pulse output circuit because response to the control signal input to the gate electrode is fast (the rise of on-state current is steep). Thus, by using the thin film transistor 28 having four terminals in FIG. 16C, the threshold voltage can be controlled, and a malfunction of the pulse output circuit can be further reduced. Note that although the first control signal G1 and the second control signal G2 are the same control signals in FIG. 16D, the first control signal G1 and the second control signal G2 may be different control signals.

In FIG. 16D, a first terminal of the first transistor 31 is electrically connected to the power supply line 51; a second terminal of the first transistor 31 is electrically connected to a first terminal of the ninth transistor 39; and gate electrodes (a lower gate electrode and an upper gate electrode) of the first transistor 31 are electrically connected to the fourth input terminal 24. A first terminal of the second transistor 32 is electrically connected to the power supply line 53; a second terminal of the second transistor 32 is electrically connected to the first terminal of the ninth transistor 39; and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53; a second terminal of the fifth transistor 35 is electrically connected to the gate electrode of the second transistor 32 and the gate electrode of the fourth transistor 34; and a gate electrode of the fifth transistor 35 is electrically connected to the fourth input terminal 24. A first terminal of the sixth transistor 36 is electrically connected to the power supply line 52; a second terminal of the sixth transistor 36 is electrically connected to the gate electrode of the second transistor 32 and the gate electrode of the fourth transistor 34; and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32; a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21; a second terminal of the tenth transistor 40 is electrically connected to the second output terminal 27; and the gate electrode of the tenth transistor 40 is electrically connected to the second terminal of the ninth transistor 39. A first terminal of the eleventh transistor 41 is electrically connected to the power supply line 53; a second terminal of the eleventh transistor 41 is electrically connected to the second output terminal 27; and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53; a second terminal of the twelfth transistor 42 is electrically connected to the second output terminal 27; and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53; a second terminal of the thirteenth transistor 43 is electrically connected to the first output terminal 26; and a gate electrode of the thirteenth transistor 43 is electrically connected to the gate electrodes (the lower gate electrode and the upper gate electrode) of the seventh transistor 37.

In FIG. 16D, a portion where the gate electrode of the third transistor 33, the gate electrode of the tenth transistor 40, and the second terminal of the ninth transistor 39 are connected to each other is referred to as a node A. Further, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected to each other is referred to as a node B (see FIG. 17A).

Figure 17A:
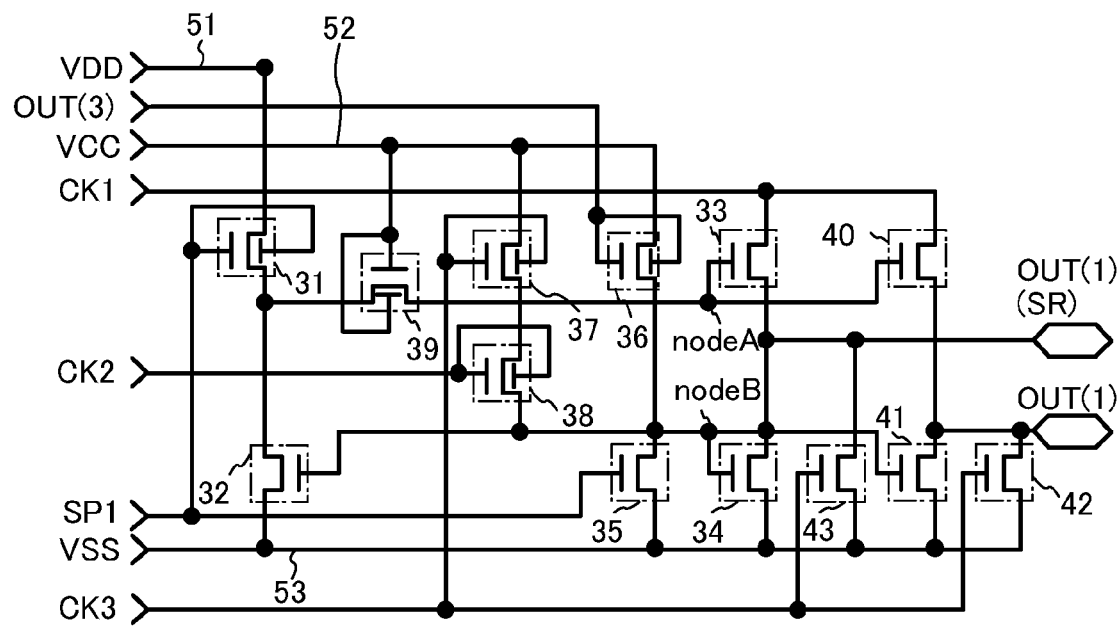
FIGS. 17A and 17B are a circuit diagram and a timing chart illustrating operation of a shift register.

FIG. 17A illustrates signals which are input to or output from the first to fifth input terminals 21 to 25 and the first and second output terminals 26 and 27 when the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse (SP1) is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current which flows between the drain and the source through the channel region can be controlled by control of a potential of the gate. Here, since the source and the drain of the thin film transistor change depending on the structure, the operating condition, and the like of the thin film transistor, it is difficult to define which is a source or a drain. Thus, regions functioning as a source and a drain are not called a source and a drain in some cases. In that case, for example, such regions might be referred to as a first terminal and a second terminal.

Note that in FIG. 16D and FIG. 17A, a capacitor for performing bootstrap operation by making the node A be in a floating state may be additionally provided. Further, a capacitor having one electrode electrically connected to the node B may be additionally provided in order to hold a potential of the node B.

Figure 17B:
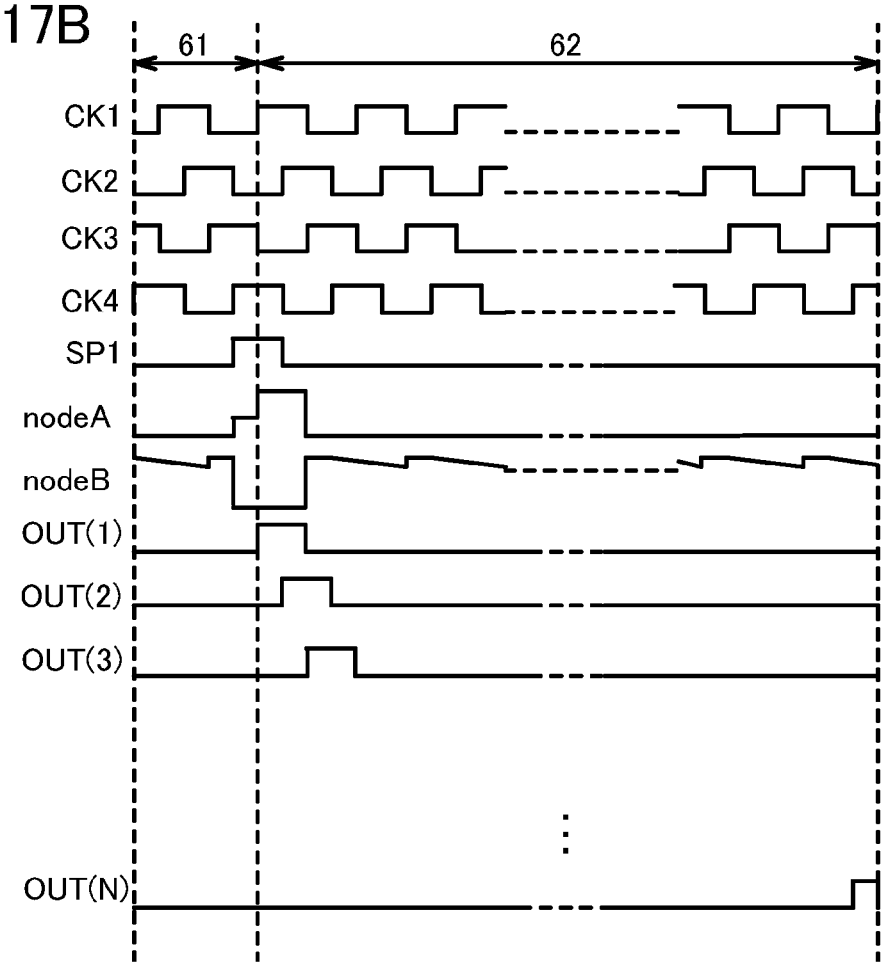

FIG. 17B illustrates a timing chart of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that the provision of the ninth transistor 39 whose gate electrode is supplied with the second power supply potential VCC as illustrated in FIG. 17A has the following advantages before and after bootstrap operation.

Without the provision of the ninth transistor 39 whose gate electrode is supplied with the second power supply potential VCC, if a potential of the node A is raised by bootstrap operation, a potential of the source which is the second terminal of the first transistor 31 rises to a potential which is higher than the first power supply potential VDD. Then, the source of the first transistor 31 is switched to the first terminal, that is, the terminal on the power supply line 51 side. Thus, in the first transistor 31, high bias voltage is applied and thus significant stress is applied between the gate and the source and between the gate and the drain, which might cause deterioration of the transistor. With the provision of the ninth transistor 39 whose gate electrode is supplied with the second power supply potential VCC, the increase in the potential of the second terminal of the first transistor 31 can be prevented, though the potential of the node A is raised by bootstrap operation. In other words, the provision of the ninth transistor 39 can lower the level of negative bias voltage applied between the gate and the source of the first transistor 31. Thus, the circuit structure in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 can be eliminated, which leads to reduction in the number of transistors.

Note that when an oxide semiconductor is used for semiconductor layers of the first to thirteenth transistors 31 to 43, the amount of the off-state current of the thin film transistors can be reduced, the amount of the on-state current and field-effect mobility can be increased, and the rate of degradation of the transistors can be reduced. Thus, a malfunction in the circuit can be reduced. Further, the rate of deterioration of the transistor including an oxide semiconductor by application of a high potential to a gate electrode is lower than that of a transistor including amorphous silicon. Thus, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relationship is changed so that a clock signal which is supplied to the gate electrodes (the lower gate electrode and the upper gate electrode) of the seventh transistor 37 from the third input terminal 23 and a clock signal which is supplied to the gate electrodes (the lower gate electrode and the upper gate electrode) of the eighth transistor 38 from the second input terminal 22 are supplied from the second input terminal 22 and the third input terminal 23, respectively. Here, in the shift register illustrated in FIG. 17A, the states of the seventh transistor 37 and the eighth transistor 38 are changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to the fall in potentials of the second input terminal 22 and the third input terminal 23 is caused twice by the fall in a potential of the gate electrode of the seventh transistor 37 and the fall in a potential of the gate electrode of the eighth transistor 38. On the other hand, when the states of the seventh transistor 37 and the eighth transistor 38 in the shift register illustrated in FIG. 17A are changed as in the period in FIG. 17B so that both the seventh transistor 37 and the eighth transistor 38 are on, then the seventh transistor 37 is on and the eighth transistor 38 is off, and then the seventh transistor 37 and the eighth transistor 38 are off, the fall in the potential of the node B due to the fall in the potentials of the second input terminal 22 and the third input terminal 23 is caused once by the fall in the potential of the gate electrode of the eighth transistor 38. Thus, the connection relation, that is, the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. This is because the number of times of the change in the potential of the node B can be reduced, whereby the noise can be reduced.

In this manner, an H-level signal is regularly supplied to the node B in a period during which the potentials of the first output terminal 26 and the second output terminal 27 are held at an L level; thus, a malfunction of the pulse output circuit can be suppressed.

This embodiment can be freely combined with any of the other embodiments.

Embodiment 11

Figure 20:
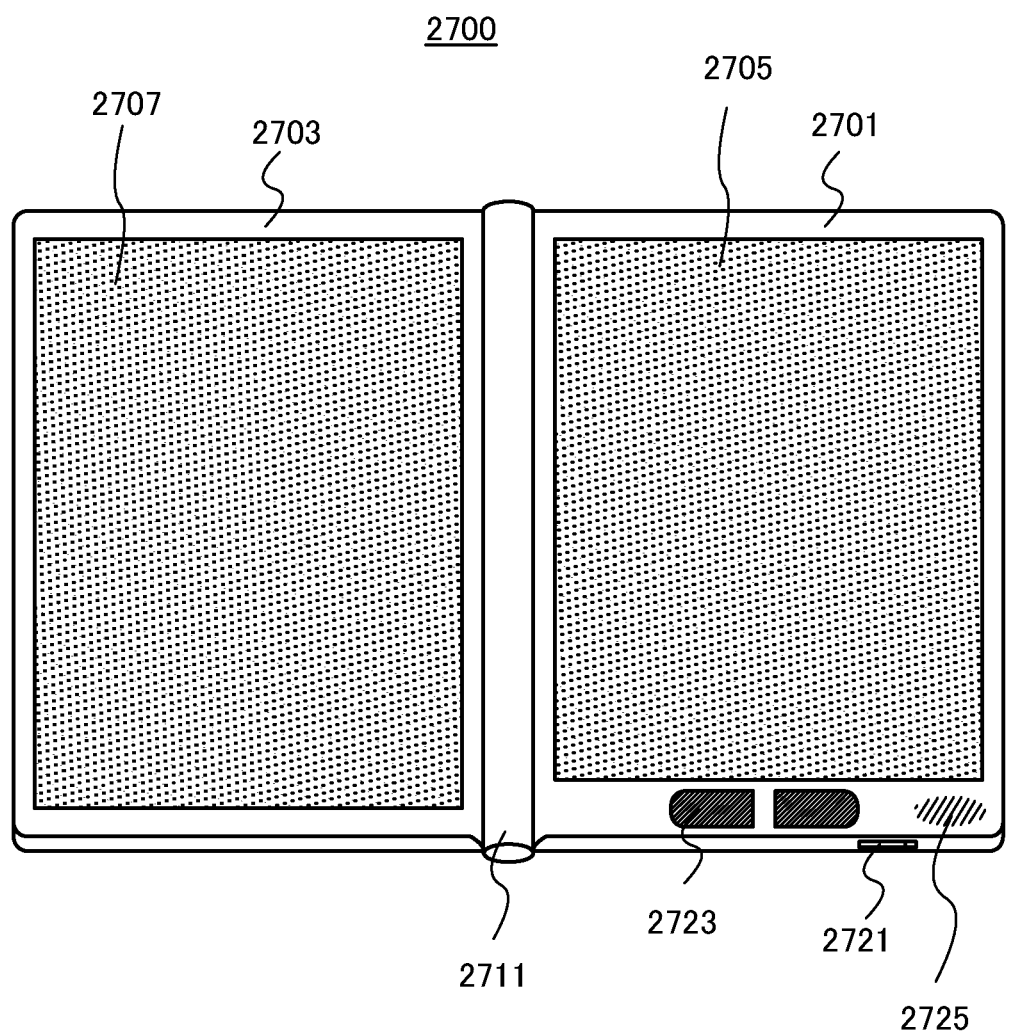
FIG. 20 is an external view illustrating an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 20 illustrates an example of an electronic device.

FIG. 20 illustrates an e-book reader 2700. For example, the e-book reader 2700 includes two housings 2701 and 2703. The housings 2701 and 2703 are combined with each other with a hinge 2711 so that the e-book reader 2700 can be opened and closed with the hinge 2711 as an axis. With such a structure, the e-book reader 2700 can be operated like a paper book.

A display portion 2705 is incorporated in the housing 2701, and a display portion 2707 is incorporated in the housing 2703. The display portions 2705 and 2707 may display one image or different images. In the case where the display portion 2705 and 2707 display different images, for example, a display portion on the right side (the display portion 2705 in FIG. 20) can display text and a display portion on the left side (the display portion 2707 in FIG. 20) can display images.

FIG. 20 illustrates an example in which the housing 2701 includes an operation portion and the like. For example, the housing 2701 includes a power switch 2721, operation keys 2723, a speaker 2725, and the like. With the operation keys 2723, pages can be turned. Note that a keyboard, a pointing device, or the like may be provided on a surface of the housing, on which the display portion is provided. Further, an external connection terminal (e.g., an earphone terminal, a USB terminal, or a terminal which can be connected to a variety of cables such as USB cables), a recording medium insertion portion, or the like may be provided on a back surface or a side surface of the housing. Furthermore, the e-book reader 2700 may function as an electronic dictionary.

Further, the e-book reader 2700 may transmit and receive data wirelessly. Through wireless communication, desired book data or the like can be purchased and downloaded from an electronic book server.

Embodiment 12

A semiconductor device disclosed in this specification can be used in a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, and the like.

Figure 21A:
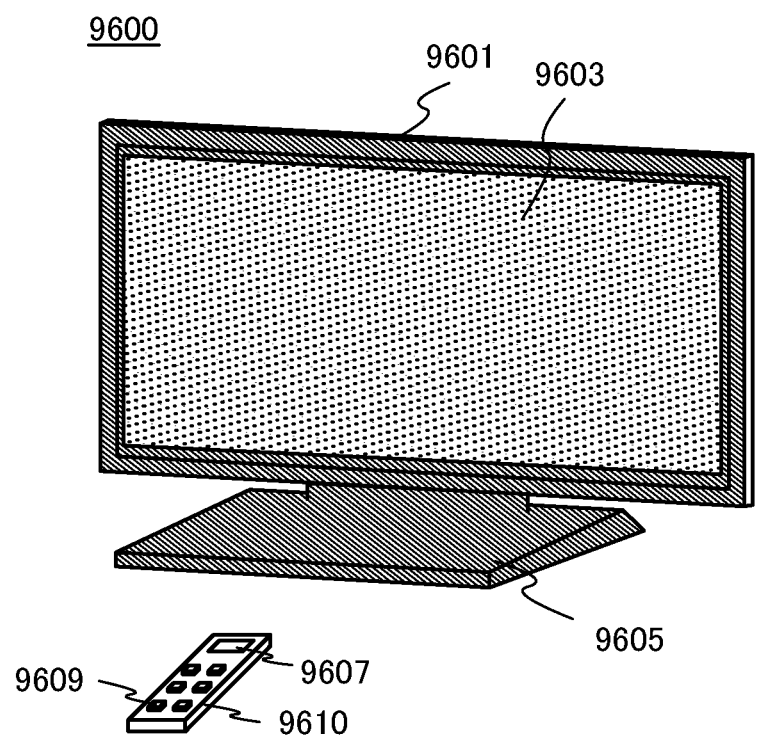
FIGS. 21A and 21B are external views illustrating examples of a television set and a digital photo frame.

FIG. 21A illustrates a television set 9600. In the television set 9600, a display portion 9603 is incorporated in a housing 9601. The display portion 9603 can display images. Further, here, the housing 9601 is supported by a stand 9605.

The television set 9600 can be operated with an operation switch of the housing 9601 or a separate remote controller 9610. Channels and volume can be controlled with operation keys 9609 of the remote controller 9610, so that images displayed on the display portion 9603 can be controlled. Further, the remote controller 9610 may include a display portion 9607 for displaying data output from the remote controller 9610.

Note that the television set 9600 includes a receiver, a modem, and the like. With the receiver, general television broadcasts can be received. Further, by connecting the television set to a wired or wireless communication network via the modem, one-way (from a transmitter to a receiver) or two-way (between a transmitter and a receiver, between receivers, or the like) information communication can be performed.

Figure 21B:
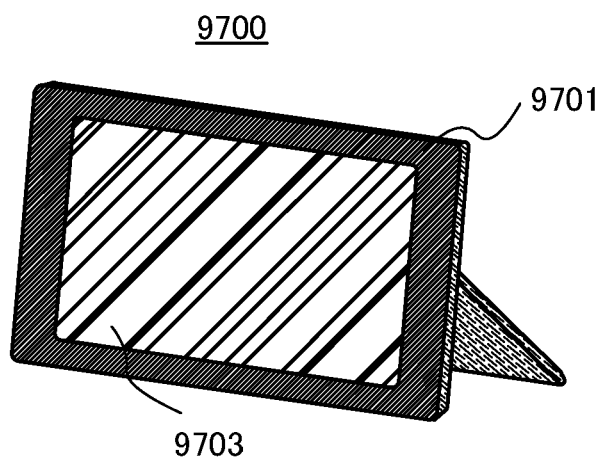

FIG. 21B illustrates a digital photo frame 9700. For example, in the digital photo frame 9700, a display portion 9703 is incorporated in a housing 9701. The display portion 9703 can display a variety of images. For example, the display portion 9703 can display data of images photographed with a digital camera or the like, so that the digital photo frame can function as a normal photo frame.

Note that the digital photo frame 9700 includes an operation portion, an external connection terminal (e.g., a USB terminal or a terminal which can be connected to a variety of cables such as USB cables), a recording medium insertion portion, and the like. Although they may be provided on the same surface as the display portion, it is preferable to provide them on a side surface or a back surface because the design of the digital photo frame is improved. For example, a memory which stores data of images photographed with a digital camera is inserted in the recording medium insertion portion of the digital photo frame so that the data of the images can be loaded, and the images can be displayed on the display portion 9703.

Further, the digital photo frame 9700 may transmit and receive data wirelessly. Through wireless communication, desired image data can be loaded and displayed.

Figure 22A:
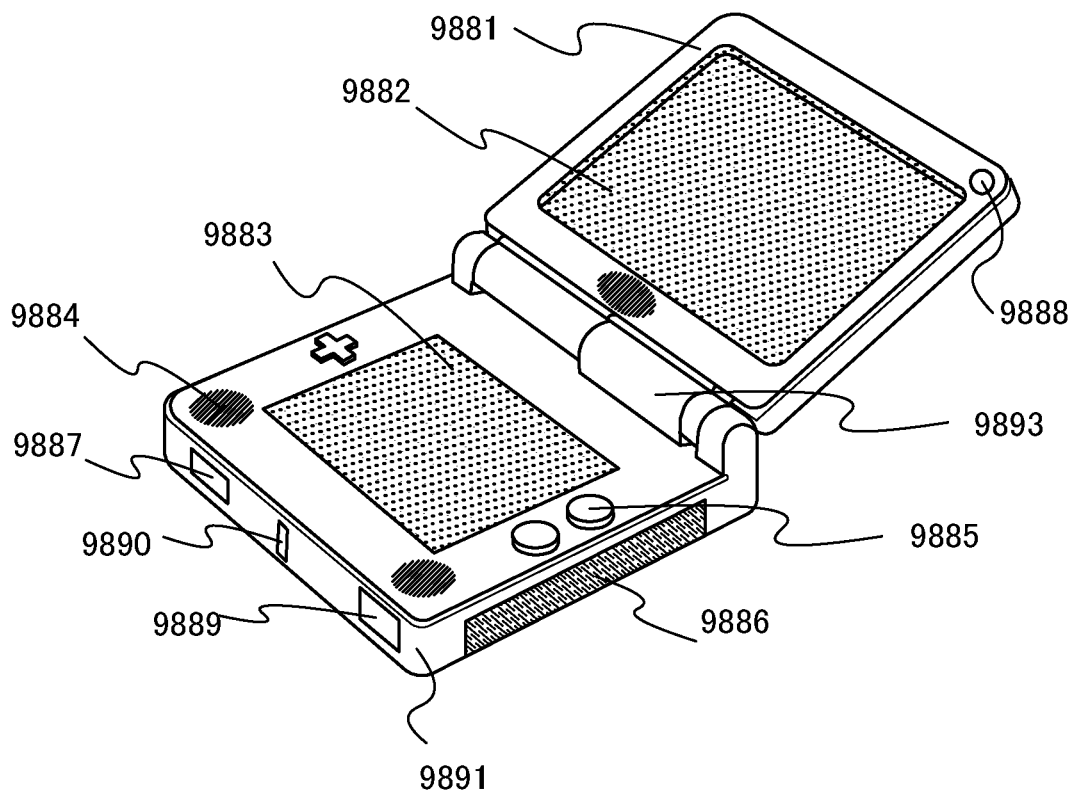
FIGS. 22A and 22B are external views illustrating examples of game machines.

FIG. 22A is a portable game machine, which includes two housings 9881 and 9891 connected to each other with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A further includes a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification may be employed. The portable game machine may include other accessories as appropriate. The portable game machine illustrated in FIG. 22A has a function of reading a program or data stored in a recording medium to display it on the display portion, and a function of sharing information with another portable game machine through wireless communication. Note that the function of the portable game machine illustrated in FIG. 22A is not limited to those described above, and the portable game machine can have a variety of functions.

Figure 22B:
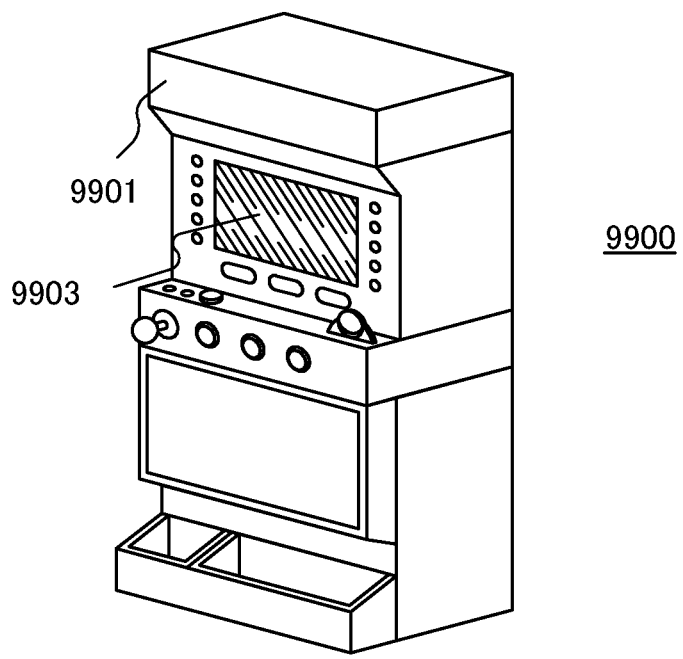

FIG. 22B illustrates a slot machine 9900, which is a large game machine. In the slot machine 9900, a display portion 9903 is incorporated in a housing 9901. In addition, the slot machine 9900 further includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include other accessories as appropriate.

Figure 23A:
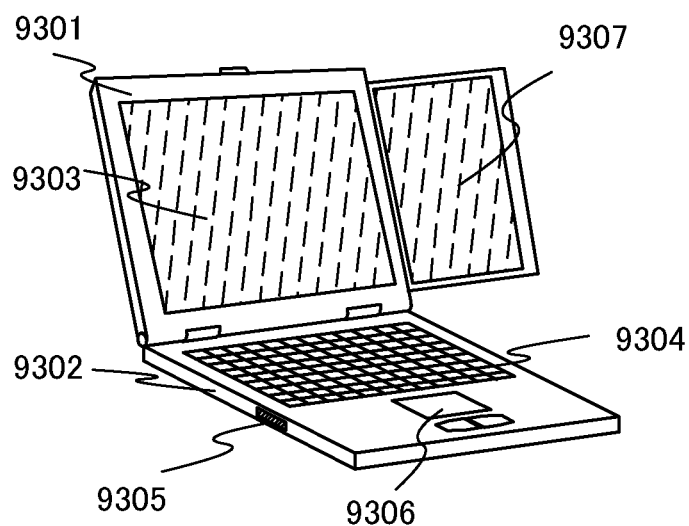
FIGS. 23A and 23B are external views illustrating examples of a mobile computer and a mobile phone.

FIG. 23A is a perspective view illustrating an example of a mobile computer.

In the mobile computer illustrated in FIG. 23A, an upper housing 9301 having a display portion 9303 and a lower housing 9302 having a keyboard 9304 can overlap with each other by closing a hinge unit which connects the upper housing 9301 and the lower housing 9302. The mobile computer illustrated in FIG. 23A is conveniently carried. Further, in the case of using the keyboard for input of data, the hinge unit is opened so that a user can input data looking at the display portion 9303.

The lower housing 9302 includes a pointing device 9306 with which input can be performed, in addition to the keyboard 9304. When the display portion 9303 is a touch panel, a user can input data by touching part of the display portion. The lower housing 9302 includes an arithmetic function portion such as a CPU or hard disk. In addition, the lower housing 9302 includes another device, for example, an external connection port 9305 into which a communication cable based on communication standards of a USB is inserted.

The upper housing 9301 further includes a display portion 9307 which can be stored in the upper housing 9301 by being slid therein. Thus, a large display screen can be realized. In addition, a user can adjust the angle of a screen of the display portion 9307 which can be stored in the upper housing 9301. If the display portion 9307 which can be stored in the upper housing 9301 is a touch panel, the user can input data by touching part of the display portion 9307.

The display portion 9303 or the display portion 9307 which can be stored in the upper housing 9301 is formed using an image display device such as a liquid crystal display panel or a light-emitting display panel including an organic light-emitting element, an inorganic light-emitting element, or the like.

In addition, the mobile computer illustrated in FIG. 23A can include a receiver and the like and can receive a TV broadcast to display images on the display portion. The user can watch a TV broadcast with the entire screen of the display portion 9307 by sliding and exposing the display portion 9307 while the hinge unit which connects the upper housing 9301 and the lower housing 9302 is kept closed. In this case, the hinge unit is not opened and display is not performed on the display portion 9303. In addition, start up of only a circuit for displaying a TV broadcast is performed. Thus, power consumption can be minimized, which is useful for the mobile computer whose battery capacity is limited.

Figure 23B:
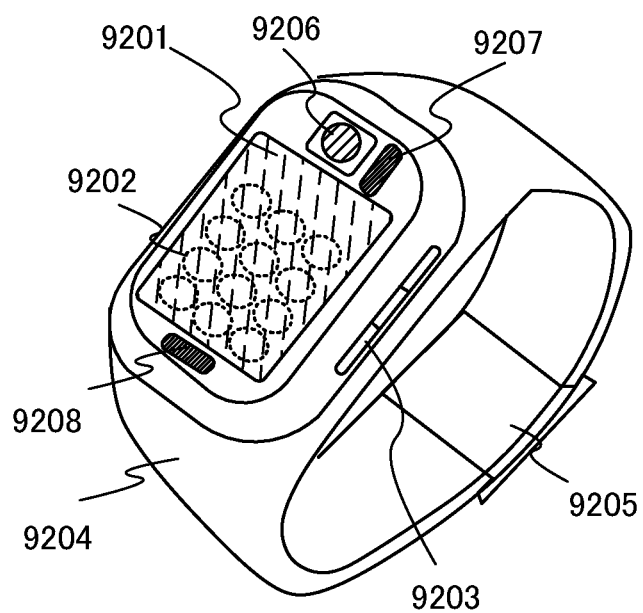

FIG. 23B is a perspective view of an example of a mobile phone that the user can wear on the wrist like a wristwatch.

This mobile phone includes a main body which includes a battery and a communication device having at least a telephone function, a band portion 9204 which enables the main body to be worn on the wrist, an adjustment portion 9205 for adjusting the band portion 9204 to fit the wrist, a display portion 9201, a speaker 9207, and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start photographing images, or the like, and can be configured to have respective functions.

A user can input data to this mobile phone by touching the display portion 9201 with a finger or an input pen, operating the operation switches 9203, or inputting voice to the microphone 9208. Note that In FIG. 23B, display buttons 9202 are displayed on the display portion 9201. The user can input data by touching the display buttons 9202 with a finger or the like.

Further, the main body includes a camera portion 9206 including an image pickup means having a function of converting an image of an object, which is formed through a camera lens, to an electronic image signal. Note that the camera portion is not necessarily provided.

The mobile phone illustrated in FIG. 23B includes a receiver of a TV broadcast and the like and can display images on the display portion 9201 by receiving the TV broadcast. In addition, the mobile phone includes a memory device such as a memory, and the like, and can record the content of the TV broadcast in the memory. The mobile phone illustrated in FIG. 23B may have a function of collecting location information, such as GPS.

An image display device such as a liquid crystal display panel or a light-emitting display panel including an organic light-emitting element, an inorganic light-emitting element, or the like is used as the display portion 9201. The mobile phone illustrated in FIG. 23B is compact and lightweight, and the battery capacity is limited. For the above reason, a panel which can be driven with low power consumption is preferably used as a display device for the display portion 9201.

Note that although FIG. 23B illustrates the electronic device which is worn on the wrist, this embodiment is not limited to this as long as an electronic device is portable.

Embodiment 13

In this embodiment, as one mode of a semiconductor device, examples of display devices each including the thin film transistor described in any of Embodiments 1 to 6 are described with reference to FIGS. 24 to 37. In this embodiment, examples of liquid crystal display devices each including a liquid crystal element as a display element are described with reference to FIGS. 24 to 37. The thin film transistor described in any of Embodiments 1 to 6 can be used as each of TFTs 628 and 629 used in the liquid crystal display devices in FIGS. 24 to 37. The TFTs 628 and 629 can be manufactured through steps which are similar to those described in any of Embodiments 1 to 6 and have excellent electrical characteristics and high reliability.

First, a vertical alignment (VA) liquid crystal display device is described. The VA is a method for controlling alignment of liquid crystal molecules of a liquid crystal display. In the VA liquid crystal display device, liquid crystal molecules are aligned in a vertical direction with respect to a panel surface when no voltage is applied. In this embodiment, in particular, a pixel is divided into some regions (subpixels), and liquid crystal molecules are aligned in different directions in their respective regions. This is referred to as multi-domain or multi-domain design. Liquid crystal display devices of multi-domain design are described below.

Figure 24:
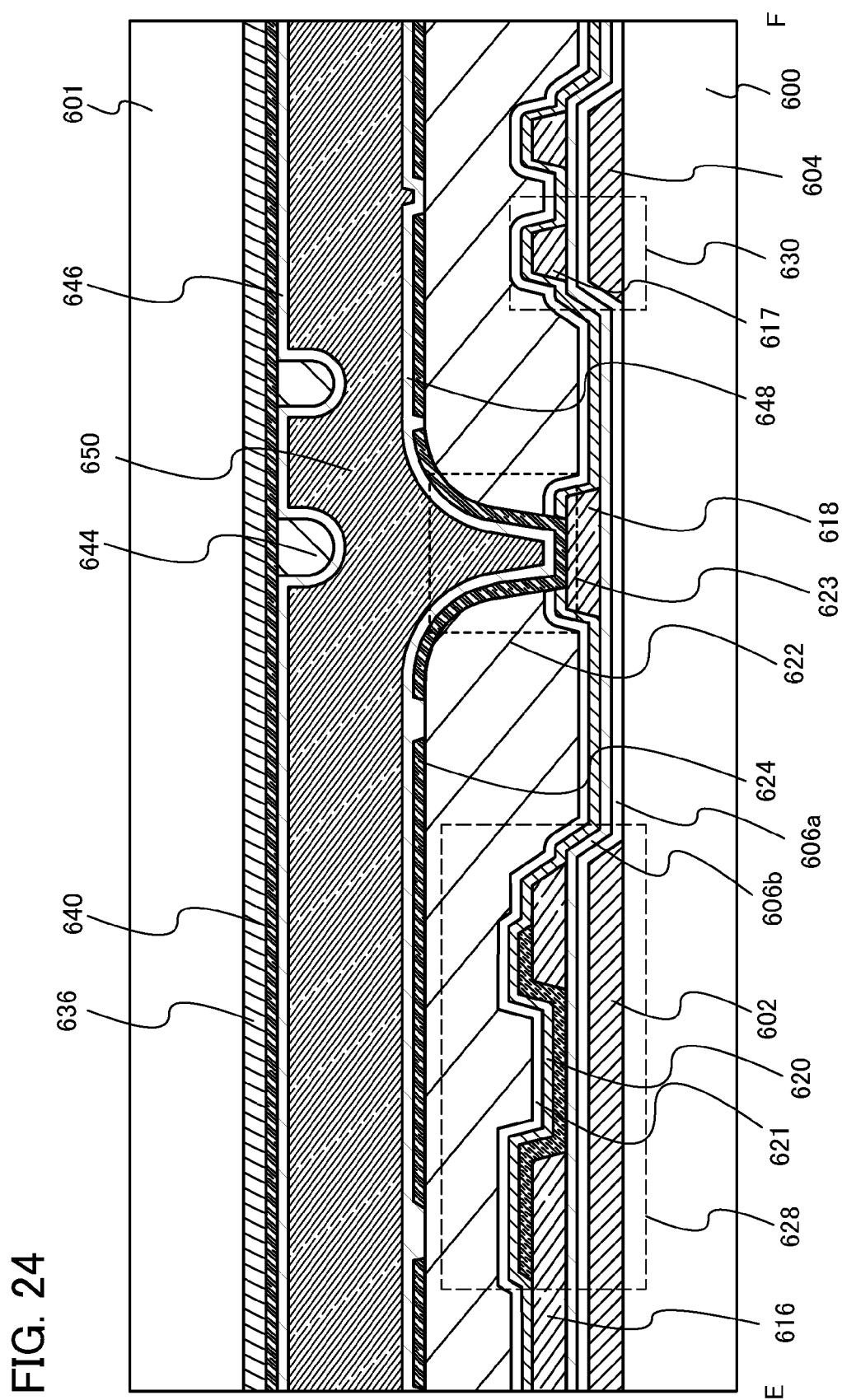
FIG. 24 illustrates a semiconductor device.
Figure 25:
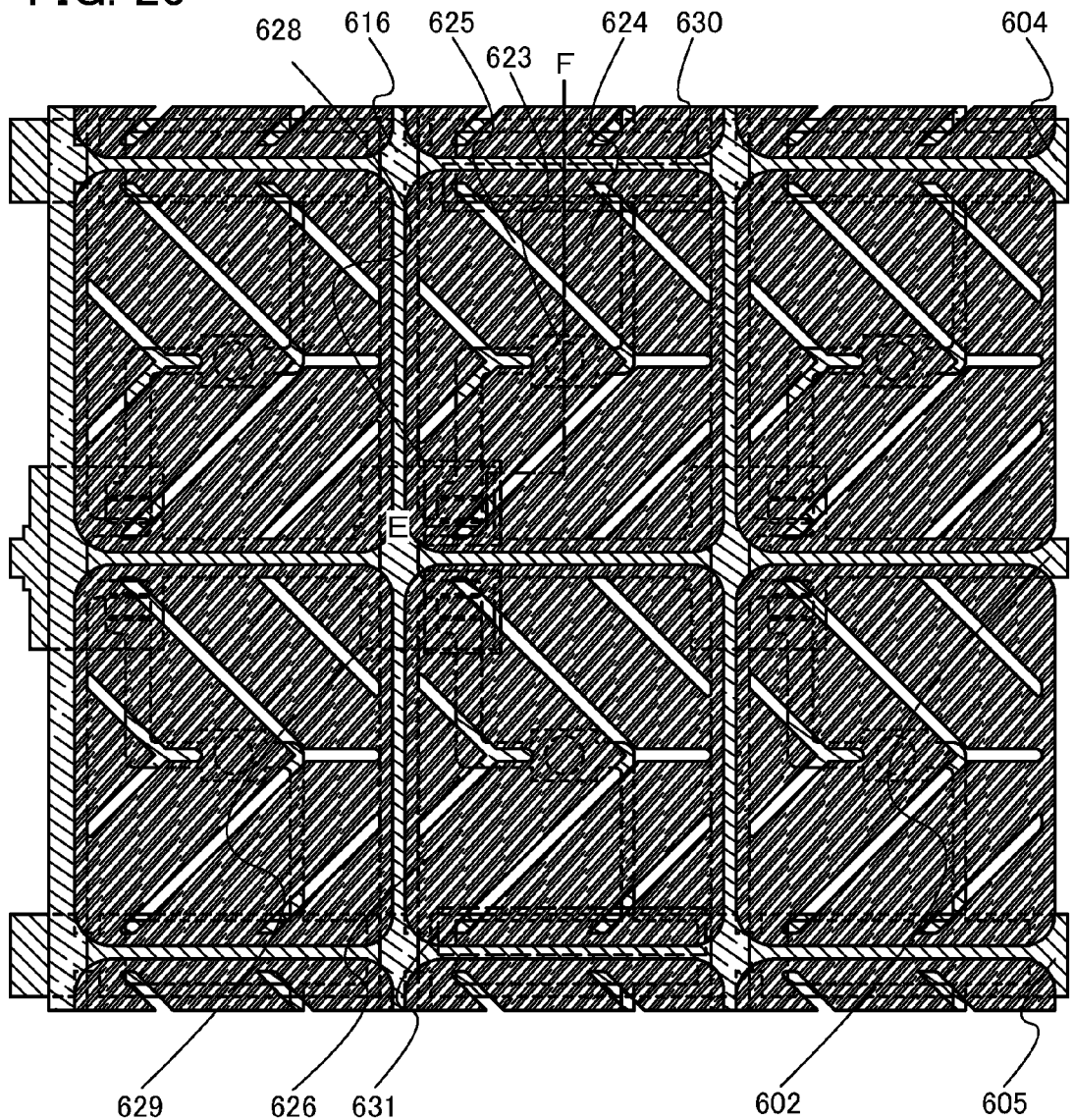
FIG. 25 illustrates a semiconductor device.
Figure 26:
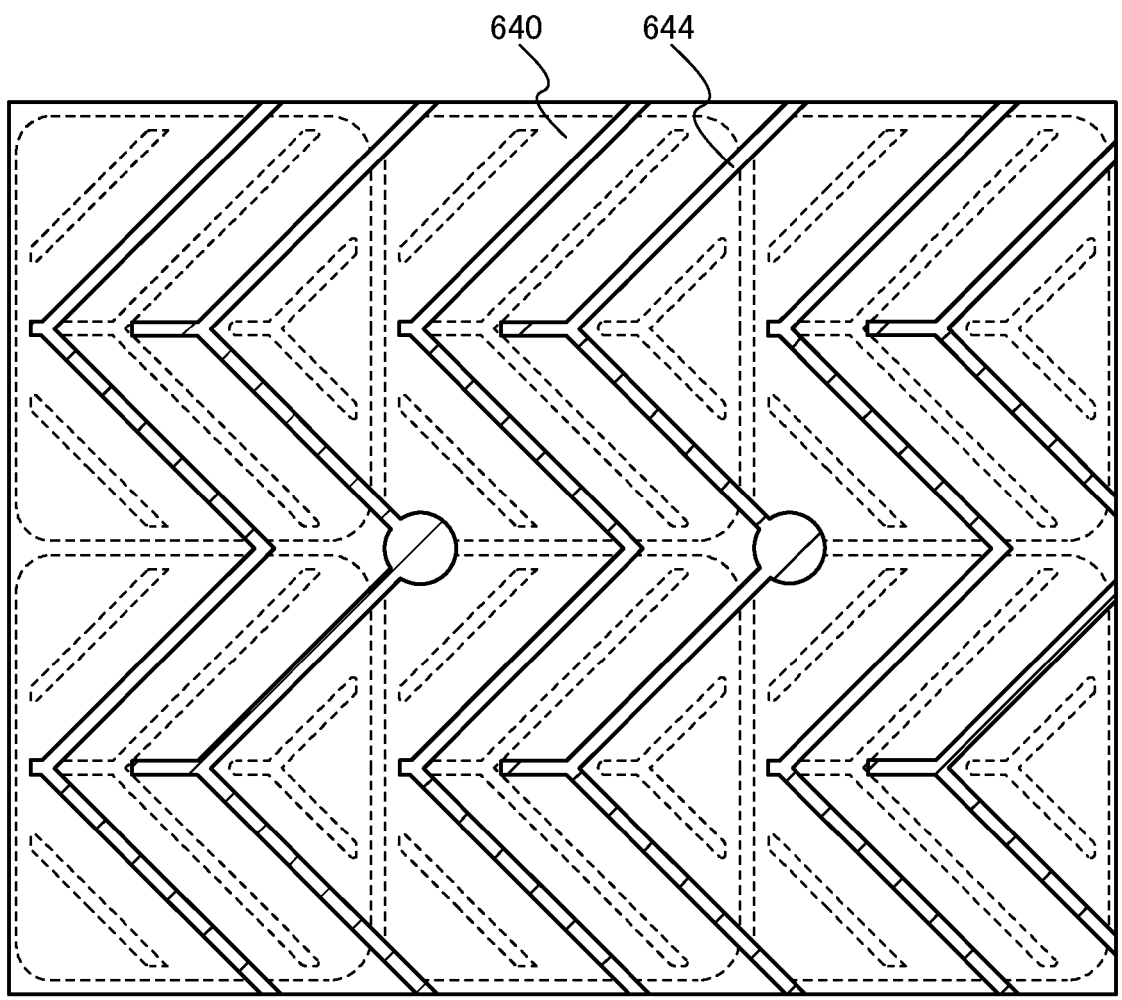
FIG. 26 illustrates a semiconductor device.

FIG. 25 and FIG. 26 illustrate a pixel electrode and a counter electrode, respectively. Note that FIG. 25 is a plan view illustrating a substrate side where the pixel electrode is formed. FIG. 24 illustrates a cross-sectional structure taken along section line E-F in FIG. 25. FIG. 26 is a plan view illustrating a substrate side where the counter electrode is formed. Description below is made with reference to these drawings.

In FIG. 24, a substrate 600 over which a TFT 628, a pixel electrode layer 624 which is connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 which is connected to the TFT 628, and the storage capacitor portion 630 are formed over the substrate 600. The pixel electrode layer 624 is connected to a wiring 618 through a contact hole 623 which penetrates insulating films 620 and 621 for covering the TFT 628, a wiring 616, and the storage capacitor portion 630 and also penetrates an insulating film 622 for covering the insulating films 620 and 621. The thin film transistor described in any of Embodiments 1 to 6 can be used as the TFT 628 as appropriate. Further, the storage capacitor portion 630 includes a first capacitor wiring 604 which is formed at the same time as a gate wiring 602 of the TFT 628; a first gate insulating film 606a; a second gate insulating film 606b; and a second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 25 illustrates a planar structure on the substrate 600. The pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 which is connected to the TFT 629, and a storage capacitor portion 631 which are illustrated in FIG. 25 can be formed in a manner which is similar to that of the TFT 628, the pixel electrode layer 624, and the storage capacitor portion 630. Both the TFTs 628 and 629 are connected to the wiring 616. A pixel of this liquid crystal display panel includes the pixel electrode layers 624 and 626. The pixel electrode layers 624 and 626 constitute subpixels.

FIG. 26 illustrates a planar structure of the counter substrate side. The counter electrode layer 640 is preferably formed using a material which is similar to that of the pixel electrode layer 624. The protrusions 644 which control the alignment of the liquid crystals are formed on the counter electrode layer 640. Note that in FIG. 26, the pixel electrode layers 624 and 626 formed over the substrate 600 are indicated by dashed lines, and the counter electrode layer 640 and the pixel electrode layers 624 and 626 overlap with each other.

Figure 27:
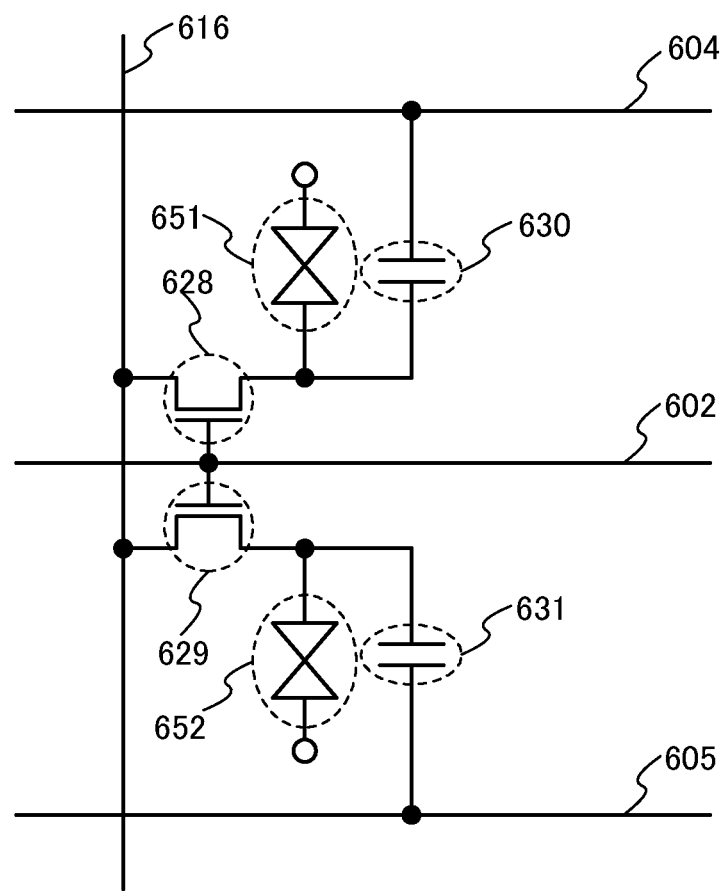
FIG. 27 illustrates a circuit diagram of a semiconductor device.

FIG. 27 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can be different from each other. In other words, the alignment of the liquid crystals is precisely controlled and a viewing angle is increased by separate control of the potentials of the capacitor wirings 604 and 605.

When voltage is applied to the pixel electrode layer 624 provided with the slits 625, a distorted electric field (an oblique electric field) is generated in the vicinity of the slits 625. The protrusions 644 on the counter substrate 601 side and the slits 625 are disposed so as not to overlap with each other. Thus, the oblique electric field is effectively generated and the alignment of the liquid crystals is controlled, whereby the alignment of the liquid crystals varies depending on the location. In other words, the viewing angle of the liquid crystal display panel is increased by multi-domain.

Next, a VA liquid crystal display device, which is different from the above device, is described with reference to FIG. 28, FIG. 29, FIG. 30, and FIG. 31.

Figure 28:
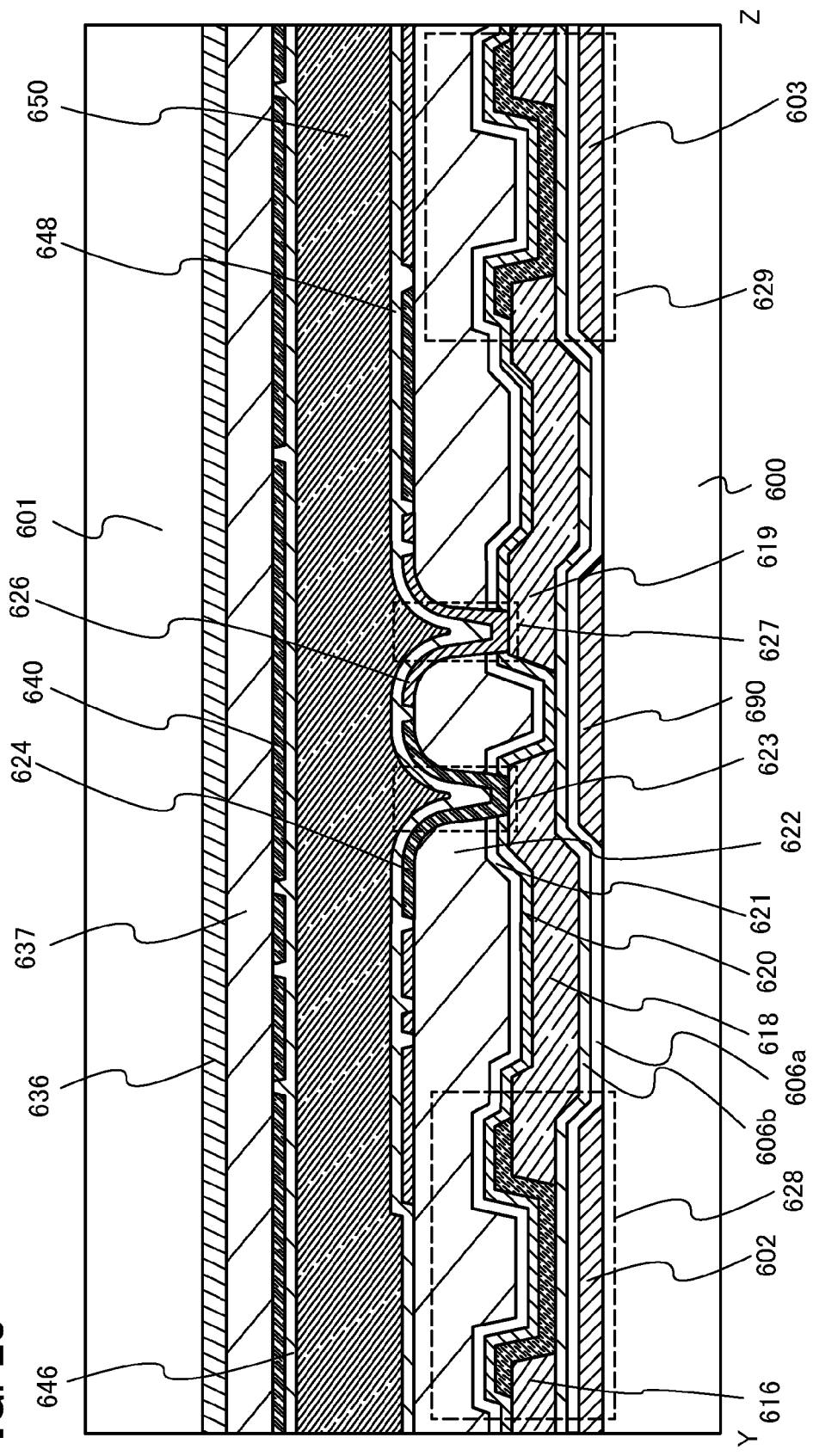
FIG. 28 illustrates a semiconductor device.
Figure 29:
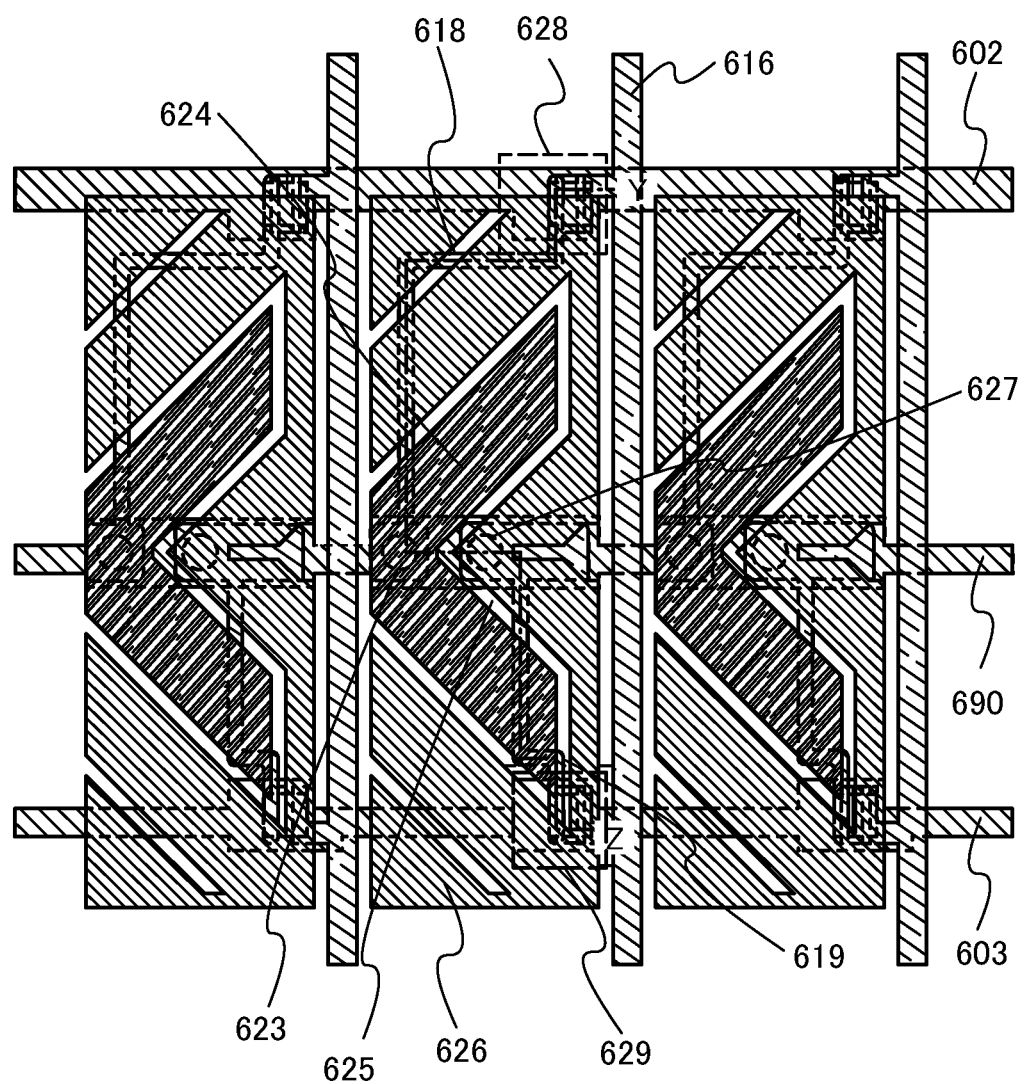
FIG. 29 illustrates a semiconductor device.

FIG. 28 and FIG. 29 illustrate a pixel structure of a VA liquid crystal display panel. FIG. 29 is a plan view of the substrate 600. FIG. 28 illustrates a cross-sectional structure taken along section line Y-Z in FIG. 29.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently.

The pixel electrode layer 624 is connected to the TFT 628 through the wiring 618 in the contact hole 623 which penetrates the insulating films 620, 621, and 622. The pixel electrode layer 626 is connected to the TFT 629 through a wiring 619 in a contact hole 627 which penetrates the insulating films 620, 621, and 622. The gate wiring 602 of the TFT 628 is separated from a gate wiring 603 of the TFT 629 so that different gate signals can be supplied. On the other hand, the wiring 616 serving as a data line is shared by the TFTs 628 and 629. The thin film transistor described in any of Embodiments 1 to 6 can be used as appropriate as each of the TFTs 628 and 629. Note that the first gate insulating film 606a and the second gate insulating film 606b are formed over the gate wiring 602, the gate wiring 603, and a capacitor wiring 690.

Figure 31:
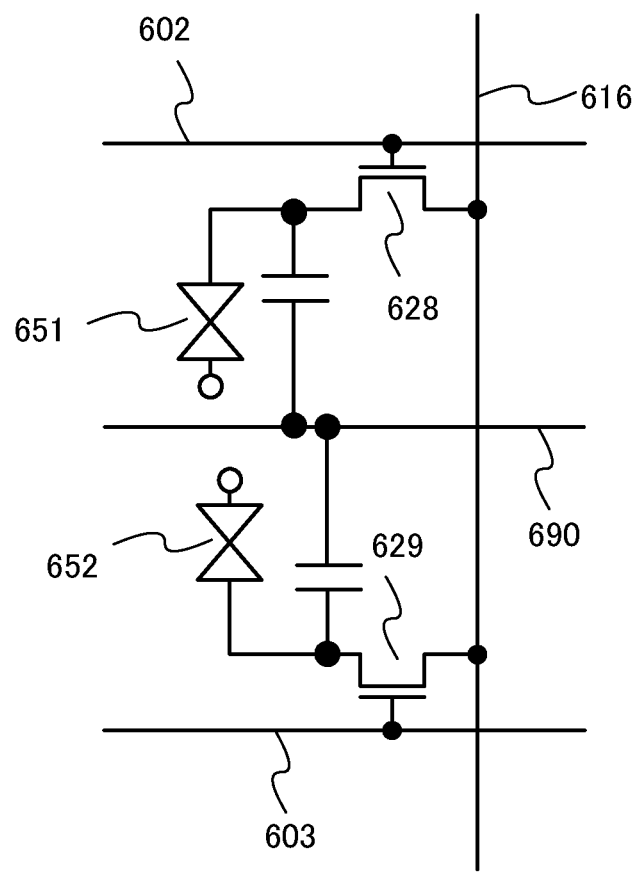
FIG. 31 illustrates a circuit diagram of a semiconductor device.

The shape of the pixel electrode layer 624 is different from that of the pixel electrode layer 626, and the pixel electrode layer 626 is formed so as to surround the external side of the pixel electrode layer 624 which spreads into a V shape. Voltage applied to the pixel electrode layer 624 by the TFT 628 is made to be different from voltage applied to the pixel electrode layer 626 by the TFT 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of the liquid crystal elements 651 and 652 can be different from each other. In other words, by controlling the operations of the TFTs 628 and 629 separately, the alignment of the liquid crystals in the liquid crystal elements 651 and 652 is controlled precisely, which leads to a wider viewing angle.

Figure 30:
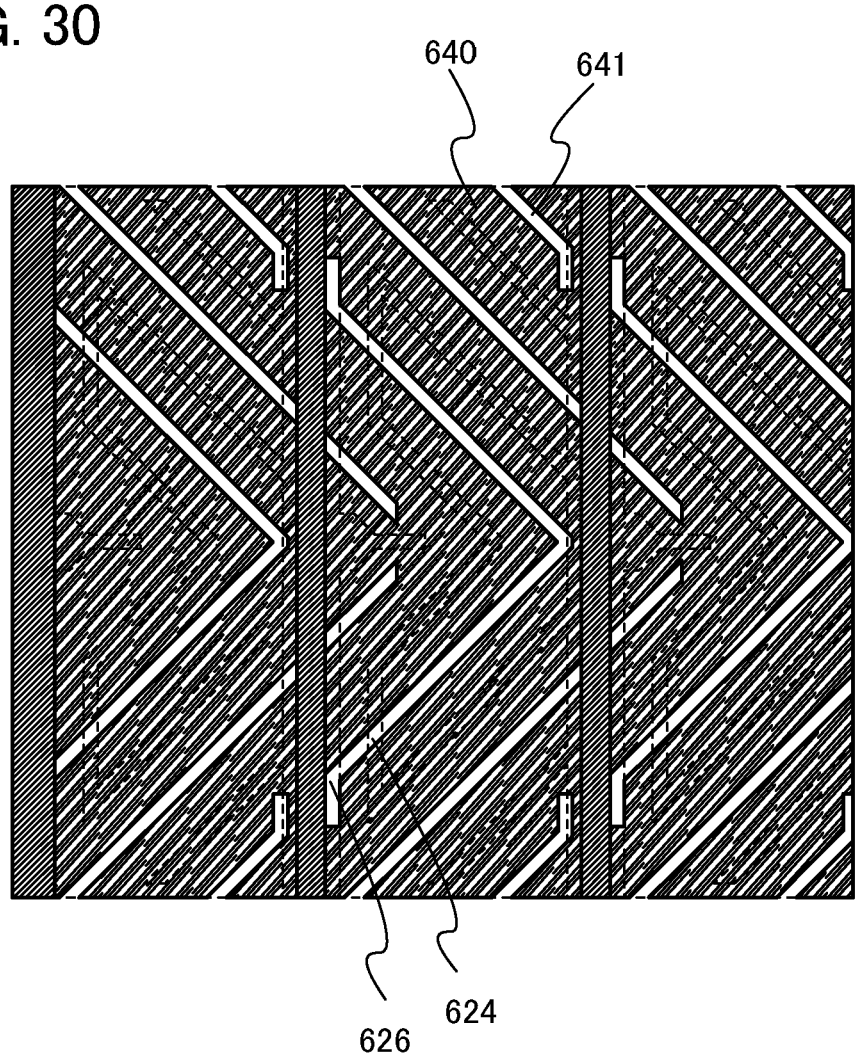
FIG. 30 illustrates a semiconductor device.

The counter substrate 601 is provided with the coloring film 636 and the counter electrode layer 640. A planarization film 637 is formed between the coloring film 636 and the counter electrode layer 640 to prevent alignment disorder of the liquid crystals. FIG. 30 illustrates a planar structure of the counter substrate side. The counter electrode layer 640 is an electrode shared by different pixels and slits 641 are formed. The slits 641 and the slits 625 on the pixel electrode layer 624 and 626 sides are disposed so as not to overlap with each other. Thus, an oblique electric field is effectively generated and the alignment of the liquid crystals can be controlled. Accordingly, the alignment of the liquid crystals can vary depending on the location, which leads to a wider viewing angle. Note that in FIG. 30, the pixel electrode layers 624 and 626 formed over the substrate 600 are indicated by dashed lines and the counter electrode layer 640 and the pixel electrode layers 624 and 626 overlap with each other.

The alignment film 648 is formed over the pixel electrode layer 624 and the pixel electrode layer 626, and the counter electrode layer 640 is similarly provided with the alignment film 646. The liquid crystal layer 650 is formed between the substrate 600 and the counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 28, FIG. 29, FIG. 30, and FIG. 31 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express gradation. With this method, a viewing angle can be increased to about 180°. A liquid crystal display device in a horizontal electric field mode is described below.

Figure 32:
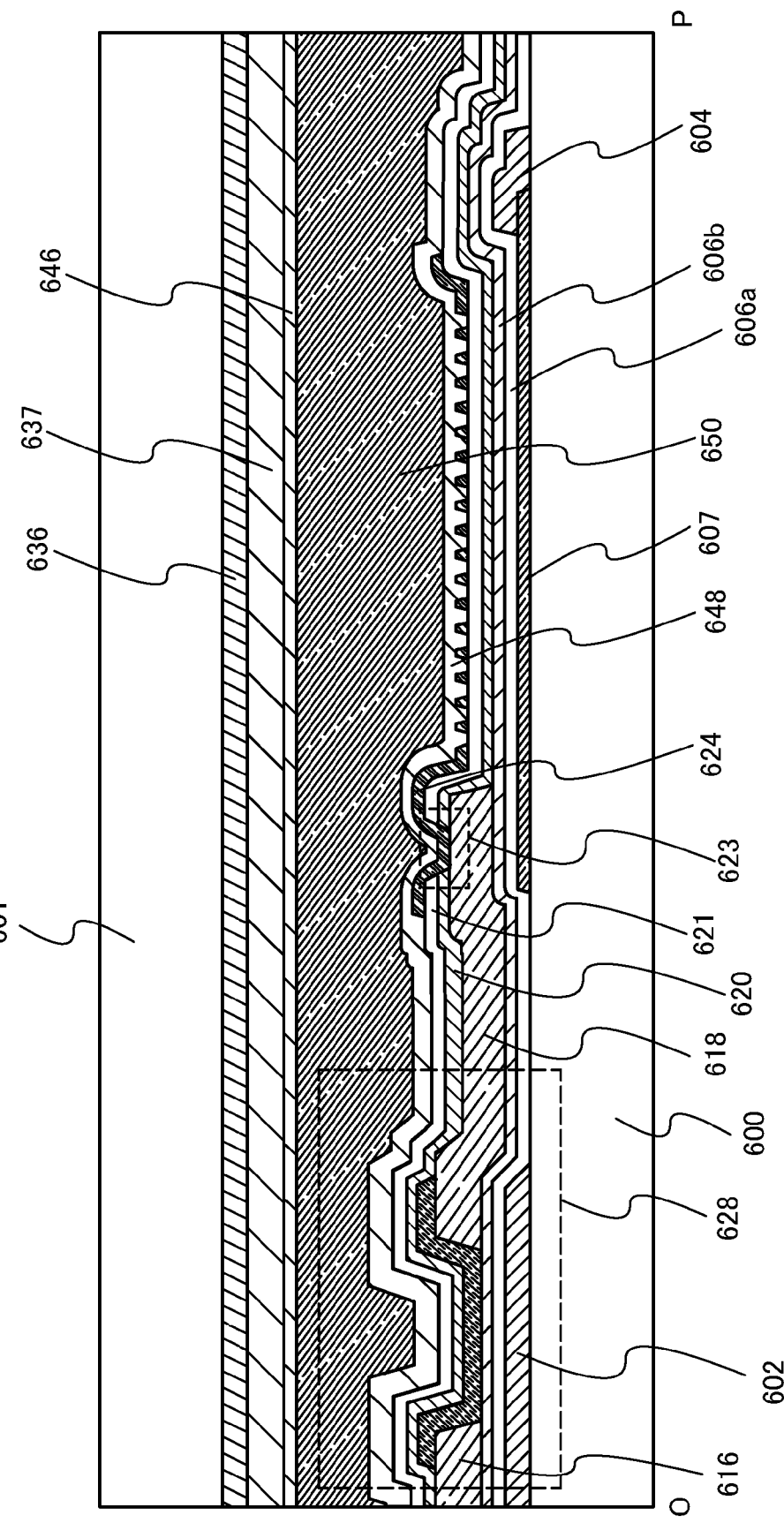
FIG. 32 illustrates a semiconductor device.

In FIG. 32, the substrate 600 over which an electrode layer 607, the TFT 628, and the pixel electrode layer 624 which is connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that since a pixel electrode layer is provided on the substrate 600 side, a pixel electrode layer is not provided on the counter substrate 601 side. In addition, the liquid crystal layer 650 is formed between the substrate 600 and the counter substrate 601 with the alignment films 646 and 648 therebetween.

The electrode layer 607 and the capacitor wiring 604 which is connected to the electrode layer 607, and the TFT 628 are formed over the substrate 600. The capacitor wiring 604 can be formed at the same time as the gate wiring 602 of the TFT 628. The thin film transistor described in any of Embodiments 1 to 5 can be used as the TFT 628. The electrode layer 607 can be formed using a material which is similar to that of the pixel electrode layer described in any of Embodiments 1 to 6. The electrode layer 607 is divided almost in a pixel form. Note that the first gate insulating film 606a and the second insulating film 606b are formed over the electrode layer 607 and the capacitor wiring 604.

The wirings 616 and 618 of the TFT 628 are formed over the first gate insulating film 606a and the second gate insulating film 606b. The wiring 616 is a data line through which a video signal travels, extends in one direction in a liquid crystal display panel, is connected to a source region or a drain region of the TFT 628, and functions as one of a source electrode and a drain electrode. The wiring 618 functions as the other of the source electrode and the drain electrode and is connected to the pixel electrode layer 624.

The insulating films 620 and 621 are formed over the wirings 616 and 618. Over the insulating film 621, the pixel electrode layer 624 which is connected to the wiring 618 through the contact hole 623 formed in the insulating films 620 and 621 is formed. The pixel electrode layer 624 is formed using a material which is similar to that of the pixel electrode layer described in any of Embodiments 1 to 6.

In this manner, the TFT 628 and the pixel electrode layer 624 which is connected to the TFT 628 are formed over the substrate 600. Note that a storage capacitor is formed with the electrode layer 607 and the pixel electrode layer 624.

Figure 33:
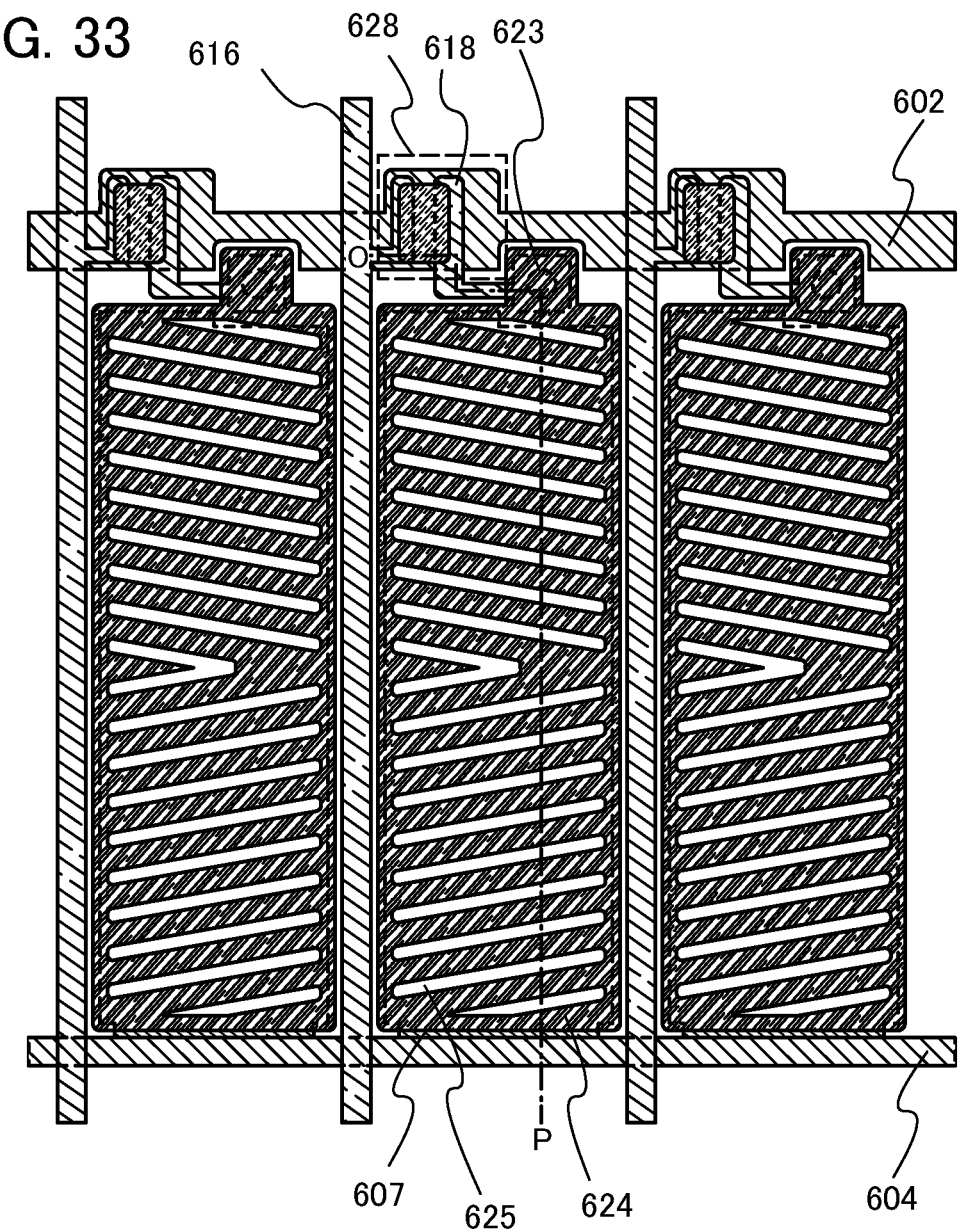
FIG. 33 illustrates a semiconductor device.

FIG. 33 is a plan view illustrating a structure of the pixel electrode. FIG. 32 illustrates a cross-sectional structure taken along section line O-P in FIG. 33. The pixel electrode layer 624 is provided with the slits 625. The slits 625 are provided for controlling alignment of liquid crystals. In that case, an electric field is generated between the electrode layer 607 and the pixel electrode layer 624. The thickness of the first gate insulating film 606a and the second gate insulating film 606b which are formed between the electrode layer 607 and the pixel electrode layer 624 is 50 to 200 nm, which is much smaller than the thickness of the liquid crystal layer of 2 to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state; thus, contrast or the like is less influenced by the viewing angle, which leads to a wider viewing angle. In addition, since both the electrode layer 607 and the pixel electrode layer 624 are light-transmitting electrodes, the aperture ratio can be improved.

Next, a different example of the liquid crystal display device in the horizontal electric field mode is described.

Figure 34:
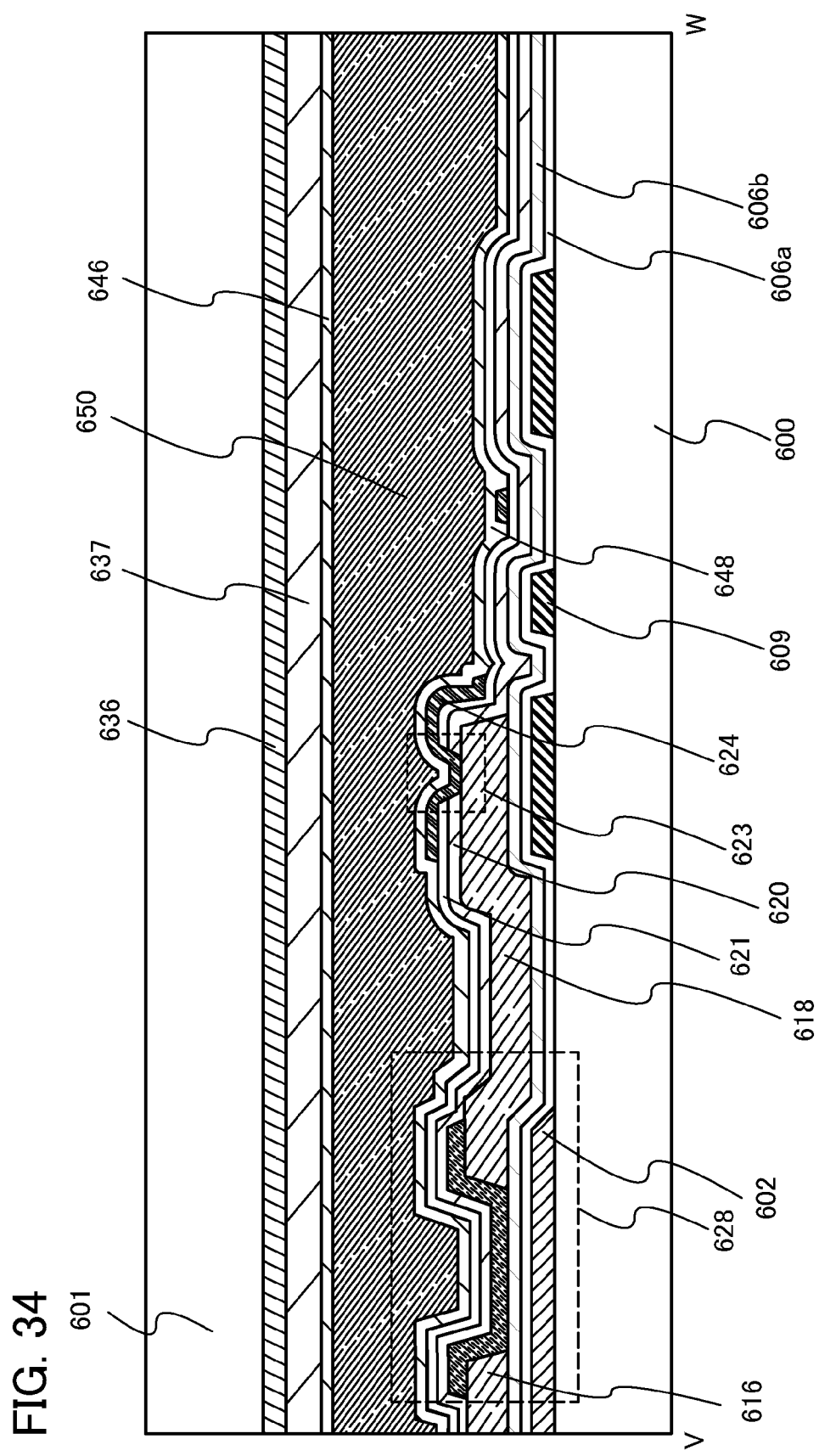
FIG. 34 illustrates a semiconductor device.
Figure 35:
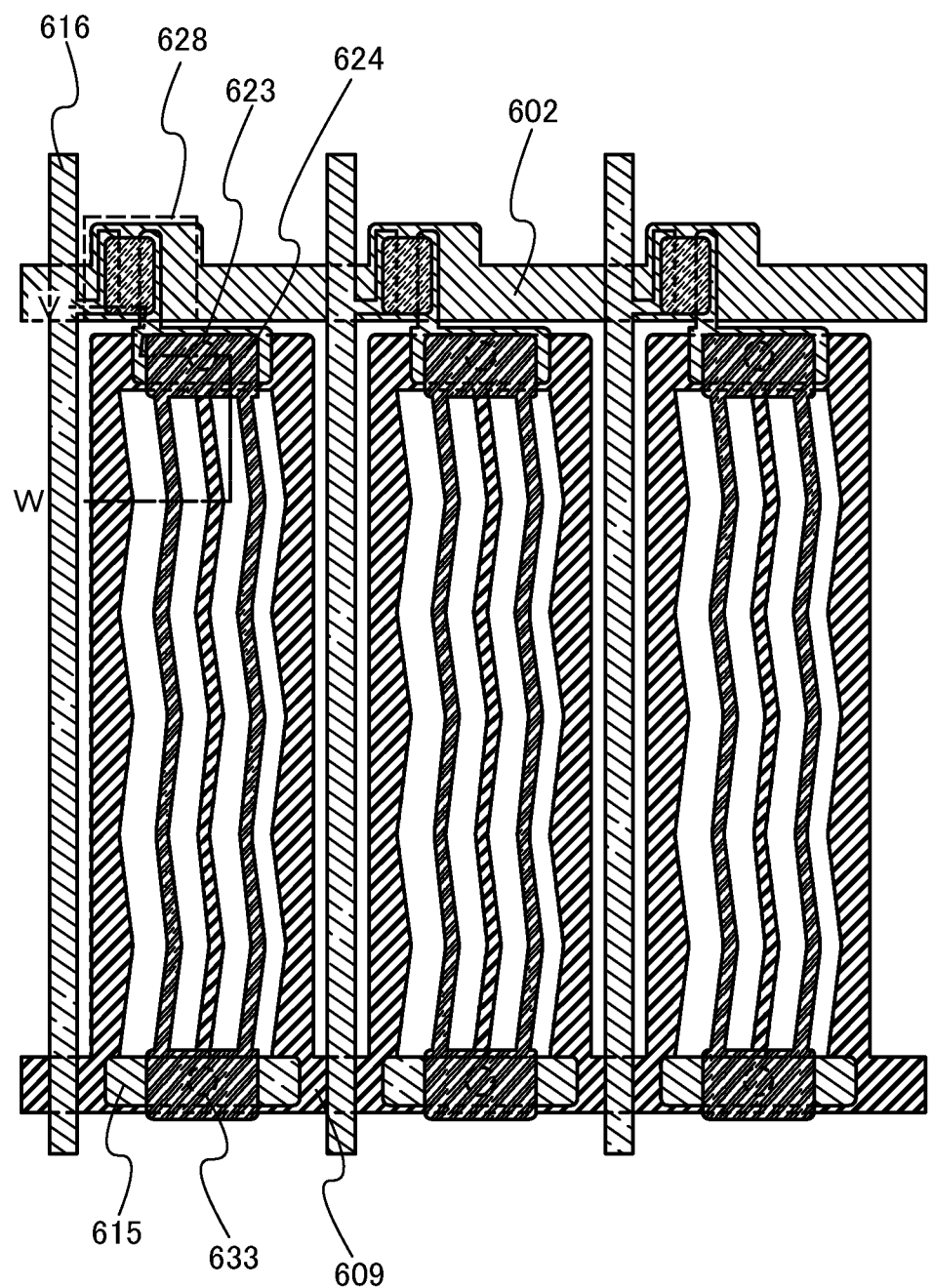
FIG. 35 illustrates a semiconductor device.

FIG. 34 and FIG. 35 illustrate a pixel structure of a liquid crystal display device in an IPS mode. FIG. 35 is a plan view. FIG. 34 illustrates a cross-sectional structure taken along section line V-W in FIG. 35. Description below is given with reference to both the drawings.

In FIG. 34, the substrate 600 over which the TFT 628 and the pixel electrode layer 624 which is connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601 with the alignment films 646 and 648 therebetween.

A common potential line 609 and the TFT 628 are formed over the substrate 600. The common potential line 609 can be formed at the same time as the gate wiring 602 of the TFT 628. The thin film transistor described in any of Embodiments 1 to 6 can be used as the TFT 628.

The wirings 616 and 618 of the TFT 628 are formed over the first gate insulating film 606a and the second gate insulating film 606b. The wiring 616 is a data line through which a video signal travels, extends in one direction in a liquid crystal display panel, is connected to a source region or a drain region of the TFT 628, and functions as one of a source electrode and a drain electrode. The wiring 618 functions as the other of the source electrode and the drain electrode and is connected to the pixel electrode layer 624.

The insulating films 620 and 621 are formed over the wirings 616 and 618. Over the insulating films 620 and 621, the pixel electrode layer 624 which is connected to the wiring 618 through the contact hole 623 formed in the insulating films 620 and 621 is formed. The pixel electrode layer 624 is formed using a material which is similar to that of the pixel electrode layer described in any of Embodiments 1 to 6. Note that as illustrated in FIG. 35, the pixel electrode layer 624 is formed such that the pixel electrode layer 624 and a comb-like electrode which is formed at the same time as the common potential line 609 can generate a horizontal electric field. Further, a comb-like portion of the pixel electrode layer 624 and the comb-like electrode which is formed at the same time as the common potential line 609 are disposed so as not to overlap with each other.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state; thus, contrast or the like is less influenced by the viewing angle, which leads to a wider viewing angle.

In this manner, the TFT 628 and the pixel electrode layer 624 which is connected to the TFT 628 are formed over the substrate 600. The first gate insulating film 606a and the second gate insulating film 606b are provided between the common potential line 609 and a capacitor electrode 615, whereby a storage capacitor is formed. The capacitor electrode 615 and the pixel electrode layer 624 are connected to each other through a contact hole 633.

Next, a mode of a liquid crystal display device in a TN mode is described.

Figure 36:
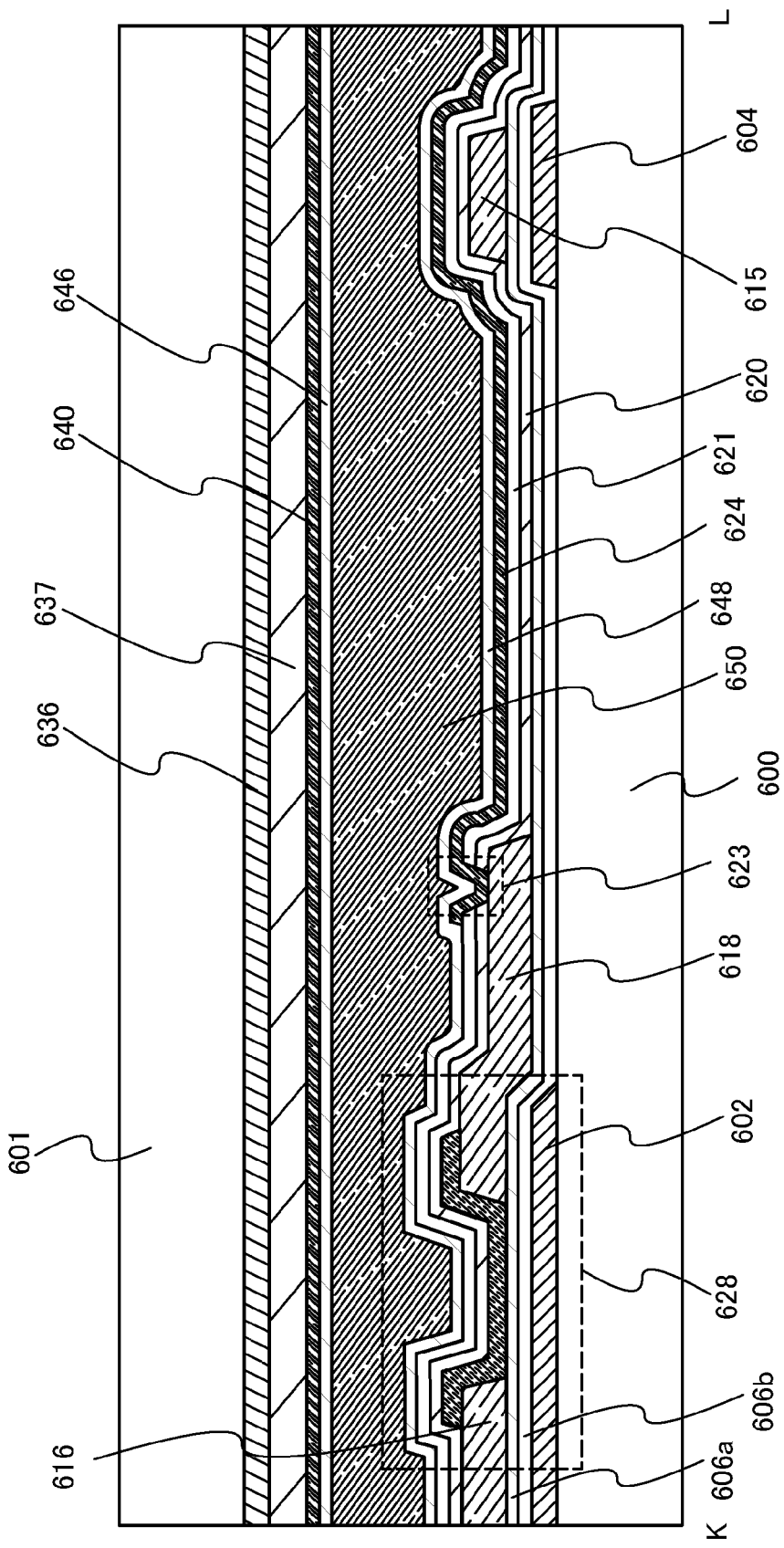
FIG. 36 illustrates a semiconductor device.
Figure 37:
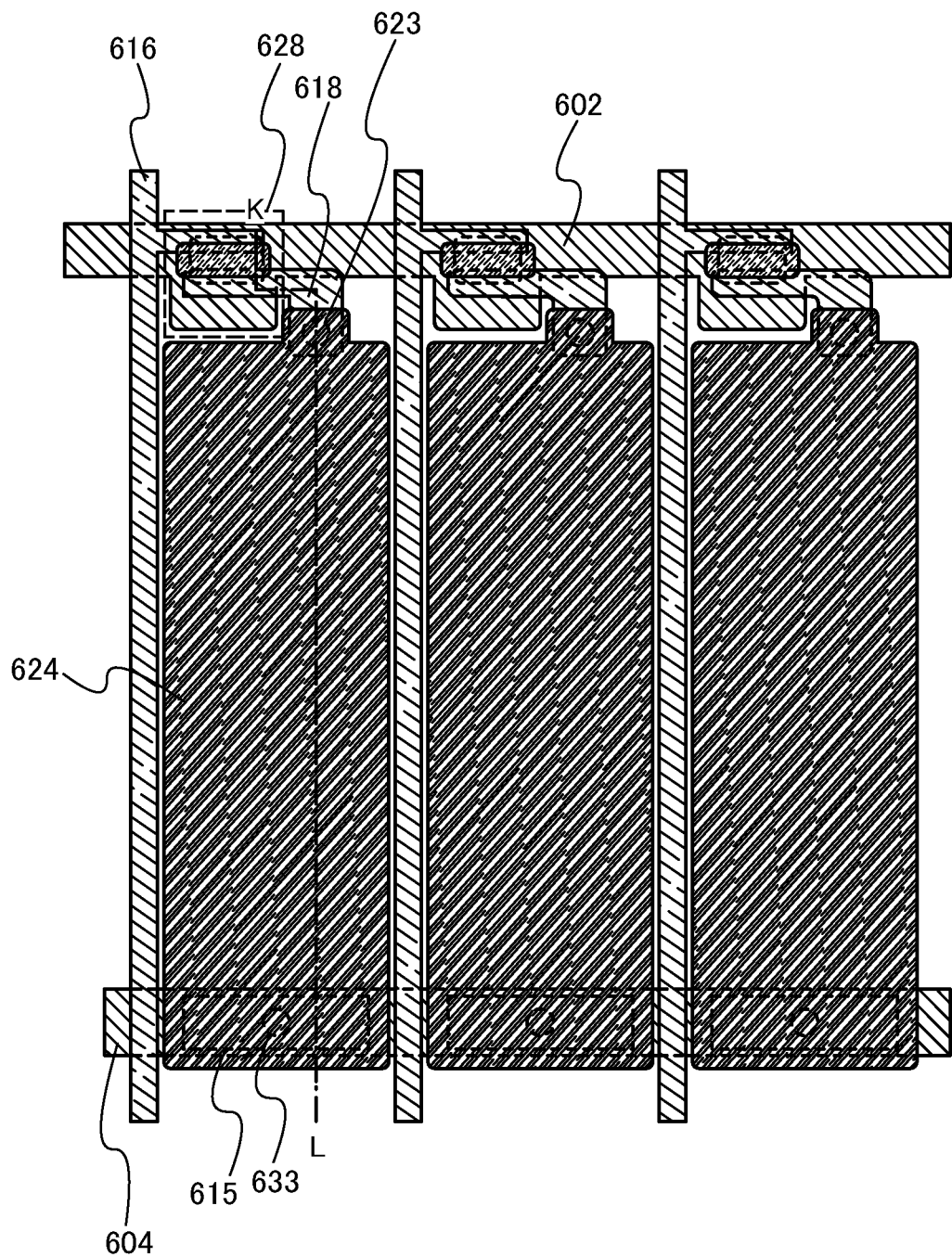
FIG. 37 illustrates a semiconductor device.

FIG. 36 and FIG. 37 illustrate a pixel structure of a liquid crystal display device in a TN mode. FIG. 37 is a plan view. FIG. 36 illustrates a cross-sectional structure taken along section line K-L in FIG. 37. Description below is given with reference to both the drawings.

The pixel electrode layer 624 is connected to the TFT 628 through the wiring 618 and the contact hole 623 formed in the insulating films 620 and 621. The wiring 616 functioning as a data line is connected to the TFT 628. The TFT described in any of Embodiments 1 to 6 can be used as the TFT 628.

The pixel electrode layer 624 is formed using the pixel electrode layer 456 described in Embodiment 1. The capacitor wiring 604 can be formed at the same time as the gate wiring 602 of the TFT 628. The first gate insulating film 606a and the second gate insulating film 606b are formed over the gate wiring 602 and the capacitor wiring 604. The first gate insulating film 606a and the second gate insulating film 606b are provided between the capacitor wiring 604 and the capacitor electrode 615, whereby a storage capacitor is formed. The capacitor electrode 615 and the pixel electrode layer 624 are connected to each other through the contact hole 633.

The counter substrate 601 is provided with the coloring film 636 and the counter electrode layer 640. The planarization film 637 is formed between the coloring film 636 and the counter electrode layer 640 to prevent alignment disorder of liquid crystals. The liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizer can be attached to a surface of the substrate 600, which is opposite to a surface provided with the thin film transistor, and a polarizer can be attached to a surface of the counter substrate 601, which is opposite to a surface provided with the counter electrode layer 640.

Through the above steps, liquid crystal display devices can be manufactured as display devices. The liquid crystal display devices of this embodiment each have a high aperture ratio.

This application is based on Japanese Patent Application serial no. 2009-169600 filed with Japan Patent Office on Jul. 18, 2009, the entire contents of which are hereby incorporated by reference.

The invention claimed is:

1. A semiconductor device comprising:
 a pixel portion formed over a substrate, the pixel portion including a first transistor; and
 a driver circuit portion formed over the substrate, the driver circuit portion including a second transistor,
 wherein the first transistor includes:
  a first gate electrode layer;
  a gate insulating layer over the first gate electrode layer;
  a first source electrode layer and a first drain electrode layer over the gate insulating layer;
  a first oxide semiconductor layer over the gate insulating layer, the first source electrode layer, and the first drain electrode layer, the first oxide semiconductor layer being in contact with the gate insulating layer and including a channel formation region;
  an oxide insulating layer over the first oxide semiconductor layer; and
  a pixel electrode layer over the oxide insulating layer,
 wherein the second transistor includes:
  a second gate electrode layer;
  the gate insulating layer over the second gate electrode layer;
  a second oxide semiconductor layer over the second gate electrode layer and the gate insulating layer;

a second source electrode layer and a second drain electrode layer over the second oxide semiconductor layer; and the oxide insulating layer over the second oxide semiconductor layer, the second source electrode layer, and the second drain electrode layer, the oxide insulating layer being in contact with the second oxide semiconductor layer, wherein each of the first gate electrode layer, the first oxide semiconductor layer, the first source electrode layer, and the first drain electrode layer has a light-transmitting property, wherein a material of the second source electrode layer and the second drain electrode layer is different from a material of the first source electrode layer and the first drain electrode layer, wherein the material of the second source electrode layer and the second drain electrode layer is a metal having lower resistance than the material of the first source electrode layer and the first drain electrode layer, and wherein the channel formation region is interposed between the first source electrode layer and the first drain electrode layer.

2. The semiconductor device according to claim 1, wherein a material of the second gate electrode layer is different from a material of the first gate electrode layer, and wherein the material of the second gate electrode layer is a metal having lower resistance than the material of the first gate electrode layer.

3. The semiconductor device according to claim 1, wherein the second oxide semiconductor layer includes a channel formation region and a region which overlaps with the second source electrode layer or the second drain electrode layer, and wherein a thickness of the channel formation region is smaller than a thickness of the region.

4. The semiconductor device according to claim 3, wherein the thickness of the channel formation region of the second transistor is the same as a thickness of the first oxide semiconductor layer of the first transistor.

5. The semiconductor device according to claim 1, wherein the second transistor includes a conductive layer over the second oxide semiconductor layer with the oxide insulating layer therebetween.

6. The semiconductor device according to claim 1, wherein the second source electrode layer and the second drain electrode layer comprise a metal film containing an element selected from Al, Cr, Cu, Ta, Ti, Mo, and W.

7. The semiconductor device according to claim 1, wherein the first source electrode layer, the first drain electrode layer, the first gate electrode layer, and the pixel electrode layer comprise a conductive metal oxide.

8. The semiconductor device according to claim 1, further comprising a capacitor in the pixel portion, wherein the capacitor includes a capacitor wiring and a capacitor electrode overlapping with the capacitor wiring, and wherein each of the capacitor wiring and the capacitor electrode has a light-transmitting property.

9. The semiconductor device according to claim 8, wherein a material of the capacitor wiring is the same as a material of the first gate electrode layer, and wherein a material of the capacitor electrode is the same as the material of the first source electrode layer and the first drain electrode layer.

10. The semiconductor device according to claim 1, wherein the second gate electrode layer comprises a material of the first gate electrode layer.

11. The semiconductor device according to claim 1, wherein the first oxide semiconductor layer is in direct contact with the gate insulating layer.

12. The semiconductor device according to claim 1, wherein the oxide insulating layer extends from the driver circuit portion to the pixel portion and is shared by the first transistor and the second transistor.

13. The semiconductor device according to claim 1, wherein the second source electrode layer and the second drain electrode layer are covered by the oxide insulating layer.

14. A semiconductor device comprising:
a pixel portion formed over a substrate, the pixel portion including a first transistor; and
a driver circuit portion formed over the substrate, the driver circuit portion including a second transistor,
wherein the first transistor includes:
a first gate electrode layer;
a gate insulating layer over the first gate electrode layer;
a first source electrode layer and a first drain electrode layer over the gate insulating layer;
a first oxide semiconductor layer over the first source electrode layer and the first drain electrode layer, the first oxide semiconductor layer being in contact with the gate insulating layer and including a channel formation region;
an oxide insulating layer over the first oxide semiconductor layer; and
a pixel electrode layer over the oxide insulating layer,
wherein the second transistor includes:
a second gate electrode layer;
the gate insulating layer over the second gate electrode layer;
a second oxide semiconductor layer over the second gate electrode layer and the gate insulating layer;
a second source electrode layer and a second drain electrode layer over the second oxide semiconductor layer; and
the oxide insulating layer over the second oxide semiconductor layer, the second source electrode layer, and the second drain electrode layer, the oxide insulating layer being in contact with the second oxide semiconductor layer, wherein each of the first gate electrode layer, the first oxide semiconductor layer, the first source electrode layer, and the first drain electrode layer has a light-transmitting property, wherein a material of the second source electrode layer and the second drain electrode layer is different from a material of the first source electrode layer and the first drain electrode layer, wherein the material of the second source electrode layer and the second drain electrode layer is a metal having lower resistance than the material of the first source electrode layer and the first drain electrode layer, wherein the second gate electrode layer comprises a metal layer, and wherein the channel formation region is interposed between the first source electrode layer and the first drain electrode layer.

15. The semiconductor device according to claim 14, further comprising a second metal layer over and in contact with the second gate electrode layer.

16. The semiconductor device according to claim 14, further comprising a metal nitride film over and in contact with the second gate electrode layer.

17. The semiconductor device according to claim 14,
wherein a material of the second gate electrode layer is different from a material of the first gate electrode layer, and
wherein the material of the second gate electrode layer is a metal having lower resistance than the material of the first gate electrode layer.

18. The semiconductor device according to claim 14,
wherein the second oxide semiconductor layer includes a channel formation region and a region which overlaps with the second source electrode layer or the second drain electrode layer, and
wherein a thickness of the channel formation region is smaller than a thickness of the region.

19. The semiconductor device according to claim 18,
wherein the thickness of the channel formation region of the second transistor is the same as a thickness of the first oxide semiconductor layer of the first transistor.

20. The semiconductor device according to claim 14,
wherein the second transistor includes a conductive layer over the second oxide semiconductor layer with the oxide insulating layer therebetween.

21. The semiconductor device according to claim 14,
wherein the second source electrode layer and the second drain electrode layer comprise a metal film containing an element selected from Al, Cr, Cu, Ta, Ti, Mo, and W.

22. The semiconductor device according to claim 14,
wherein the first source electrode layer, the first drain electrode layer, the first gate electrode layer, and the pixel electrode layer comprise a conductive metal oxide.

23. The semiconductor device according to claim 14, further comprising a capacitor in the pixel portion,
wherein the capacitor includes a capacitor wiring and a capacitor electrode overlapping with the capacitor wiring, and
wherein each of the capacitor wiring and the capacitor electrode has a light-transmitting property.

24. The semiconductor device according to claim 23,
wherein a material of the capacitor wiring is the same as a material of the first gate electrode layer, and
wherein a material of the capacitor electrode is the same as the material of the first source electrode layer and the first drain electrode layer.

25. The semiconductor device according to claim 14,
wherein the first oxide semiconductor layer is in direct contact with the gate insulating layer.

26. The semiconductor device according to claim 14,
wherein the oxide insulating layer extends from the driver circuit portion to the pixel portion and is shared by the first transistor and the second transistor.

27. The semiconductor device according to claim 14,
wherein the second source electrode layer and the second drain electrode layer are covered by the oxide insulating layer.

28. A semiconductor device comprising:
a pixel portion formed over a substrate, the pixel portion including a transistor,
wherein the transistor includes:
a gate electrode layer;
a gate insulating layer over the gate electrode layer;
a source electrode layer and a drain electrode layer over the gate insulating layer;
an oxide semiconductor layer over the gate insulating layer, the source electrode layer, and the drain electrode layer, the oxide semiconductor layer being in contact with the gate insulating layer and including a channel formation region;
an oxide insulating layer over the oxide semiconductor layer; and
a pixel electrode layer over the oxide insulating layer,
wherein each of the gate electrode layer, the oxide semiconductor layer, the source electrode layer, and the drain electrode layer has a light-transmitting property, and
wherein the channel formation region is interposed between the source electrode layer and the drain electrode layer.

29. The semiconductor device according to claim 28,
wherein the source electrode layer, the drain electrode layer, the gate electrode layer, and the pixel electrode layer comprise a conductive metal oxide.

30. The semiconductor device according to claim 28, further comprising a capacitor in the pixel portion,
wherein the capacitor includes a capacitor wiring and a capacitor electrode overlapping with the capacitor wiring, and
wherein each of the capacitor wiring and the capacitor electrode has a light-transmitting property.

31. The semiconductor device according to claim 30,
wherein a material of the capacitor wiring is the same as a material of the gate electrode layer, and
wherein a material of the capacitor electrode is the same as the material of the source electrode layer and the drain electrode layer.

32. The semiconductor device according to claim 28,
wherein the gate electrode layer, the source electrode layer, and the drain electrode layer comprise a light-transmitting conductive material.

33. The semiconductor device according to claim 32,
wherein the light-transmitting conductive material is a metal oxide.

34. The semiconductor device according to claim 32,
wherein the gate electrode layer, the source electrode layer, and the drain electrode layer comprise the same light-transmitting conductive material.

35. The semiconductor device according to claim 28,
wherein the oxide semiconductor layer is in direct contact with the gate insulating layer.

36. The semiconductor device according to claim 28,
wherein the oxide insulating layer is in contact with the oxide semiconductor layer.

* * * * *